United States Patent [19]
Hill

[11] Patent Number: 6,137,574
[45] Date of Patent: Oct. 24, 2000

[54] SYSTEMS AND METHODS FOR CHARACTERIZING AND CORRECTING CYCLIC ERRORS IN DISTANCE MEASURING AND DISPERSION INTERFEROMETRY

[75] Inventor: Henry A. Hill, Tuscon, Ariz.

[73] Assignee: Zygo Corporation, Middlefield, Conn.

[21] Appl. No.: 09/268,619

[22] Filed: Mar. 15, 1999

[51] Int. Cl.[7] ..................................................... G01B 9/02
[52] U.S. Cl. ........................... 356/351; 356/349; 356/358
[58] Field of Search .................................... 356/351, 349, 356/358

[56] References Cited

U.S. PATENT DOCUMENTS

| | | | |
|---|---|---|---|
| 5,331,400 | 7/1994 | Wilkening et al. | 356/349 |
| 6,008,902 | 12/1999 | Rinn | 356/34.9 |

Primary Examiner—Robert H. Kim
Assistant Examiner—Andrew H. Lee
Attorney, Agent, or Firm—Fish & Richardson P.C.

[57] ABSTRACT

The invention features interferometry systems that characterize cyclic errors. In many embodiments, the systems include a phase-shifting component (e.g., a phase or frequency shifter) for introducing a variable and controlled phase between the reference and measurement beams of an interferometer. By analyzing the distance measurements of the interferometer as a function of the introduced phase, an analyzer in the interferometry system can characterize the cyclic errors in the interferometer. Once the cyclic errors are characterized, the analyzer can directly correct the distance measurements to remove contributions from cyclic errors. Alternatively, or in addition, to including the phase shifting component, the interferometry systems can perform dispersion measurements of the gas in the measurement arm at multiple positions of the measurement object and the analyzer can determine cyclic errors in the system based on the dispersion measurements. The invention also features lithography systems for making integrated circuits, wherein the lithography systems include at least one of the interferometry systems described above.

52 Claims, 22 Drawing Sheets

SYSTEMS AND METHODS FOR CHARACTERIZING AND CORRECTING CYCLIC ERRORS IN DISTANCE MEASURING AND DISPERSION INTERFEROMETRY

BACKGROUND OF THE INVENTION

This invention relates to interferometers, e.g., displacement measuring and dispersion interferometers that measure displacements of a measurement object such as a mask stage or a wafer stage in a lithography scanner or stepper system.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam, which subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2\upsilon p/\lambda$, where $\upsilon$ is the relative velocity of the measurement and reference objects, $\lambda$ is the wavelength of the measurement and reference beams, and p is the number of passes to the reference and measurement objects. Changes in the relative position of the measurement object correspond to changes in the phase of the measured interference signal, with a $2\pi$ phase change substantially equal to a distance change L of $\lambda/(np)$, where n is the refractive index of the medium through which the light beams travel, e.g., air or vacuum, and where L is a round-trip distance change, e.g., the change in distance to and from a stage that includes the measurement object.

Unfortunately, this equality is not always exact. Many interferometers include what are known as "cyclic errors," which are contributions to the phase of the measured interference signal and have a sinusoidal dependence on the change in optical path length pnL. In particular, the first order cyclic error has a sinusoidal dependence on $(2\pi pnL)/\lambda$ and the second order cyclic error has a sinusoidal dependence on $2(2\pi pnL)/\lambda$. Higher order cyclic errors can also be present.

Cyclic errors can be produced by "beam mixing," in which a portion of an input beam that nominally forms the reference beam propagates along the measurement path and/or a portion of an input beam that nominally forms the measurement beam propagates along the reference path. Such beam mixing can be caused by ellipticity in the polarizations of the input beams and imperfections in the interferometer components, e.g., imperfections in a polarizing beam splitter used to direct orthogonally polarized input beams along respective reference and measurement paths. Because of beam mixing and the resulting cyclic errors, there is not a strictly linear relation between changes in the phase of the measured interference signal and the relative optical path length pnL between the reference and measurement paths. If not compensated, cyclic errors caused by beam mixing can limit the accuracy of distance changes measured by an interferometer. Cyclic errors can also be produced by imperfections in transmissive surfaces that produce undesired multiple reflections within the interferometer. For a general reference on the theoretical cause of cyclic error, see, for example, C. W. Wu and R. D. Deslattes, "Analytical modelling of the periodic nonlinearity in heterodyne interferometry," *Applied Optics*, 37, 6696–6700, 1998.

In dispersion measuring applications, optical path length measurements are made at multiple wavelengths, e.g., 532 nm and 1064 nm, and are used to measure dispersion of the gas in the measurement path of the distance measuring interferometer. The dispersion measurement can be used to convert the optical path length measured by a distance measuring interferometer into a physical length. Such a conversion can be important since changes in the measured optical path length can be caused by gas turbulence in the measurement arm even though the physical distance to the measurement object is unchanged. In addition to the extrinsic dispersion measurement, the conversion of the optical path length to a physical density requires knowledge of an intrinsic value for the refractivity of the gas. The factor $\Gamma$ is a suitable intrinsic value and is the reciprocal dispersive power of the gas for the wavelengths used in the dispersion interferometry. The factor $\Gamma$ can be measured separately or based on literature values. Cyclic errors in the interferometer also contribute to dispersion measurements and measurements of the factor $\Gamma$.

SUMMARY OF THE INVENTION

The invention features interferometry systems that characterize, and compensate for, cyclic errors. In some embodiments, the system includes an interferometer, a phase-shifting component that produces a variable and controlled phase shift between the reference and measurement beams of the interferometer, and an analyzer that controls the phase-shifting component and records the phase measured by the interferometer. Based on the measured phases and their dependence on the phase shift produced by the phase-shifting component, the analyzer estimates coefficients that characterize cyclic errors in the interferometry system. In other embodiments, the system includes an interferometer configured to measure a dispersion value in an optical path to a measurement object for each of multiple positions of the measurement object and an analyzer that estimates coefficients that characterize cyclic errors in the dispersion measurement based on the multiple, measured dispersion values. In additional embodiments, features of the phase-shifting and dispersion measuring embodiments are combined.

In general, in one aspect, the invention features an interferometry system including an interferometer, a detection system, and an analyzer. During operation, the interferometer directs a reference beam along a reference path and a measurement beam along a measurement path contacting a measurement object and combines the reference and measurement beams to produce overlapping exit beams. The overlapping exit beams are indicative of changes in a relative optical path length to a measurement object. The interferometer also includes a variable phase shifter, which produces a phase shift in one, or both, of the reference and measurement beams. During operation, the detection system mixes polarizations of the overlapping exit beams to produce a mixed beam and measures a time-varying intensity of the mixed beam. The analyzer is coupled to the phase shifter and the detection system. During operation, the analyzer controls the value of the phase shift produced by the phase shifter, measures a phase corresponding to the time-varying intensity of the mixed beam, and determines a spectral representation, such as a Fourier sine and cosine series, of cyclic errors in the interferometry system based on the phase of the mixed beam for each of multiple values of the phase shift.

The interferometry system can include any of the following features.

The analyzer can determine the spectral representation based on the measured phase of the mixed beam for each of multiple values of the phase shift for each of multiple positions of the measurement object. The analyzer can include a memory and during operation can store the spectral representation in the memory.

The interferometer can include a beam splitter that combines the reference beam and measurement beam to produce the overlapping exit beams, and wherein the measurement path contacts the phase shifter between the measurement object and the beam splitter. The interferometer can include a polarizing beam splitter that directs the reference beam along the reference path and the measurement beam along the measurement path, and wherein the measurement path contacts the phase shifter between the polarizing beam splitter and the measurement object. The interferometer can includes a polarizing beam splitter that receives the reference beam from the reference path and the measurement beam from the measurement path, and wherein the measurement path contacts the phase shifter between the measurement object and the polarizing beam splitter.

The phase shifter can be an electro-optical modulator. The phase shifter can include an optical delay line and a translator for adjusting the length of the delay line, wherein the analyzer controls the translator. The phase shifter can include a pair of prisms and a translator for varying the relative positions of the prisms, wherein the analyzer controls the translator. The phase shifter can include a gas cell defining an optical path and a gas handling system for varying the gas pressure in the cell, wherein the analyzer controls the gas handling system.

During operation, the interferometer can direct a second reference beam along a second reference path and a second measurement beam along a second measurement path contacting the measurement object and combine the second reference beam and the second measurement beam to produce a second pair of overlapping exit beams. The second pair of overlapping exit beams is indicative of changes in the relative optical path length to the measurement object. During operation, the detection system mixes polarizations of the second pair of overlapping exit beams to produce a second mixed beam and measures a time-varying intensity of the second mixed beams. The analyzer measures a phase corresponding to the time-varying intensity of the second mixed beam and determines the spectral representation based on the measured phases of each of the mixed beams for each of multiple values of the phase shift. In one embodiment, the analyzer can provide an initial value for the phase shift, measure the phase corresponding to the time-varying intensity of each of the mixed beams for each of multiple positions of the measurement object and the initial value of the phase shift, and then repeat the providing and measuring steps for additional values of the phase shift.

In general, in another aspect, the invention features an interferometry system including a source, an interferometer, a detection system, and an analyzer. During operation, the source provides reference and measurement beams having different frequencies, and includes a frequency shifter, such as an acouso-optical modulator, that shifts the frequencies of the reference and measurement beams by equal amounts. During operation, the interferometer directs the reference beam along a reference path and the measurement beam along a measurement path contacting a measurement object and combines the reference and measurement beams to produce overlapping exit beams. The overlapping exit beams are indicative of changes in a relative optical path length to the measurement object. During operation, the detection system mixes polarizations of the overlapping exit beams to produce a mixed beam and measures a time-varying intensity of the mixed beam. The analyzer is coupled to the frequency shifter and the detection system. During operation, the analyzer causes the frequency shifter to shift the frequencies of the reference and measurement beams and produce a corresponding phase shift between the overlapping exit beams, measures a phase corresponding to the time-varying intensity of the mixed beam, and determines a spectral representation of cyclic errors in the interferometry system based on the measured phase of the mixed beam for each of multiple values of the phase shift.

The interferometry system can include any of the following features. The analyzer can determine the spectral representation based on the measured phase of the mixed beam for each of multiple values of the phase shift for each of multiple positions of the measurement object. The source can provide a second reference beam and a second measurement beam having frequencies that are not shifted by the frequency shifter. During operation the interferometer directs the second reference beam along a second reference path and the second measurement beam along a second measurement path contacting the measurement object and combines the second reference beam and the second measurement beam to produce a second pair of overlapping exit beams. The second pair of overlapping exit beams is indicative of changes in the relative optical path length to the measurement object. During operation the detection system mixes polarizations of the second pair of overlapping exit beams to produce a second mixed beam and measures a time-varying intensity of the second mixed beams. The analyzer then measures a phase corresponding to the time-varying intensity of the second mixed beam. The analyzer can cause the frequency shifter to produce an initial value for the phase shift and measure the phase corresponding to the time-varying intensity of each of the mixed beams for each of multiple positions of the measurement object and the initial value of the phase shift. The analyzer then repeat the causing and measuring steps for additional values of the phase shift and determines the spectral representation based on the measured phases.

In general, in another aspect, the invention features an interferometry system including a dispersion measuring interferometer, a detection system, and an analyzer. During operation, the interferometer produces first and second pairs of overlapping exit beams, the first pair of exit beams having a first wavelength and the second pair of exit beams having a second wavelength different from the first wavelength. For example, the wavelength can differ by at least 1 nm. The first and second pairs of exit beams are each indicative of changes in a relative optical path length to a measurement object. During operation, the detection system mixes polarizations of the first pair of overlapping exit beams to produce a first mixed beam, mixes polarizations of the second pair of overlapping exit beams to produce a second mixed beam, and measures a time-varying intensity of each of the mixed beams. The analyzer is coupled to the detection system. During operation, the analyzer measures a phase corresponding to the time-varying intensity of each of the mixed beams, at each of multiple positions of the measurement object. The analyzer calculates a dispersion value for each of the multiple positions, wherein the dispersion value for a particular position is equal to a function of the measured phases at that particular position. Then, the analyzer determines a spectral representation of cyclic error contributions to dispersion measurements by the interferometer based on the calculated dispersion values.

The interferometry system can include any of the following features. The analyzer can further include a memory and during operation it can store the spectral representation in the memory. The analyzer can determine the spectral representation by expressing the calculated dispersion values as a function that includes a Fourier series in at least one of the measured phases and inverting the Fourier series. The dispersion value can be equal to a function of a weighted difference between the measured phases. For example, if the first and second wavelengths $\lambda_1$ and $\lambda_2$ satisfy the equation $\lambda_1/\lambda_2 = l_1/l_2$, where $l_1$ and $l_2$ are integers, then weighted difference can be equal to $l_1\Phi_1 - l_2\Phi_2$, where $\Phi_1$ and $\Phi_2$ are the measured phases. In such a case, $l_1$, and $l_2$ can each be less than 50.

The interferometer can also combine a first reference beam and a first measurement beam to produce the first pair of overlapping exit beams, and include a variable phase shifter that produces a phase shift in at least one of the first reference beam and the first measurement beam. In such a case, the analyzer is coupled to the phase shifter and during operation controls the value of the phase shift produced by the phase shifter. Alternatively, the interferometry system can include a source that provides a first reference beam and a first measurement beam, the source including a frequency shifter for shifting the frequencies of the first reference and measurement beams by equal amounts. In such a case, the interferometer combines the first reference and measurement beams to produce the first pair of overlapping exit beams. The analyzer is coupled to the frequency shifter and causes the frequency shifter to shift the frequencies of the first reference and measurement beams, and produces a corresponding phase shift between the first pair of overlapping exit beams.

In general, in another aspect, the invention features an interferometry system including a dispersion measuring interferometer, a detection system, and an analyzer. The interferometer produces first and second pairs of overlapping exit beams, the first pair of exit beams having a first wavelength and the second pair of exit beams having a second wavelength different from the first wavelength. The first and second pairs of exit beams are each indicative of changes in a relative optical path length to a measurement object. The detection system mixes polarizations of the first pair of overlapping exit beams to produce a first mixed beam, mixes polarizations of the second pair of overlapping exit beams to produce a second mixed beam, and measures a time-varying intensity of each of the mixed beams. The analyzer is coupled to the detection system. During operation the analyzer measures a phase corresponding to the time-varying intensity of each of the mixed beams at each of multiple positions of the measurement object, calculates a dispersion value for each of the multiple positions, and filters the dispersion values to determine an averaged dispersion value having reduced cyclic error. The dispersion values for a particular position being equal to a function of the measured phases at that particular position.

In some embodiments, the analyzer averages over the dispersion values by summing the dispersion values corresponding to equally-spaced measured phases from one of the mixed beams, the equally-spaced measured phases spanning an interval that is a multiple of $2\pi$. For example, if the first and second wavelengths $\lambda_1$ and $\lambda_2$ satisfy the equation $\lambda_1/\lambda_2 = l_1/l_2$, $l_1$ and $l_2$ being integers, and the dispersion values are equal to $l_1\Phi_1 - l_2\Phi_2$, $\Phi_1$ and $\Phi_2$ being the measured phases, then the analyzer averages over the dispersion values by summing the dispersion values corresponding to equally-spaced values of $\Phi_1$ spanning a $2\pi l_2$ interval.

In a related aspect, the invention features a lithography system for use in fabricating integrated circuits on a wafer. The lithography system includes: a stage for supporting the wafer; an illumination system for imaging spatially patterned radiation onto the wafer; a positioning system for adjusting the position of the stage relative to the imaged radiation; and any of the interferometry systems described above for measuring the position of the stage.

In another related aspect, the invention features a lithography system for use in fabricating integrated circuits on a wafer. The lithography system includes: a stage for supporting the wafer; and an illumination system including a radiation source, a mask, a positioning system, a lens assembly, and any of the interferometry systems described above. During operation, the source directs radiation through the mask to produce spatially patterned radiation, the positioning system adjusts the position of the mask relative to the radiation from the source, the lens assembly images the spatially patterned radiation onto the wafer, and the interferometry system measures the position of the mask relative to the radiation from the source.

In another related aspect, the invention features a lithography system for use in fabricating integrated circuits including first and second components and any of the interferometry systems described above. The first and second components are movable relative to each other, and the first component includes the measurement object. During operation the interferometry system measures the position of the first component relative to the second component.

In another related aspect, the invention features a lithography system for fabricating integrated circuits including first and second components, and any of the interferometry systems described above. The first component includes the measurement object, which is contacted by the measurement path, and the second component is contacted by the reference path. The interferometry system measures the relative position of the first and second components.

In another related aspect, the invention features a beam writing system for use in fabricating a lithography mask. The beam writing system includes: a source providing a write beam to pattern a substrate; a stage supporting the substrate; a beam directing assembly for delivering the write beam to the substrate; a positioning system for positioning the stage and beam directing assembly relative one another; and any of the interferometry systems described above for measuring the position of the stage relative to the beam directing assembly.

In general, in another aspect, the invention features a method for characterizing cyclic errors in an interferometer. The method includes: directing a reference beam along a reference path and a measurement beam along a measurement path contacting a measurement object; combining the reference beam and the measurement beam to produce overlapping exit beams that are indicative of changes in a relative optical path length to the measurement object; introducing at least three phase-shifts to at least one of the reference and measurement beams for each of multiple positions of the measurement object; mixing polarizations of the reference and measurement beams to produce mixed beam; measuring a phase corresponding to a time-varying intensity of the mixed beam for each of the phase shifts for each of the multiple positions of the measurement object; and determining a spectral representation of cyclic errors in the interferometer based on the measured phases.

The method can include any of the following features. The introducing step can includes introducing at least five phase-shifts to at least one of the reference and measurement beams for each of multiple positions of the measurement object. The phase shifts can be introduced to one of the reference beam and the measurement beam and not the other of the reference beam and the measurement beam. The phase shifts can be introduced to both the reference beam and the measurement beam. The method can include the following additional steps: combining a second reference beam and a second measurement beam to produce a second pair of overlapping exit beams that are indicative of changes in a corresponding relative optical path length to the measurement object; mixing polarizations of the second reference and measurement beams to produce a second mixed beam; measuring a phase corresponding to a time-varying intensity of the second mixed beam for each of the multiple positions of the measurement object; and determining the spectral representation based on the measured phases for first and second mixed beams.

In a related aspect, the invention features an interferometry method including: determining a spectral representation of cyclic errors in an interferometer using the method above; measuring an optical path length using the interferometer; and correcting the measured optical path length for cyclic errors using the spectral representation.

In general, in another aspect, the invention features a method for characterizing cyclic errors in a dispersion measuring interferometer. The method includes: providing a value for dispersion in an optical path length to a measurement object measured by the interferometer for each of multiple positions of the measurement object; and determining a spectral representation of cyclic error contributions to dispersion measurement in the interferometer based on the dispersion values. The determining step can include expressing the dispersion values as a function that includes a Fourier series that depends on the position of the measurement object, and inverting the Fourier series to determine the spectral representation.

In a related aspect, the invention features an interferometry method including: determining a spectral representation of cyclic error contributions to dispersion measurements in an interferometer using the method above; measuring an optical path length using the interferometer; and correcting the measured optical path length using the spectral representation.

In further aspect, the invention features a lithography method for use in fabricating integrated circuits on a wafer. The lithography method includes supporting the wafer on a moveable stage; imaging spatially patterned radiation onto the wafer; adjusting the position of the stage; and measuring the position of the stage using any of the interferometry methods described above.

In another related aspect, the invention features a lithography method for use in the fabrication of integrated circuits. The lithography method includes: directing input radiation through a mask to produce spatially patterned radiation; positioning the mask relative to the input radiation; measuring the position of the mask relative to the input radiation using any of the interferometry methods described above; and imaging the spatially patterned radiation onto a wafer. Either a stage supporting the mask or an illumination system providing the input radiation includes the measurement object.

In another related aspect, the invention features a lithography method for fabricating integrated circuits on a wafer including: positioning a first component of a lithography system relative to a second component of a lithography system to expose the wafer to spatially patterned radiation; and measuring the position of the first component relative to the second component using any of the interferometry methods described above, wherein the first component includes the measurement object.

In another related aspect, the invention features a beam writing method for use in fabricating a lithography mask. The beam writing method includes: directing a write beam to a substrate to pattern the susbtrate; positioning the substrate relative to the write beam; and measuring the position of the substrate relative to the write beam using any of the interferometry methods described above.

Embodiments of the invention can include many advantages. For example, they can provide complete and accurate characterization of first, second, and higher order cyclic errors, which can be used to increase the accuracy of interferometric measurements. In addition, they can characterize cyclic errors caused by beam mixing, multiple reflections within the interferometer, and other sources. By characterizing the cyclic errors, embodiments of the invention can permit rapid correction of the phase measured by the interferometer, such as is usually necessary during online applications when the measurement object can be rapidly scanned or stepped. Moreover, two-channel and dispersion measuring embodiments of the invention can permit ongoing characterization of cyclic errors as regular online operation of the interferometer occurs. The cyclic error characterization can be applied to optical distance measurements, dispersion measurements, and measurements of intrinsic optical properties of the gas in the measurement arm of the interferometer such as the reciprocal dispersive power $\Gamma$. In addition, the interferometry systems can be used in lithography and mask writing applications.

Other features and advantages will be apparent from the following detailed description and from the claims.

BRIEF DESCRIPTION OF THE DRAWINGS

FIG. 1f is a schematic of an electronic circuit for use with the system of FIG. 1a.

FIG. 3b is a schematic of an electronic circuit for use with the system of FIG. 3a.

FIG. 5b is a schematic of an electronic circuit for use with the system of FIG. 5a.

FIG. 6b is a schematic of an electronic circuit for use with the system of FIG. 6a.

FIG. 9b is a schematic of an electronic circuit for use with the system of FIG. 9a.

DETAILED DESCRIPTION

The invention features interferometry systems that characterize cyclic errors. In many embodiments, the systems include a phase-shifting component for introducing a variable and controlled phase between the reference and measurement beams of an interferometer. By analyzing the distance measurements of the interferometer as a function of the introduced phase, an analyzer in the interferometry system can characterize the cyclic errors in the interferometer. Once the cyclic errors are characterized, the analyzer can directly correct the distance measurements to remove contributions from cyclic errors. Alternatively, or in addition, to including the phase shifting component, the interferometry systems can perform dispersion measurements of the gas in the measurement arm at multiple positions of the measurement object and the analyzer can determine cyclic errors in the system based on the dispersion measurements.

First, we shall present a general description of the interferometry systems. Thereafter, we will describe particular embodiments in greater detail.

Figure 10:
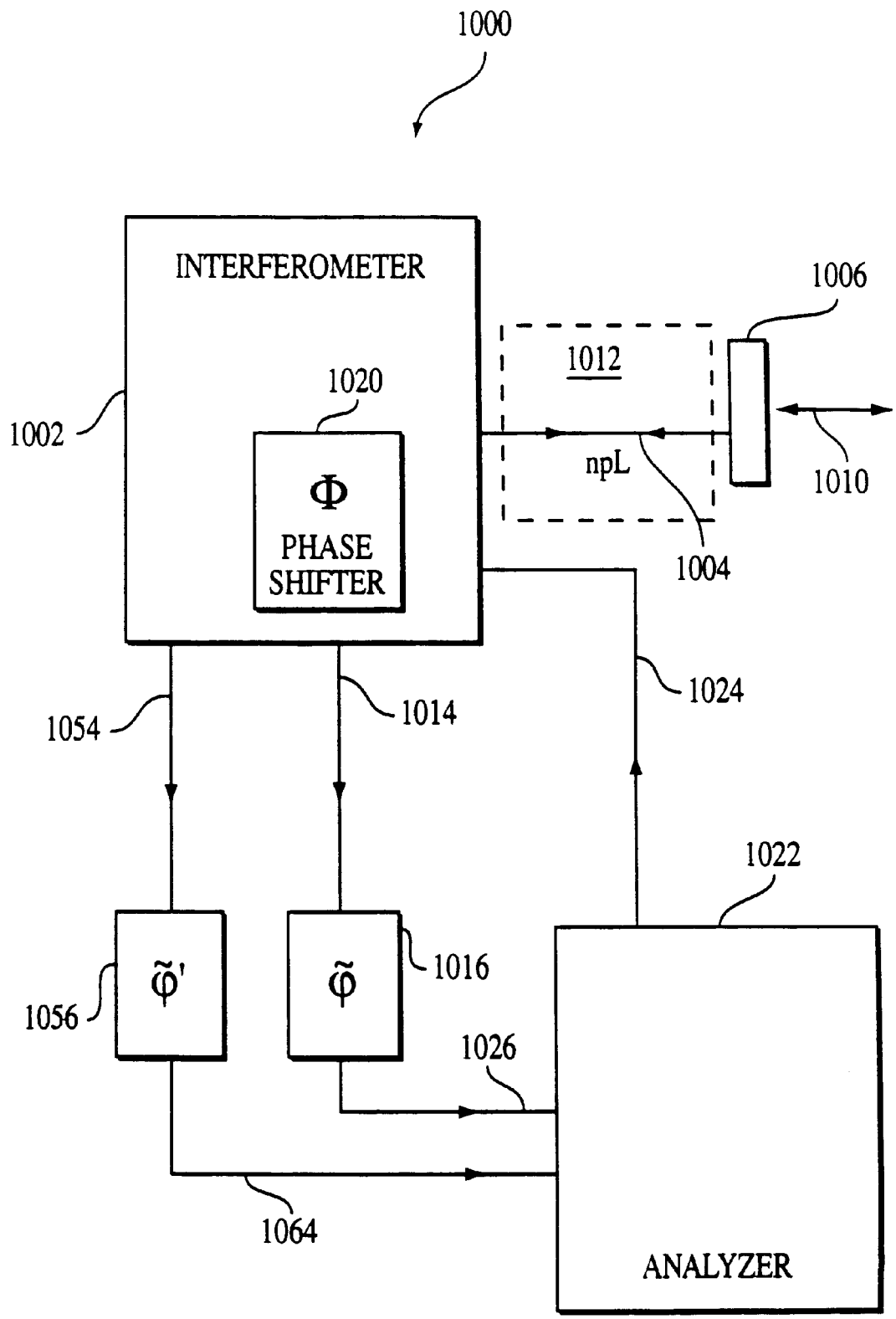
FIG. 10 is a general schematic diagram of an interferometry system that characterizes and corrects cyclic errors by using a phase-shifting component such as a phase shifter or a frequency modulator.

A general schematic of an interferometry system 1000 is shown in FIG. 10. An interferometer 1002 directs one or more measurement beams 1004 to a measurement object 1006. In distance measuring applications, the measurement object translates, as indicated by arrow 1010, and the interferometry system measures changes in the optical path length pnL to the measurement object, where L is the round trip distance, n is the refractive index, and ρ is the number of passes. In dispersion interferometry applications, the interferometer uses multiple measurement beams having different wavelengths to additionally characterize changes in the refractive index n of the gas 1012 in the path toward measurement object 1006. Such characterization permits the system to convert the optical path length change pnL into a physical path length change L. Alternatively, in some other applications, the position of measurement object 1006 is fixed and the interferometer determines the reciprocal dispersive power Γ of gas 1012 at the multiple wavelengths used in the dispersion interferometry applications.

Interferometer 1002 mixes the measurement beam with a reference beam to form a mixed beam 1014, whose phase $\tilde{\Phi}$ is measured by a detector 1016. In the absence of any non-linear contributions such as cyclic errors, the measured phase $\tilde{\Phi}$ equals the ideal phase $\Phi$, which equals $\Phi$=npkL. In this expression, k is the wavenumber $2\pi/\lambda$ corresponding to the wavelength $\lambda$ of the measurement beam (the reference and measurement beams are typically frequency-shifted with respect to one another to produce a heterodyne mixing frequency). However, most interferometers have cyclic error contributions to the measured phase $\tilde{\Phi}$ caused by beam mixing, multiple reflections, imperfections in optics, non-linearities in analog signal handling and processing, and aliasing in associated digital signal processing. Including the cyclic error contribution, an expression for $\tilde{\Phi}$ is given by Eq. (1):

$$\tilde{\varphi} = \varphi + \sum_{r=1} A_r \cos r\varphi + \sum_{r=1} B_r \sin r\varphi \qquad (1)$$

where $A_r$ and $B_r$ are the coefficients for corresponding cyclic errors of order r.

The Fourier sine and cosine series in Eq. (1) is an example of a spectral representation of the cyclic error nonlinearity. In other embodiments, different spectral representations can be used. For example, the cyclic error nonlinearity can be expressed as a series of Chebyshev polynomial functions, or other sets of orthogonal functions that form a complete set. For the remainder of the application, however, the Fourier sine and cosine series will be used as the spectral representation of the cyclic error nonlinearity.

To characterize the cyclic error coefficients, interferometry system 1000 includes a phase-shifting component 1020 that produces a variable and controlled phase shift φ between the reference and measurement beams at some point prior to the formation of mixed beam 1014. The phase φ is in addition to any optical delay introduced between the reference and measurement beams by changes in the position of measurement object 1006. The phase-shifting component can be an optoelectronic or optomechanical element that imparts a variable retardation to the reference and/or measurement beam(s). Alternatively, the phase-shifting component can be an optoelectronic or acousto-optical frequency modulator that changes the frequency of at least one of the reference and measurement beams to produce a corresponding change in the phase shift associated with propagation distances in the interferometer. Specific embodiments of the phase-shifting component and placements of the phase-shifting component within the interferometer will be described in greater detail below.

In general, the phase shift $\phi$ affects the cyclic error contribution to the measured phase $\Phi$ and the cyclic error coefficients $A_r$ and $B_r$ depend on the phase shift $\phi$, i.e., $A_r(\phi)$ and $B_r(\phi)$. Since the effect of phase shift $\phi$ on the cyclic error contribution to measured phase $\Phi$ can also be expressed by a spectral representation analogous to the spectral representation for $\Phi$, Eq. (1) can be rewritten as:

$$\tilde{\varphi}(\varphi, \phi) = \varphi + \phi + \Theta(\varphi, \phi) \quad (2)$$

where $$\Theta(\varphi, \phi) = \sum_{q=0, r=1} \cos q\phi (a_{qr}\cos r\varphi + b_{qr}\sin r\varphi) + \sum_{q=0, r=1} \sin q\phi (a'_{qr}\cos r\varphi + b'_{qr}\sin r\varphi) \quad (3)$$

Thus, the cyclic error contribution $\Theta(\Phi, \phi)$ to the measured phase $\tilde{\Phi}(\Phi, \phi)$ has been completely characterized by coefficients $a_{qr}$, $b_{qr}$, $a'_{qr}$, and $b'_{qr}$. Note also that in Eq. (2) the phase shift $\phi$ directly adds to the phase $\Phi$, which is true in most embodiments. However, in some embodiments, which will be described in greater detail below, the phase shift $\phi$ does not directly add to phase $\Phi$. Whether or not the phase shift $\phi$ adds to phase $\Phi$ depends on the placement of the phase-shifting component within interferometer 1002.

An analyzer 1022 controls phase-shifting component 1020 by sending a signal 1024 to the phase-shifting component that indicates the desired phase shift $\phi$, and receives a signal 1026 from detector 1016 that is indicative of the measured phase $\tilde{\Phi}(\Phi, \phi)$. Analyzer 1022 records values for the measured phase $\tilde{\Phi}(\Phi, \phi)$ for different values of phase shift $\phi$ and for different positions of measurement object 1006 (which changes the value of $\Phi$=npkL). Analyzer 1022 uses the recorded values to determine values for at least some of the cyclic error coefficients $a_{qr}$, $b_{qr}$, $a'_{qr}$, and $b'_{qr}$, as described further below.

Whether all of the cyclic error coefficients can be accurately determined using the recorded values depends on the position of phase-shifting component 1020 within the interferometry system. In particular, the size of the coefficients $a_{0r}$ and $b_{0r}$ relative to the size of the remaining portion of $\Theta(\Phi, \phi)$ depends on the position of phase-shifting component 1020 within the interferometry system. However, the effect of coefficients $a_{0r}$ and $b_{0r}$ on the measured phase $\tilde{\Phi}(\Phi, \phi)$ is independent of the phase shift $\phi$ and as a consequence can not be determined from an analysis of values of measured phase $\tilde{\Phi}(\Phi, \phi)$. In any case, analyzer 1022 can, in principle, determine all of the remaining cyclic error coefficients based on the recorded values of measured phase $\tilde{\Phi}(\Phi, \phi)$ as a function of phase shift $\phi$. As a consequence, phase-shifting component 1020 can be positioned in certain of the embodiments to characterize cyclic errors that arise at least in part from a particular physical phenomena such as multiple reflections between particular surfaces within the interferometer.

After analyzer 1022 determines values for coefficients $a_{qr}$, $b_{qr}$, $a'_{qr}$, and $b'_{qr}$, it can use the values to rapidly correct the measured phase $\tilde{\Phi}(\Phi, \phi)$ for cyclic error contributions to thereby determine a more accurate value for the optical path length pnL. For example, since the cyclic error contribution $\Theta(\Phi, \phi)$ to the measured phase $\tilde{\Phi}(\Phi, \phi)$ is typically small relative to $\Phi$=npkL, analyzer 1022 can convert the measured phase $\tilde{\Phi}$ into $\Phi$=npkL by performing the following iteration until a value for $\Phi$ converges, to the required level of accuracy, as shown in Eq. (4) below:

$$\Phi^{(0)} = \tilde{\Phi} \quad \Phi^{(j+1)} = \tilde{\Phi} - \phi - \Theta(\Phi^{(j)}, \phi) \quad (4)$$

the superscript denoting the order of iteration with the total number of iterations being j. In the iterative procedure, the analyzer uses the determined cyclic error coefficients and any phase shift $\phi$ value in the expression for $\Theta(\Phi, \phi)$. Once the analyzer determines a value for $\Phi$=npkL, the optical path length, corrected for cyclic errors excluding the effect of cyclic error contributions represented by coefficients $a_{0r}$ and $b_{0r}$, is determined simply by npL=$\Phi$/k.

As illustrated by the example above, after the analyzer determines accurate values for the cyclic error coefficients, it needs only a single measurement of phase $\tilde{\Phi}$ to determine a value for the optical path length to the measurement object having a cyclic error correction. In particular, it is not necessary for the analyzer to measure multiple values of $\tilde{\Phi}$ corresponding to multiple values the phase shift $\phi$ to determine the value for the optical path length having a cyclic error correction. This feature is crucial for applications in which the measurement object is being rapidly scanned or stepped and there is insufficient time for multiple measurements of phase $\tilde{\Phi}$ at each position of the measurement object. For example, in lithography applications, measurement stages are scanned at speeds on the order of meters per second and the interferometry system is required to monitor the position of the stage with an accuracy on the order of nanometers.

However, to determine the values for the cyclic error coefficients $a_{qr}$, $b_{qr}$, $a'_{qr}$, and $b'_{qr}$ analyzer 1022 does record values for the measured phase $\tilde{\Phi}(\Phi, \phi)$ for multiple values of phase-shift $\phi$ at each of multiple positions of the measurement object (corresponding to values of $\Phi$). Analyzer 1022 then uses the recorded values to Fourier invert Eq. (2), which gives the following expressions for the cyclic error coefficients:

$$a_{qr} = \frac{1}{\pi^2} \int\int_{0 \text{ to } 2\pi} [(\tilde{\varphi}(\varphi, \phi) - \phi) - (\tilde{\varphi}(\varphi, \phi_0) - \phi_0)]\cos(r\varphi)\cos(q\phi)d\varphi d\phi \quad (5)$$

$$a'_{qr} = \frac{1}{\pi^2} \int\int_{0 \text{ to } 2\pi} [(\tilde{\varphi}(\varphi, \phi) - \phi) - (\tilde{\varphi}(\varphi, \phi_0) - \phi_0)]\sin(r\varphi)\cos(q\phi)d\varphi d\phi$$

$$b_{qr} = \frac{1}{\pi^2} \int\int_{0 \text{ to } 2\pi} [(\tilde{\varphi}(\varphi, \phi) - \phi) - (\tilde{\varphi}(\varphi, \phi_0) - \phi_0)]\cos(r\varphi)\sin(q\phi)d\varphi d\phi$$

$$b'_{qr} = \frac{1}{\pi^2} \int\int_{0 \text{ to } 2\pi} [(\tilde{\varphi}(\varphi, \phi) - \phi) - (\tilde{\varphi}(\varphi, \phi_0) - \phi_0)]\sin(r\varphi)\sin(q\phi)d\varphi d\phi$$

for $q \geq 1$, $r \geq 1$ where the phase shift $\phi_0$ is a reference phase shift chosen by the analyzer, e.g., $\phi_0 = 0$.

The two dimensional integrations in Eq. (5) may be executed as two dimensional Fast Fourier transform (FFT) algorithms.

To integrate the expressions in Eq. (5), the analyzer determines the terms in square bracket of the integrands from measured values of $\tilde{\Phi}$, which are indexed by the phase shift $\phi$ and $\phi_0$, both of which are known, and the ideal phase $\Phi$, which is only known approximately and corresponds to the position of the measurement object. In particular, only the approximate value $\Phi'$ of the ideal phase $\Phi$ is known, i.e., $\Phi' \approx \Phi = \tilde{\Phi} - \phi$, which ignores the cyclic error contribution. To address the uncertainty with regard to ideal phase $\Phi$, the analyzer performs one of the following two techniques.

According to the first technique, analyzer 1022 directly determines the value of the ideal phase $\Phi$ for each position of the measurement object based on the measured values of $\Phi(\tilde{\Phi}, \phi)$ for multiple values of the phase shift $\phi$. In particular, and based on Eq. (2), analyzer 1022 sums the measured values of $\Phi(\tilde{\Phi}, \phi)$ to determine phase $\Phi$ according to the following integral shown in Eq. (6):

$$\varphi = \frac{1}{2\pi}\int_0^{2\pi}(\tilde{\varphi}(\varphi, \phi) - \phi)d\phi \qquad (6)$$

Thereafter, using exact values for $\Phi$, analyzer 1022 estimates the values for the cyclic coefficients based on Eqs. (5).

According to the second technique, analyzer 1022 estimates the cyclic error coefficients iteratively by using the approximate value $\Phi$ for an initial value of $\Phi$ in Eqs. (5). In particular, analyzer 1022 determines first order values for the cyclic error coefficients according to Eqs. (5) by replacing $\Phi$ with $\tilde{\Phi}$ in Eqs. (5). Thereafter, analyzer 1022 determines first order values for $\Phi$ according to the iteration in Eq. (4), based on the first order values for the cyclic error coefficients. Then, analyzer 1022 determines second order values for the cyclic error coefficients according to Eqs. (5) by replacing $\tilde{\Phi}$ with the first order values for $\Phi$ in Eq. (5). Analyzer 1022 repeats the procedure until values for the cyclic error coefficients converge.

As described previously, in applications where rapid correction of the cyclic error contribution during is necessary, initially determining the cyclic error coefficients as described above is especially useful. Using the determined cyclic error coefficients, the analyzer can correct each optical path length measurement for the cyclic error contribution based only on that one measurement. However, determining the cyclic error coefficients themselves can be time-consuming, because the analyzer requires multiple measurements, and in particular, multiple measurements in which the phase shift $\phi$ is varied at each of multiple positions of the measurement object. As a result, during determination of the cyclic error coefficients, the scanning or stepping rate of the measurement object needs to be slow enough to permit the multiple measurements at each position of the measurement object.

To overcome this limitation, interferometer 1002 can mix a second pair of reference and measurement beams in which the measurement beam reflects from the measurement object to produce another mixed beam 1054 that is not affected by phase-shifting component 1020. Another detector 1056 measures the phase $\Phi$ of mixed beam 1054 and sends a signal 1064 indicative of that phase to analyzer 1022. Alternatively, the interferometer can include only the first pair of reference and measurement beams, which produces both mixed beams 1014 and 1054, provided that phase-shifting component 1020 only introduces the phase shift $\phi$ between the first pair of reference and measurement beams after mixed beam 1054 has been formed. Mixed beam 1014 and detector 1016 define a first channel for interferometry system 1000 and mixed beam 1054 and detector 1056 define a second channel for interferometry system 1000.

Including the cyclic error contribution, an expression for $\Phi$ is given by Eq. (7):

$$\tilde{\varphi}' = \varphi + \sum_{r=1} A'_r \cos r\varphi + \sum_{r=1} B'_r \sin r\varphi \qquad (7)$$

where $A'_r$ and $B'_r$ are cyclic error coefficients that have values that are in general different from, but in many cases similar to, the values of corresponding cyclic error coefficients $A_r$ and $B_r$. In addition, although we have ignored it here, the optical path length npL implicit in the phase $\Phi$ in Eq. (7) can include an offset from the corresponding term in Eq. (1).

During operation, analyzer 1022 simultaneously records values for the measured phases $\tilde{\Phi}$ and $\tilde{\Phi}'$, as an ordered pair. The value for $\tilde{\Phi}$ depends both on the value of phase shift $\phi$ introduced by the phase-shifting component and on the position of measurement object 1006, whereas the value for $\tilde{\Phi}'$ depends only on the position of measurement object 1006. Because of this property, analyzer 1022 indexes each value of measured phase $\tilde{\Phi}$ to a position of the measurement object (and thereby to the value of $\Phi$) according to the value of $\tilde{\Phi}'$ measured simultaneously with that value of measured phase $\tilde{\Phi}$. This permits analyzer 1022 to collect data for characterizing cyclic errors in a flexible manner. In particular, values for the measured phase $\tilde{\Phi}(\Phi, \phi)$ at multiple values of phase shift $\phi$ and a single value for the position of the measurement object need not be measured as the measurement object rests at that specific position. Instead, analyzer 1022 can sort values for the measured phase $\tilde{\Phi}(\Phi, \phi)$ recorded over multiple scans of the measurement object and at multiple phase shifts $\phi$ into groups in which each member has a corresponding value of $\tilde{\Phi}'$ that is identical to that of every other member in the group.

For example, analyzer 1022 records values for phases $\tilde{\Phi}$ and $\tilde{\Phi}'$ as ordered pairs [$\tilde{\Phi}$, $\tilde{\Phi}'$] as interferometry system 1000 is operating under normal conditions, e.g., scanning measurement object 1006. During this time and in addition to recording the ordered pairs, analyzer 1022 may be correcting the cyclic error contribution to $\tilde{\Phi}$ and/or $\tilde{\Phi}'$ based on some guess or prior calibration of the cyclic error coefficients. After each scan of the measurement object, analyzer 1022 causes phase-shifting component 1020 to change the value of phase shift $\phi$ by some increment until data is collected at phase shifts $\phi$ spanning a requisite set of values.

At this point, analyzer 1022 has sufficient data to determine and/or update the values for the cyclic error coefficients used in the correction of the cyclic error contribution to the measured phase(s). Analyzer 1022 sorts the ordered pairs [$\tilde{\Phi}$, $\tilde{\Phi}'$] into groups in which the $\tilde{\Phi}'$ entry is the same. Although the measured phase $\tilde{\Phi}'$ includes a cyclic error contribution, each value of $\tilde{\Phi}'$ corresponds to a unique position of the measurement object (at least under typical conditions in which the cyclic error coefficients $a_{qr}$, $b_{qr}$, $a'_{qr}$ and $b'_{qr}$ do not significantly change during the period used to acquire a new set of measurements). Thus, the sorting provides groups of $\tilde{\Phi}(\Phi, \phi)$ that have different values of phase shift $\phi$ and identical, albeit unknown, values for the phase $\Phi$. Analyzer 1022 determines the value of the phase $\Phi$ for each group by performing the integration prescribed by Eq. (6) and thereafter determines the values for the cyclic coefficients $a_{qr}$, $b_{qr}$, $a'_{qr}$, and $b'_{qr}$ based on Eq. (5) and the data in all of the groups. Alternatively, analyzer 1022 can determine the cyclic error coefficients using the iterative technique described above. If desired, analyzer 1022 can also determine the cyclic error coefficients $A'_r$ and $B'_r$ corresponding to the second channel by Fourier inversion of Eq. (7) for the measured values of $\tilde{\Phi}'(\Phi)$ and corrected values of the phase $\Phi$ determined by using the analysis from the first channel.

Using the two-channel system described above, the interferometry system can operate continuously to measure changes in the position of the measurement object and simultaneously record data sufficient to completely characterize cyclic errors within the system as a function of time and/or other parameters of the system. The analysis of the recorded data can be performed without interrupting scanning or stepping of the measurement object. In particular, the system can characterize the cyclic errors multiple times during the day as the system operates. As a result, changes in the cyclic error coefficients due to for example environmental factors or changes in tilt and/or yaw of a lithographic stage mirror serving as part of interferometer system that degrade optics or affect the alignment of the interferometer of optics can be monitored frequently or as required throughout daily operation.

As will be seen below, the analysis performed by analyzer 1022 can be changed in a variety of ways. For example, a measured observable different from the one used in Eqs. (5), such as an observable that includes the difference between the phases measured by the two channels, can be used to isolate the cyclic error coefficient based on the measurements of interferometry system 1000.

It is important to note that in applications in which a rapid scanning or stepping rate for the measurement object is not critical, interferometry system 1000 can operate by simply correcting the measured phase $\Phi(\Phi, \phi)$ for the cyclic error contribution without actually characterizing the cyclic error coefficients. In such applications only a single channel is necessary and analyzer 1022 records values for measured phase $\Phi(\Phi, \phi)$ at multiple values of phase-shift $\phi$ for each position of the measurement object during a scan. At each position, analyzer 1022 determines ideal phase $\Phi$ and thereby optical path length $npL=\Phi/k$, by integrating over $\Phi(\Phi, \phi)$ according to Eq. (6).

In other embodiments, described in greater detail below, the phase-shifting component imparts the phase-shift $\phi$ to both the reference and measurement beams, rather than between the reference and measurement beams. Such embodiments can be useful for example in characterizing cyclic errors caused by multiple reflections in the interferometer. The analysis performed by analyzer 1022 is similar to that described above except that there is no addition or subtraction of phase-shift $\phi$ from the terms in Eqs. (2)–(5).

In another set of embodiments, the phase-shifting component is not used. Instead, the system includes a dispersion interferometer that measures the optical path length $np(\lambda)L$ to the measurement object at two wavelengths $\lambda_1$ and $\lambda_2$ by using two pairs of reference and measurements beams having wavelengths $\lambda_1$ and $\lambda_2$ respectively. The wavelengths $\lambda_1$ $_{and}$ $_{\lambda 2}$ satisfy the relation $\lambda_1/\lambda_2=l_1/l_2$ where $l_1$ and $l_2$ are integers. A pair of detectors measures the intensities of mixed beams derived from the two pairs of reference and measurement beams and an analyzer measures phases $\Phi_{\lambda 1}$ and $\Phi_{\lambda 2}$ corresponding to the intensities of the mixed beams. The analyzer records phases $\Phi_{\lambda 1}$ and $\Phi_{\lambda 2}$ at each of multiple positions of the measurement objects and also calculates the dispersion parameter $\Phi=(l_1\Phi_{\lambda 1}/p)-(l_2\Phi_{\lambda 2}/p)$ for each of the multiple positions.

In the absence of cyclic errors in each of the measured phases $\Phi_{\lambda 1}$ and $\Phi_{\lambda 2}$, the dispersion parameter $\Phi$ is directly proportional to the dispersion $n(\lambda_1)-n(\lambda_2)$ in the measurement arm. However, each of the phases $\Phi_{\lambda 1}$ and $\Phi_{\lambda 2}$ corresponding to the optical path length measurements include cyclic errors. The cyclic errors can be expressed as shown in Eq. (1). Moreover, the dispersion parameter $\Phi$ also includes contributions from the cyclic errors in the phases $\Phi_{\lambda 1}$ and $\Phi_{\lambda 2}$. In fact, as will be shown in greater detail below, the contribution of the cyclic errors to the correction for dispersion effects, $\Gamma\Phi$, in $\Phi_{\lambda 1}$ and $\Phi_{\lambda 2}$ is greater than the contribution of cyclic errors to either of the phases $\Phi_{\lambda 1}$ and $\Phi_{\lambda 2}$ by about the factor $\Gamma$. The factor $\Gamma\Gamma$ which is the reciprocal dispersive power equal to $\Gamma=(n(\lambda_1)-1)/(n(\lambda_1)-n(\lambda_2))$, is typically 1 to 2 orders of magnitude greater than 1.

Thus, the dispersion correction $\Gamma\Phi$ is more sensitive to cyclic errors than are the measured phases $\Phi_{\lambda 1}$ and $\Phi_{\lambda 2}$.

To characterize the cyclic error coefficients that contribute to the dispersion parameter, the analyzer measures the dispersion parameter $\Phi$ as a function of one or both of the measured phases $\Phi_{\lambda 1}$ and $\Phi_{\lambda 2}$ by changing the position of the measurement object. Thereafter, the analyzer filters the dispersion parameter $\Phi$ to eliminate the effect of the cyclic error coefficients or Fourier analyzes the dispersion parameter $\Phi$ to determine the values of the cyclic error coefficients that contribute to the dispersion parameter in a manner similar to that shown in Eqs. (2) and (5). The theoretical expression includes Fourier series expansions in one or both of the ideal phases $\Phi_{\lambda 1}$ and $\Phi_{\lambda 2}$ corresponding to the measured phases $\Phi_{\lambda 1}$ and $\Phi_{\lambda 2}$. In the Fourier analysis, the analyzer substitutes the measured phases $\Phi_{\lambda 1}$ and $\Phi_{\lambda 2}$ for the ideal phases $\Phi_{\lambda 1}$ and $\Phi_{\lambda 2}$. The substitution is used effectively because the cyclic error contributions to the measured phases $\Phi_{\lambda 1}$ and $\Phi_{\lambda 2}$ relative to respective ideal phases $\Phi_{\lambda 1}$ and $\Phi_{\lambda 2}$ are much less than cyclic error contribution to the dispersion parameter $\Phi$ in relation to the dispersion parameter $\Phi$. As a result, the values for the cyclic error coefficients are determined with a relative precision substantially the same as the cyclic error contributions in the measured phases $\Phi_{\lambda 1}$ and $\Phi_{\lambda 2}$ relative to the respective ideal phases $\Phi_{\lambda 1}$ and $\Phi_{\lambda 2}$.

In further embodiments, the dispersion interferometry system can also include a phase-shifting component as described previously to further refine the determined values for the cyclic errors. In such systems the analyzer records optical distance measurements as a function of the phase-shift $\phi$ and dispersion measurements as a function of multiple positions of the measurement object to characterize cyclic errors in the system. As with the two-channel system described previously, the dispersion measuring embodiment permits cyclic errors to be characterized in the background during normal distance measuring operations in which the measurement object is scanned or stepped.

In general, for the embodiments of the interferometry system described herein, the analyzer includes one or more computer processors for performing the appropriate analysis steps. The numerical and symbolic steps described herein can be converted into a digital program executed, e.g., on a digital signal processor (DSP) according to methods well known in the art. The digital program can be stored on a computer readable medium such as a hard disk and can be executable by the computer processors in the analyzer. Alternatively, the appropriate analysis steps can be converted into a digital program that is hardwired into dedicated electronic circuits within the analyzer that executes the steps. Methods for generating such dedicated electronic circuits based on a given numerical or symbolic analysis procedure are also well known in the art.

Detailed descriptions of specific embodiments follow below. While they differ in some details, the disclosed embodiments otherwise share many common elements and naturally fall into several groups depending on the type of end use application and on whether the cyclic errors are being measured and the measured cyclic errors used to correct for effects of nonlinearities due to the cyclic errors or whether the cyclic errors are being filtered out with respect to optical path length. As will be seen, the disclosed embodiments within each group also differ in the details of how their interferometric optical paths are implemented and/or how certain information signals are handled electronically. A first group of embodiments of the several groups comprise distance measuring interferometers operating with one wavelength.

A second group of embodiments of the several groups comprise interferometers operating with a primary wavelength for the measuring purpose of the interferometer and a second wavelength which can be scanned over a given wavelength interval for the purpose of measuring cyclic errors in the interferometer at either or both the first and the second wavelengths.

A third group of embodiments of the several groups comprise both an apparatus and method for measuring and correcting for cyclic errors in dispersion related signals of distance measuring interferometry wherein the effects of gas in the measuring path of a distance measuring interferometer are corrected by a dispersion interferometry based procedure.

Embodiments of a fourth group of the several groups comprise both an apparatus and method for measuring and correcting for cyclic errors in both the dispersion related signals and the distance measuring related signals of distance measuring interferometry using dispersion interferometry to determine the effects of a gas on the measured optical path of the distance measuring interferometry and an apparatus and method for filtering out the cyclic errors in the dispersion related signals.

Embodiments in a fifth group of the several groups comprise both an apparatus and method for measuring and correcting for cyclic errors in both a dispersion related signal and a refractivity related signal or refractivity related signals used to measure intrinsic optical properties of a gas. Embodiments in the fifth group of the several groups further comprise an apparatus and method for filtering out the cyclic errors in both a dispersion related signal and a refractivity related signal or refractivity related signals used to measure intrinsic optical properties of a gas.

Figure 1A:
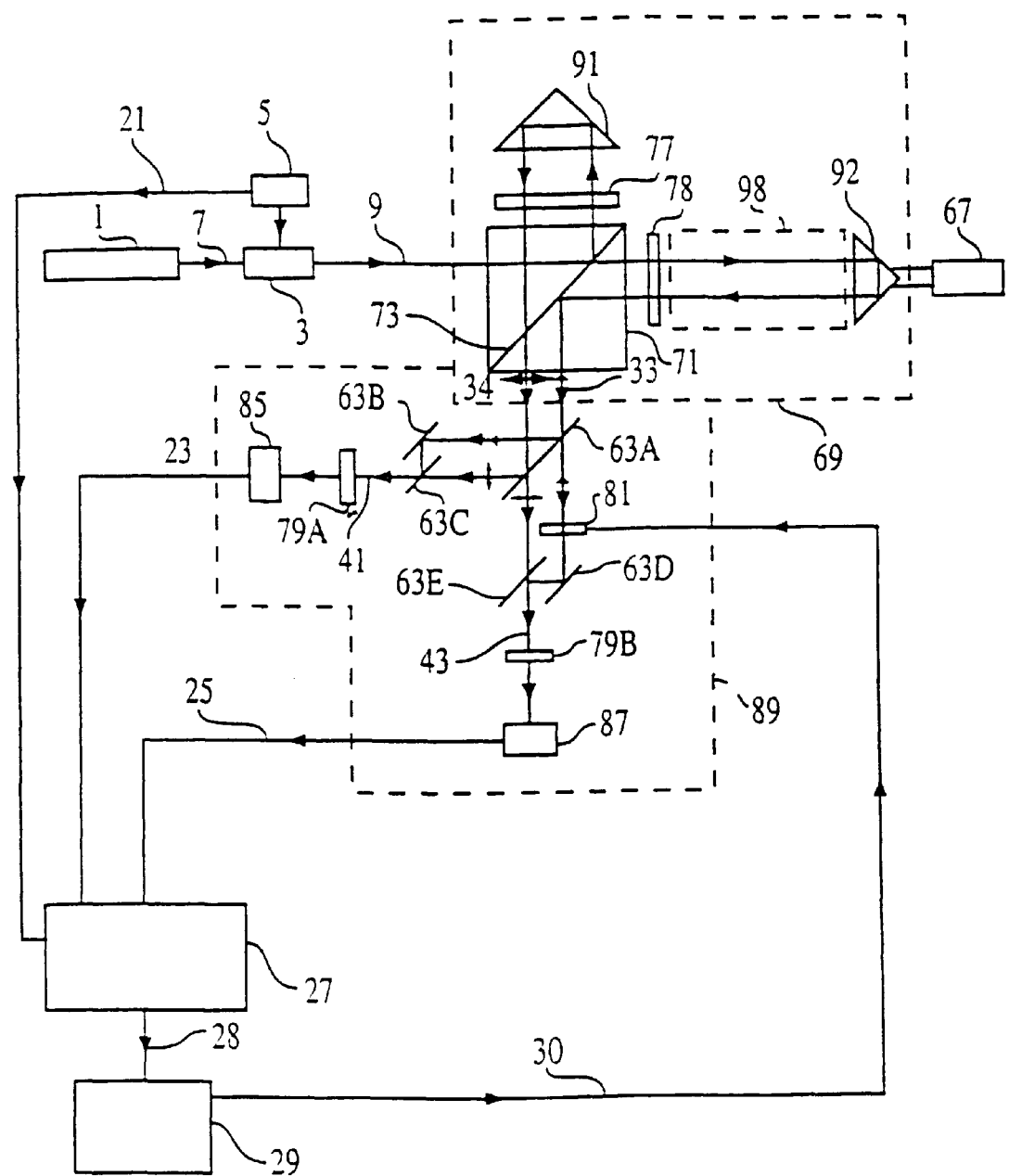
FIG. 1a is a schematic diagram of an interferometry system that characterizes and corrects cyclic errors by using a phase shifter.

FIG. 1a depicts in schematic form in accordance with the preferred apparatus and method of the first embodiment of the present invention. The first embodiment is from the first group of embodiments. The interferometer depicted in FIG. 1a is a polarizing, heterodyne, single pass interferometer. Although the described embodiment is a heterodyne system, the instant invention is readily adapted for use in a homodyne system in which the reference and measurement beams have the same frequencies. While the apparatus has application for a wide range of radiation sources, the following description is taken by way of example with respect to an optical measuring system.

Referring to FIG. 1a, a light beam 7 emitted from source 1 passes through a modulator 3 becoming light beam 9. Modulator 3 is excited by a driver 5. Source 1 is preferably a laser or like source of coherent radiation, preferably polarized, and having a wavelength $\lambda_1$. Modulator 3 may, for example, be an acousto-optical device or a combination of acousto-optical devices with additional optics for selectively modulating polarization components of beam 7. Modulator 3 preferably shifts the oscillation frequency of one linearly polarized component of beam 7 an amount $f_1$ with respect to an orthogonally linearly polarized component, the directions of polarizations of the components, denoted herein as x and y which are parallel and orthogonal, respectively, to the plane of FIG. 1a. The oscillation frequency $f_1$ is determined by the driver 5.

Light source 1 such as a laser can be any of a variety of frequency modulation apparatus and/or lasers. For example, the laser can be a gas laser, e.g., a HeNe laser, stabilized in any of a variety of conventional techniques known to those skilled in the art, see for example, T. Baer et al., "Frequency Stabilization of a 0.633 μm He—Ne—longitudinal Zeeman Laser," Applied Optics, 19, 3173–3177 (1980); Burgwald et al., U.S. Pat. No. 3,889,207, issued Jun. 10, 1975; and Sandstrom et al., U.S. Pat. No. 3,662,279, issued May 9, 1972. Alternatively, the laser can be a diode laser frequency stabilized in one of a variety of conventional techniques known to those skilled in the art, see for example, T. Okoshi and K. Kikuchi, "Frequency Stabilization of Semiconductor Lasers for Heterodyne-type Optical Communication Systems," Electronic Letters, 16, 179–181 (1980) and S. Yamaqguchi and M. Suzuki, "Simultaneous Stabilization of the Frequency and Power of an AlGaAs Semiconductor Laser by Use of the Optogalvanic Effect of Krypton," IEEE J. Quantum Electronics, QE-19, 1514–1519 (1983).

Two optical frequencies may be produced by one of the following techniques: (1) use of a Zeeman split laser, see for example, Bagley et al., U.S. Pat. No. 3,458,259, issued Jul. 29, 1969; G. Bouwhuis, "Interferometrie Mit Gaslasers," Ned. T. Natuurk, 34, 225–232 (Aug. 1968); Bagley et al., U.S. Pat. No. 3,656,853, issued Apr. 18, 1972; and H. Matsumoto, "Recent interferometric measurements using stabilized lasers," Precision Engineering, 6(2), 87–94 (1984); (2) use of a pair of acousto-optical Bragg cells, see for example, Y. Ohtsuka and K. Itoh, "Two-frequency Laser Interferometer for Small Displacement Measurements in a Low Frequency Range," Applied Optics, 18(2), 219–224 (1979); N. Massie et al., "Measuring Laser Flow Fields With a 64-Channel Heterodyne Interferometer," Applied Optics, 22(14), 2141–2151 (1983); Y. Ohtsuka and M. Tsubokawa, "Dynamic Two-frequency Interferometry for Small Displacement Measurements," Optics and Laser Technology, 16, 25–29 (1984); H. Matsumoto, ibid.; P. Dirksen, et al., U.S. Pat. No. 5,485,272, issued Jan. 16, 1996; N. A. Riza and M. M. K. Howlader, "Acousto-optic system for the generation and control of tunable low-frequency signals," Opt. Eng., 35(4), 920–925 (1996); (3) use of a single acousto-optic Bragg cell, see for example, G. E. Sommargren, commonly owned U.S. Pat. No. 4,684,828, issued Aug. 4, 1987; G. E. Sommargren, commonly owned U.S. Pat. No. 4,687,958, issued Aug. 18, 1987; P. Dirksen, et al., ibid.; (4) use of two longitudinal modes of a randomly polarized HeNe laser, see for example, J. B. Ferguson and R. H. Morris, "Single Mode Collapse in 6328 Å HeNe Lasers," Applied Optics, 17(18), 2924–2929 (1978); (5) use of birefringent elements or the like internal to the laser, see for example, V. Evtuhov and A. E. Siegman, "A "Twisted-Mode" Technique for Obtaining Axially Uniform Energy Density in a Laser Cavity," Applied Optics, 4(1), 142–143 (1965); or the use of the systems described in U.S. Ser. No. 09/061,928 filed Apr. 17, 1998 entitled "Apparatus to Transform Two Non-Parallel Propagating Optical Beam Components into Two Orthogonally Polarized Beam Components" by Henry A. Hill et al., the contents of which are incorporated herein by reference.

The specific device used for the source of beam 9 will determine the diameter and divergence of beam 9. For some sources, e.g., a diode laser, it will likely be necessary to use conventional beam shaping optics, e.g., a conventional microscope objective, to provide beam 9 with a suitable diameter and divergence for elements that follow. When the source is a HeNe laser, for example, beam shaping optics may not be required.

As shown in FIG. 1a, interferometer 69 comprises a reference retroreflector 91, object retroreflector 92, quarter wave phase retardation plates 77 and 78, and a polarizing beam splitter 71. This configuration is known in the art as a polarized Michelson interferometer. The position of object retroreflector 92 is controlled by translator 67.

Beam 9 incident on interferometer 69 results in beams 33 and 34 as illustrated in FIG. 1a. Beams 33 and 34 contain information at wavelength $\lambda_1$ about the optical path length through the gas in measuring path 98 and about the optical path length through the reference path, respectively. Beams 33 and 34 exit interferometer 69 and enter detector system 89 illustrated in diagrammatic form in FIG. 1a. In detector system 89, a first portion of beam 33 is reflected by nonpolarizing beam splitter 63A, reflected by mirror 63B, and incident on beam splitter 63C. A portion of the first portion of beam 33 reflected by nonpolarizing beam splitter 63A is reflected by polarizing beam splitter 63C to become a first component of beam 41. A first portion of beam 34 is reflected by nonpolarizing beam splitter 63A and incident of polarizing beam splitter 63C. The first portion of beam 34 reflected by nonpolarizing beam splitter 63A is transmitted by polarizing beam splitter 63C to become a second component of beam 41. A second portion of beam 33 is transmitted by nonpolarizing beam splitter 63A, transmitted by variable phase shifter 81, reflected by mirror 63D, and incident on polarizing beam splitter 63E. The second portion of beam 33 transmitted by nonpolarizing beam splitter 63A is reflected by polarizing beam splitter 63E to become a first component of beam 43. A second portion of beam 34 is transmitted by nonpolarizing beam splitter 63A and incident of polarizing beam splitter 63E. The second portion of beam 34 transmitted by nonpolarizing beam splitter 63A is transmitted by polarizing beam splitter 63E to become a second component of beam 43.

Interferometer 69 introduces phase shifts $\Phi_1$ and $\Phi_2$ between the first and second components of beam 41 and the first and second components of beam 43, respectively. The magnitude of phase shifts $\Phi_1$ and $\Phi_2$ are related to round-trip physical length $L_i$ of measurement path 98 according to the formulae $$\Phi_i = L_i p k_1 n_i, \quad i=1 \text{ and } 2, \tag{8}$$

where p is the number of passes through the respective reference and measurement legs, $n_i$ is the refractive index of a gas in measurement path 98 corresponding to the optical path introducing the phase shift $\Phi_i$ and to wavenumber $k_1 = 2\pi/\lambda_1$. The interferometer shown in FIG. 1a is for p=1 so as to illustrate in the simplest manner the function of the apparatus of the first embodiment. To those skilled in the art, the generalization to the case when p≠1 is a straight forward procedure.

The nominal value for $L_i$, i=1 and 2, corresponds to twice the difference between the physical length of measuring path i and an associated reference path. The lengths $L_1$ and $L_2$ are equal to a high accuracy, the beams associated with phase shifts $\Phi_1$ and $\Phi_2$ being derived from the same beam 33. Except for higher order effects such as turbulence in the gas and other sources of localized density gradients in the gas, the refractive indices $n_1$ and $n_2$ are equal to a high accuracy, the beams associated with phase shifts $\Phi_1$ and $\Phi_2$ being derived from the same beam 33.

Variable phase shifter 81 shown in FIG. 1a introduces a phase shift $\phi$ into the second portion of beam 33 transmitted by nonpolarizing beam splitter 63A, the magnitude of the phase shift $\phi$ being adjustable and controlled by signal 30.

A series of different embodiments of variable phase shifter 81 is depicted in diagrammatic form in FIGS. 1b–1e. A first embodiment of variable phase shifter 81 not shown in FIGS. 1b–1e comprises a set of phase shifter plates, of either the nonbirefringent or birefringent type, of differing optical thicknesses wherein the phase shift is changed by sequentially inserting in the path of a respective beam different phase shift plates from the set of phase shift plates.

Figure 1B:
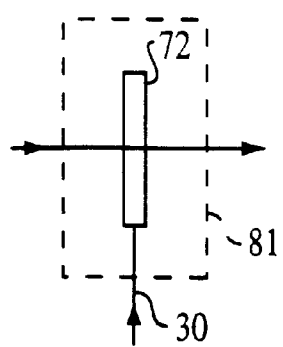
FIGS. 1b–1e are schematics of phase shifters suitable for use with systems described herein.

A second embodiment of variable phase shifter 81 shown in FIG. 1b comprises an electro-optical modulator 72, the phase shift being controlled, e.g., by a signal 30 from computer 29.

Figure 1C:
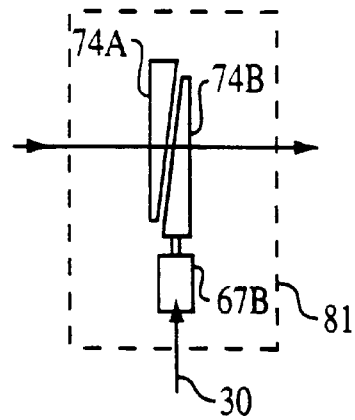

A third embodiment of variable phase shifter 81 shown in FIG. 1c comprises two substantially identical prisms 74A and 74B oriented so as to not change the direction of propagation of a beam transmitted by the pair of prisms, the phase shift introduced by the pair of prisms being altered by changing the degree of overlap of the pair of prisms by translator 67B controlled, e.g., by a signal 30 from computer 29.

Figure 1D:
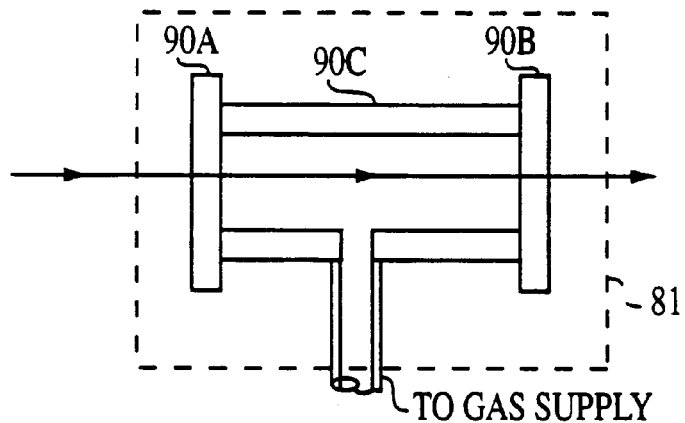

A fourth embodiment of variable phase shifter 81 shown in FIG. 1d comprises a cell formed with windows 90A and 90B separated by a right circular cylinder 91 filled with a predetermined gas, the phase shift introduced by the fourth embodiment being altered by changing the density of the predetermined gas in the cell. The gas handling system for changing the density of the predetermined gas in the cell formed by windows 90A and 90B and cylinder 91 is not shown in FIG. 1d.

Figure 1E:
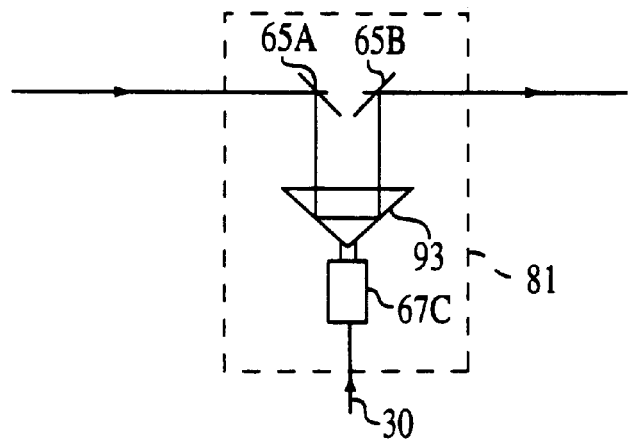

A fifth embodiment of variable phase shifter 81 shown in FIG. 1e comprises two mirrors 65A and 65B and retroreflector 93, the phase shift introduced by the fifth embodiment being altered by changing the separation of the retroreflector 93 and the pair of mirrors 65A and 65B by translator 67C controlled, e.g., by a signal 30 from computer 30.

In a next step as shown in FIG. 1a, phase-shifted beams 41 and 43 pass through polarizers 79A and 79B, respectively, impinge upon photodetectors 85 and 87, respectively, and generate electrical interference signals, heterodyne signals $s_1$ and $s_2$, respectively, preferably by photoelectric detection. Polarizers 79A and 79B are oriented so as to mix polarization components of beam 41 and the polarization components of beam 43, respectively. The signals $s_1$ and $s_2$ have the form $$s_i = A_i(t) \cos [\alpha_i(t)], \quad i=1 \text{ and } 2. \tag{9}$$

The signal $s_i$ is the real part, $\hat{s}_{i,R}$, of a complex number $\hat{s}_i$ where $s_i$ comprises a causal, stable, i.e., absolutely summable, real sequence. Thus, the Fourier transform $S_{i,R}$ (jω) of $s_i$ completely defines $S_i(j\omega)$ [see Chapter 10 "Discrete Hilbert Transforms" in *Discrete-Time Signal Processing*, (Prentice Hall, 1989) by A. V. Oppenheim and R. W. Schafer] where $$S_i(j\omega) = S_{i,R}(j\omega) + iS_{i,I}(j\omega), \quad i=1 \text{ and } 2, \tag{10}$$

$S_{i,I}(j\omega)$ is the imaginary component of $S_i(j\omega)$, ω is an angular frequency, and j is the imaginary number $\sqrt{-1}$. The imaginary component $\hat{s}_{i,I}$ of $\hat{s}_i$ is obtained from the inverse Fourier transform of $S_{i,I}(j\omega)$ with $$\hat{s}_{i,I} = A_i(t) \sin [\alpha_i(t)], \quad i=1 \text{ and } 2. \tag{11}$$

The phase $\alpha_i(t)$ can be obtained from $\hat{s}_{i,R}$ and $\hat{s}_{i,I}$ according to the formulae $$\alpha_i(t) = \arctan\left(\frac{s_{i,I}}{s_{i,R}}\right), \quad i = 1 \text{ and } 2. \tag{12}$$

The time-dependent arguments $\alpha_i(t)$ are expressed in terms of other quantities according to the formulae $$\alpha_1(t) = 2\pi f_1 t + \Phi_1 + \zeta_1 + \Lambda_1,$$

$$\alpha_2(t) = 2\pi f_1 t + \Phi_2 + \zeta_2 + \Lambda_2 + \phi, \tag{13}$$

where $\Lambda_1$ and $\Lambda_2$ comprise the nonlinear errors including in particular cyclic error terms, $\phi$ is the phase shift produced by phase shifter 81 without substantially altering the nonlinearity $\Lambda_2$, and phase offsets $\zeta_1$ and $\zeta_2$ comprise all contributions to the phases $\alpha_1$ and $\alpha_2$, respectively, that are not related or associated with the optical path of the measurement path 98 or reference path and not related to nonlinear errors. Heterodyne signals $s_1$ and $s_2$ are transmitted to electronic processor 27 for analysis as electronic signals 23 and 25, respectively, in either digital or analog format, preferably in digital format.

Figure 1F:
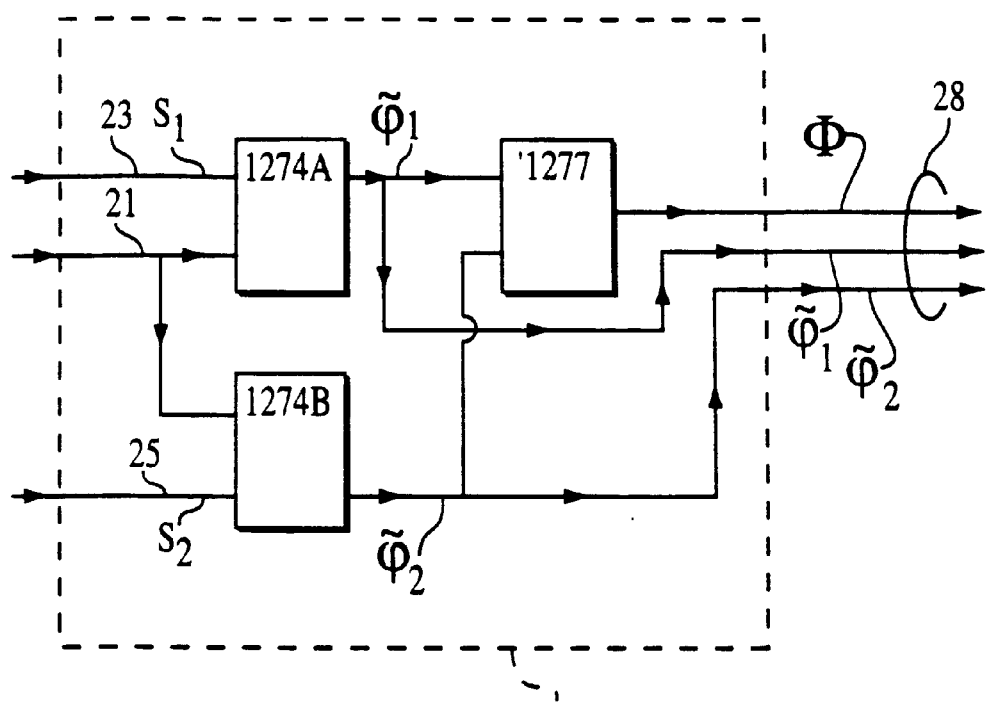

Referring now to FIG. 1f, electronic processor 27 further comprises electronic processors 1274A and 1274B to determine measured phases $\Phi_1$ and $\Phi_2$, respectively, $$\Phi_1 = \Phi_1 + \zeta_1 + \Lambda_1(\Phi_1), \; \Phi_2 = \Phi_2 + \zeta_2 + \Lambda_2(\Phi_2, \phi) + \phi, \tag{14}$$

by either digital or analog signal processes, preferably digital processes, using time-based phase detection such as a digital Hilbert transform phase detector [see section 4.1.1 of "Phase-locked loops: theory, design, and applications" 2nd ed. McGraw-Hill (New York) 1993, by R. E. Best] or the like and the phase of driver 5.

The phase of driver 5 is transmitted by electrical signal, reference signal 21, in either digital or analog format, preferably in digital format, to electronic processor 27. A reference signal, an alternative reference signal to reference signal 21, may also be generated by an optical pick off means and detector (not shown in figures) by splitting off a portion of beam 9 with a nonpolarizing beam splitter, mixing the portion of the beam 9 that is split off, and detecting the mixed portion to produce an alternative heterodyne reference signal.

Referring again to FIG. 1f, the measured phases $\Phi_1$ and $\Phi_2$ are next subtracted one from the other in electronic processor 1277, preferably by digital processes, to create the phase $\Phi$. Formally, $$\Phi = (\Phi_2 - \Phi_1), \tag{15}$$

or $$\Phi = pk_1(n_2 L_2 - n_1 L_1) + (\zeta_2 - \zeta_1) + [\Lambda_2(\Phi_2, \phi) - \Lambda_2(\Phi_1)] + \phi. \tag{16}$$

Note that the effects of turbulence on the refractive indices of the gas in the measuring paths substantially cancel out in $\Phi$ as well as the effects of Doppler shifts produced by translations of retroreflector 92. The turbulence effects on the refractive index of the gas in the measuring paths cancel out in $\Phi$ because the measurement beam components of beams 41 and 43 are both derived from the same beam 33.

The nonlinearity $\Lambda_i$ can in general be expressed in terms of cyclic nonlinearity $\psi_i$ and a noncyclic nonlinearity $\eta_i$, i.e.

$$\Lambda_i = \psi_i + \eta_i, \; i = 1 \text{ and } 2. \tag{17}$$

For the remainder of the application the non-cyclic nonlinearity will be ignored.

A spectral representation of the cyclic nonlinearity $\psi_i$, in terms of $\Phi_1$ and $\Phi_2$, can be based on different families of orthogonal polynomials and functions. Two examples are a series comprising Fourier sine and cosine functions and a series comprising Chebyshev polynomial functions. Without departing from the spirit and scope of the present invention, the Fourier sine and cosine series spectral representation of $\psi_i$ will be used in the subsequent embodiments and in the first embodiment is expressed as:

$$\psi_1(\varphi_1) = C_{1,0}(\varphi_1) + \psi_{1,1}(\varphi_1), \tag{18}$$

$$\psi_2(\varphi_2, \phi) = C_{2,0}(\varphi_2) + \sum_{q=1} C_{2q}(\varphi_2)\cos q\phi + \sum_{q=1} S_{2q}(\varphi_2)\sin q\phi,$$

with $$\psi_{i,1}(\varphi_i) = \sum_{q=1} C_{iq}(\varphi_i) = \sum_{r=1}\left(\sum_{q=1} a_{iqr}\right)\cos r\varphi_i + \sum_{r=1}\left(\sum_{q=1} b_{iqr}\right)\sin r\varphi_i, \tag{19}$$

$i = 1$ and $2$ $$C_{iq}(\varphi_i) = \left(\sum_{r=1} a_{iqr}\cos r\varphi_i + \sum_{r=1} b_{iqr}\sin r\varphi_i\right), \begin{cases} q = 0, 1, 2, \ldots, \\ i = 1 \text{ and } 2, \end{cases} \tag{20}$$

$$S_{iq}(\varphi_i) = \left(\sum_{r=1} a'_{iqr}\cos r\varphi_i + \sum_{r=1} b'_{iqr}\sin r\varphi_i\right), \begin{cases} q = 0, 1, 2, \ldots, \\ i = 1 \text{ and } 2. \end{cases} \tag{21}$$

It is of interest to note that $\psi_{2,1}(\Phi_2) = \psi_2(\Phi_2, 0) - C_{2,0}(\Phi_2)$.

The $C_{iq}$ and $S_{iq}$ are written in Eqs. (20) and (21) in terms of cosine and sine series terms with arguments of the series terms being harmonics of $\Phi_i$. For some configurations of interferometers, in particular multiple pass interferometers, it is possible for a system comprising a source, interferometer, and detector to generate cyclic nonlinearities that are subharmonics of $\Phi_i$. Should subharmonic cyclic errors be present in a system, Eqs. (20) and (21) are augmented so as to include cosine and sine series terms with arguments that are subharmonics $\Phi_i$. The subsequent description of procedures to determine the coefficients in the cosine and sine series will be in terms of the series representations given by Eqs. (18), (19), (20), and (21) without departing from the spirit and scope of the present invention.

It is possible for a system comprising a source, interferometer, detector, and digital signal processing to generate cyclic nonlinearities that are neither subharmonics or harmonics of $\Phi_i$. The non-subharmonic, nonharmonic cyclic errors are produced for example by aliasing in the digital signal processing and have frequencies which are aliases of harmonics and subharmonics of $\Phi_i$. Should non-subharmonic, nonharmonic cyclic errors be present in a system, Eqs. (20) and (21) are augmented so as to include cosine and sine series terms with arguments that are the appropriate aliases of harmonics and/or subharmonics of $\Phi_i$. The subsequent description of procedures to determine the coefficients in the cosine and sine series will be in terms of the series representations given by Eqs. (18), (19), (20), and (21) without departing from the spirit and scope of the present invention.

The spectral representation given by Eqs. (20) and (21) is in general valid for an interferometer where the phase of the heterodyne signal is changing at substantially a constant rate. The coefficients of the spectral representation given by Eqs. (20) and (21) will in general depend on the rate of change of the phase as a result, for example, of the properties of group delay experienced by the heterodyne signal. Group delay, often called envelope delay, describes the delay of a packet of frequencies and the group delay at a particular frequency is defined as the negative of the slope of the phase curve at the particular frequency [see H. J. Blinchikoff and A. I. Zverev, *Filtering in the Time and Frequency Domains*, Section 2.6, 1976 (Wiley, New York)].

To describe the effect of cyclic errors for the interferometer wherein the phase of the heterodyne signal is changing at two or more different substantially constant rates, coefficients of the spectral representation are obtained for each of the different substantially constant rates. Coefficients of the spectral representation corresponding to the set of two or more different substantially constant rates of change of the heterodyne phase may alternatively be effectively represented in terms of a function of the rate of change of phase of heterodyne signal. The function may need include only the first few terms of a simple power series in the rate of change or may comprise orthogonal functions or polynomials.

The cyclic error terms $C_{1,0}$ and $C_{2,0}$ are principally the result of cyclic error generation by an interferometer, e.g., spurious internal multiple reflections of beams in the measurement and/or reference legs and/or departures of quarter wave phase retardation plates and polarizing beam splitters from desired properties. The remaining cyclic terms $C_{iq}$ and $S_{iq}$ for i=1 and 2 q≧1 are generally effected by polarization and frequency mixing from a number of different sources operating independently or in combination, e.g., polarization and frequency mixing in the interferometer source, misalignment of the interferometer source with respect to the interferometer, departures from desired properties of a polarizing beam splitter used to separate reference and measurement beams based on relative states of polarization, and alignment properties of the detector units including mixers and analyzers with respect to the interferometer.

The magnitude of cyclic errors $C_{1,0}$ and $C_{2,0}$ can be substantially the same and the magnitude of cyclic errors $\psi_{1,1}$ and $\psi_{2,1}$ defined by Eqs. (19) can be substantially the same. However, the magnitude of cyclic errors $C_{1,0}$ and $C_{2,0}$ are generally not equal and the magnitude of cyclic errors $\psi_{1,1}$ and $\psi_{2,1}$ are generally not equal because of departures of reflection and transmission properties of the beam splitters 63A, 63B, and 63E from desired properties.

It will be evident to those skilled in the art that the noncyclic nonlinearity $\eta_i$ can be omitted in subsequent descriptions of embodiments of the present invention without departing from the scope and spirit of the invention.

In a next step, $\Phi$ is measured as a function $\Phi_1$ and $\Phi_2$ for a set of values for $\phi$, the required number of different values of $\phi$ being dependent on the complexity of $\psi_1$ and $\psi_2$ and the relative precision required for the measured values of $\psi_1$ and $\psi_2$. The set of values of $\phi$ introduced by variable phase shifter 81 is controlled by electronic signal 30 from computer 29. From the measured values of $\Phi$, measured values of the quantity $$\psi_2(\Phi_2, \phi) - \psi_2(\Phi_2, \phi_0) + (\phi - \phi_0) \tag{22}$$

are obtained from $[\Phi(\Phi_1,\phi)-\Phi(\Phi_1,\phi_0)]$ where $\phi_0$ is an initial value used for $\phi$.

An expression for $\psi_2(\Phi_2,\phi)-\psi_2(\Phi_2,\phi_0)$ can be written, according to Eqs. (18), as $$\psi_2(\varphi_2, \phi) - \psi_2(\varphi_2, \phi_0) = \sum_{q=1} C_{2,q}(\varphi_2)(\cos q\phi - \cos q\phi_0) + \sum_{q=1} S_{2,q}(\varphi_2)(\sin q\phi - \sin q\phi_0). \tag{23}$$

A procedure is described for the determination of certain of the Fourier coefficients listed in Eqs. (20) and (21) for an end use application requiring compensation for cyclic errors in $\Phi_1$ but not in $\Phi_2$. A second procedure is described for the determination of certain other of the Fourier coefficients listed in Eqs. (20) and (21) for an end use application requiring compensation for cyclic errors in both $\Phi_1$ and $\Phi_2$. These two procedures are presented as examples of two possible procedures and the particular descriptions of two procedures do not limit by way of examples the scope of the present invention.

The second of the two procedures is described first wherein compensation for cyclic errors in part in both $\Phi_1$ and $\Phi_2$ is accomplished. For the second procedure, the Fourier coefficients $a_{2qr}$, $b_{2qr}$, $a'_{2qr}$, and $b'_{2qr}$, q≧1 and r≧1, can be determined as a function of q and r by iterative procedures for the magnitude of cyclic errors typically found in interferometers. For conditions where the cyclic nonlinearity term $\psi_2 \leq 1/10$ corresponding to an error in position of ≦5 nm in a single pass interferometer with $\lambda$=633 nm, the Fourier coefficients representing $[\psi_2(\Phi_2,\phi)-\psi_2(\Phi_2,\phi_0)]$ can be obtained from the measured quantity $\Phi$ by an efficient iterative process. For a situation where the cyclic nonlinearity term $\psi_2 \sim 1$, the Fourier coefficients in $[\psi_2(\Phi_2,\phi)-\psi_2(\Phi_2,\phi_0)]$ can be obtained by generation of a series of simultaneous transcendental equations of the Fourier coefficients. The iterative procedure for determination of the Fourier coefficients will be described herein, the condition $\psi_2 \leq 1/10$ generally being met in interferometry systems and the iterative procedure being a simpler procedure.

The first step in the iterative process is to assume that the cyclic nonlinearities in $\Phi_2$ are negligible and compute the Fourier coefficients in $[\psi_2(\Phi_2,\phi)-\psi_2(\Phi_2,\phi_0)]$, using $\Phi_2$ as the variable of integration. The second step of the iterative process is to use the Fourier coefficients in $[\psi_2(\Phi_2,\phi)-\psi_2(\Phi_2,\phi_0)]$ obtained in the first step of the iterative process to generate a first iterated $\Phi_2$ corrected for the first iterated cyclic nonlinearities in $[\psi_2(\Phi_2,\phi)-\psi_2(\Phi_2,\phi_0)]$ and then compute the second iteration values for the Fourier coefficients in $[\psi_2(\Phi_2,\phi)-\psi_2(\Phi_2,\phi_0)]$ using the first iterated $\Phi_2$ as the variable of integration. The iterative process is repeated until the sequence of iterated values for the Fourier coefficients in $[\psi_2(\Phi_2,\phi)-\psi_2(\Phi_2,\phi_0)]$ in $\Phi_2$ have converged to required relative precisions. With $\psi_2 \leq 1/10$, the number of steps in the iterative process may not require more than one or two.

The relative precision to which the cyclic errors $[\psi_2(\Phi_2,\phi)-C_{2,0}(\Phi_2)]$ can be determined by the first embodiment will have a magnitude of the order of magnitude of the cyclic error term $C_{2,0}(\Phi_2)/2$ expressed in radians, cyclic error term $C_{2,0}(\Phi_2)$ not being determined in the procedure used to evaluated $[\psi_2(\Phi_2,\phi)-C_{2,0}(\Phi_2)]$ combined with the absolute precision, expressed in radians, to which $\phi$ is known. The residual cyclic errors from $[\psi_2(\Phi_2,\phi)-C_{2,0}(\Phi_2)]$ in $\Phi_2$ after correction for $[\psi_2(\Phi_2,\phi)-C_{2,0}(\Phi_2)]$ may be described as entering as a series of second order effects, a second order effect being derived from a product of two first order effects, the first order effects being $[\psi_2(\Phi_2,\phi)-C_{2,0}(\Phi_2)]$, $C_{2,0}(\Phi_2)$, and the absolute precision to which $\phi$ is known.

The cyclic errors represented by $\psi_{1,1}(\Phi_1)$ are next determined to a relative precision substantially the same as the relative precision to which $[\psi_2(\Phi_2,\phi)-C_{2,0}(\Phi_2)]$ is determined in previously described steps of the first embodiment. The next step in the cyclic error evaluation procedure for addressing cyclic errors in $\Phi_1$ uses $\Phi_2-\phi$ corrected for cyclic errors $[\psi_2(\Phi_2,\phi)-C_{2,0}(\Phi_2)]$, i.e., $\{\Phi_2-[\psi_2(\Phi_2,\phi)-C_{2,0}(\Phi_2)]-\phi\}$, as a variable of integration in a Fourier analysis of $\{-\Phi+[\psi_2(\Phi_2,\phi)-C_{2,0}(\Phi_2)]+\phi\}$.

The quantity $\{-\Phi+[\psi_2(\Phi_2,\phi)-C_{2,0}(\Phi_2)]+\phi\}$ is to a good approximation $\psi_{1,1}(\Phi_1)$ within a constant as evident from the following expression based on Eqs. (16) and (18);

$$\{-\Phi+[\psi_2(\Phi_2,\phi)-C_{2,0}(\Phi_2)]+\phi\}=\psi_{1,1}(\Phi_1)+(\zeta_1-\zeta_2)+[C_{1,0}(\Phi_1)-C_{2,0}(\Phi_2)], \quad (24)$$

where the term $pk_1(n_{1H L1}-n_2L_2)$ and the $\eta_i$ terms have been omitted for reasons previously described. The offset term $(\zeta_1-\zeta_2)$ is a constant and generally, $$|C_{1,0}(\Phi_1)-C_{2,0}(\Phi_2)| \leq |C_{1,0}(\Phi_1)|/10, \quad (25)$$

$C_{1,0}(\Phi_1)$ being approximately equal to $C_{2,0}(\Phi_2)$ and for the beam splitting properties of beam splitter 63A being substantially the same for transmitted and reflected beams, e.g., 50/50.

The Fourier coefficients $$\left[\left(\sum_{q=1} a_{1,qr}\right) + (a_{1,0,r} - a_{2,0,r})\right] \text{ and } \left[\left(\sum_{q=1} b_{1,qr}\right) + (b_{1,0,r} - b_{2,0,r})\right]$$

of $\cos r\Phi_1$ and $\sin r\Phi_1$, respectively, in $\{-\Phi+[\psi_2(\Phi_2,\phi)-C_{2,0}(\Phi_2)]+\phi\}$ can be determined as a function of $r$ by one of several procedures. For the conditions where the cyclic nonlinearity terms $\psi_1 \leq 1/10$ and $\psi_2 \leq 1/10$, the Fourier coefficients $$\left[\left(\sum_{q=1} a_{1,qr}\right) + (a_{1,0,r} - a_{2,0,r})\right] \text{ and } \left[\left(\sum_{q=1} b_{1,qr}\right) + (b_{1,0,r} - b_{2,0,r})\right]$$

for $r \geq 1$ in $\{\psi_{1,1}(\Phi_1)+(\zeta_1-\zeta_2)+[C_{1,0}(\Phi_1)-C_{2,0}(\Phi_{2,0})]\}$, the right hand side of Eq. (24), can be obtained from the quantity $\{-\Phi+[\psi_2(\Phi_2,\phi)-C_{2,0}(\Phi_2)]+\phi\}$ by an iterative process the same as described for the determination of the Fourier coefficients in $[\psi_2(\Phi_2,\phi)-\psi_2(\Phi_2,\phi_0)]$.

The relative precision to which the cyclic errors in $\{\psi_{1,1}(\Phi_1)+[C_{1,0}(\Phi_1)-C_{2,0}(\Phi_{2,0})]\}$ can be determined by the first embodiment will have a magnitude of the order of magnitude of the cyclic error term $C_{2,0}(\Phi_2)/2$ expressed in radians, cyclic error term $C_{2,0}(\Phi_2)$ not being determined in the procedure used to evaluate either $[\psi_2(\Phi_2,\phi)-C_{2,0}(\Phi_2)]$ or $\{\psi_{1,1}(\Phi_1)+[C_{1,0}(\Phi_1)-C_{2,0}(\Phi_{2,0})]\}$, combined with the absolute precision, expressed in radians, to which $\phi$ is known. The residual cyclic errors from $\{\psi_{1,1}(\Phi_1)+[C_{1,0}(\Phi_1)-C_{2,0}(\Phi_{2,0})]\}$ in $\Phi_1$ after correction for $\{\psi_{1,1}(\Phi_1)+[C_{1,0}(\Phi_1)-C_{2,0}(\Phi_{2,0})]\}$ may be described as entering as a series of second order effects, a second order effect being derived from a product of two first order effects, the first order effects being $\{\psi_{1,1}(\Phi_1)+[C_{1,0}(\Phi_1)-C_{2,0}(\Phi_{2,0})]\}$, $C_{2,0}(\Phi_2)$, and the absolute precision to which $\phi$ is known.

The apparatus and method of the first embodiment permits measurement and subsequent correction for certain of the cyclic errors in $\Phi_1$ and $\Phi_2$ to a relative precision determined by the magnitude of $C_{2,0}(\Phi_2)$ and the absolute precision to which $\phi$ is known. As previously noted, the $C_{2,0}(\Phi_2)$ term arises principally from effects associated with the interferometer so that cyclic errors generated in the source and/or beam transport to the interferometer, misalignment of the source with respect to the interferometer, and departures from desired properties of a polarizing beam splitter used to separate reference and measurement beams, the cyclic errors so generated generally being modified by alignment properties of the detector units including mixers and analyzers with respect to the interferometer, can be corrected to a high level of precision, i.e., corrected up to second order effects, the second order effects being products of two first order effects, the first order effects being certain other cyclic errors such as $C_{2,0}(\Phi_2)$ and/or the absolute precision to which $\phi$ is known.

The next procedure to be described is the first of the two procedures wherein compensation in part for cyclic errors in $\Phi_1$ is accomplished without the determination in part of the cyclic errors in $\Phi_2$. The first step in the first procedure is to measure $\Phi_2$ as a function of $\Phi_2$ and a set of values for $\phi$, the required number of different values of $\phi$ being dependent on the complexity of $\psi_1$ and $\psi_2$ and the relative precision required for the determined values of $\psi_1$. The set of values of $\phi$ introduced by variable phase shifter 81 is controlled by electronic signal 30 from computer 29. The next step is to filter $\Phi_2$ by an integral transform so as to eliminate terms with $C_{2,q}(\Phi_2)$ and $S_{2,q}(\Phi_2)$, $q \geq 1$, as factors in the representation of $\psi_2$ and therefore in the representation of $\Phi_2$.

The integral transform $\Phi_2^I$ of $\Phi_2$ for stationary values for $\psi_2$ is given by the formula $$\tilde{\varphi}_2^I = \frac{\int \tilde{\varphi}_2 d\phi}{\int d\phi} \quad (26)$$

where the range of integration over $\phi$ is modulo $2\pi$. For an application where the series representation for $\psi_2$ given by Eq. (18) has been augmented to include terms with arguments that are subharmonics of $\Phi_2$, the integration range over $\phi$ in Eq. (26) will be modified from modulo $2\pi$ to a range such that integration of the subharmonic terms is zero. A similar procedure would be used for an application where the series representation for $\psi_2$ given by Eq. (18) has been augmented to include terms with arguments that correspond to non-subharmonics and/or nonharmonics of $\Phi_2$ generated for example by aliasing. The integral transform in Eq. (26) can be generalized to include non-stationary values for $\Phi_2$ such as $\Phi_2$ changing a constant rate, constant to a relative precision sufficient to meet requirements of an end use application where for example air turbulence in the measurement path does not present a limitation.

The integral filter in Eq. (26) will, in practice, generally be implemented as a digital filter by a digital signal processor [see, e.g., J. G. Proakis and D. G. Manolakis, *DIGITAL SIGNAL PROCESSING: Principles, Algorithms, and Applications,* Second Edition, (Macmillan, New York) 1992].

The filtered $\Phi_2$, $\Phi_2^I$, is equivalent to the iterated value obtained for $\Phi_2$ in the second procedure described for determination of the cyclic errors in part in $\Phi_1$ and $\Phi_2$. The remaining description of the properties of $\Phi_2^I$ is the same as corresponding portions of the description given for the iterated $\Phi_2$. The remaining steps in the determination of the cyclic errors in part in $\Phi_1$ is the same as corresponding steps in the determination of the cyclic errors in part in $\Phi_1$ of the second procedure, $\Phi_2^I$ being used in place of iterated value of $\Phi_2$.

The remaining description of the first procedure for the determination of the cyclic errors in part in $\Phi_1$ is the same as corresponding portions of the description given for the determination of the cyclic errors in part in $\Phi_1$ and $\Phi_2$ of the second procedure.

An important advantage of the first embodiment is with respect to required absolute precision to which $\phi$ must be known to meet requirements of an end use application, a given known absolute precision for $\phi$ introducing errors as a factor in a second order effect in phase measurements corrected for cyclic errors by the first embodiment.

Nonlinearity in generation and in electronic processing of the heterodyne signals can also be a source of cyclic errors. Certain of the cyclic errors due to nonlinearity in the generation and in the electronic processing of a heterodyne signal will have heterodyne phases the same as harmonics of the heterodyne phase of a desired heterodyne signal and thus contribute to cyclic errors in the measured phase of the desired heterodyne signal. The certain of the cyclic errors due to nonlinearity in the generation and in the signal processing will be measured and monitored by the first embodiment the same as described for cyclic errors generated by other cited mechanisms.

An important advantage of the first embodiment is the determination of cyclic errors in part in situ without modifying the measurement path corresponding to $\Phi_1$. A further advantage of the first embodiment, when using the second procedure for determination of cyclic errors in part in $\Phi_1$ and $\Phi_2$, is that the cyclic errors can be measured during normal operation of a distance measuring interferometer without interfering with the normal operation of distance measuring. The further advantage may be stated accordingly as the measurement and monitoring of the cyclic errors in part in $\Phi_1$ in situ without modifying the measurement path corresponding to $\Phi_1$ or without interfering with normal operation of a distance measuring interferometer.

Another advantage of the first embodiment is that the function of measuring and/or monitoring cyclic errors in part in $\Phi_1$ and $\Phi_2$ remains operative even when cyclic errors in $\Phi_1$ and $\Phi_2$ are slowly varying functions of time and/or of either $\Phi_1$ or $\Phi_2$, e.g., the cyclic errors depend upon the location of the measurement object 92.

It will be evident to those skilled in the art that variable phase shifter 81 can alternatively be relocated in FIG. 1a so as to introduce a phase shift $\phi$ into the first portion of beam 33 reflected by beam splitter 63A instead of into the second portion of beam 33 transmitted by beam splitter 63A without departing from the scope and spirit of the present invention. The apparatus and method of the first group of embodiments would permit for the alternative location of variable phase shifter 81, the measurement and subsequent correction for cyclic errors, excluding $C_{1,0}(\Phi_1)$ and the effects of $C_{1,0}(\Phi_1)$, in $\Phi_1$ and $\Phi_2$ to a relative precision determined by the magnitude of $C_{1,0}(\Phi_1)$. The cyclic error terms $C_{1,0}(\Phi_1)$ and $C_{2,0}(\Phi_2)$ can as previously noted be substantially the same so that the function of the first embodiment is substantially the same for either of the two cited locations of variable phase shifter 81.

The remaining description of the first embodiment with the alternative location of variable phase shifter 81 is the same as corresponding portions of the description given for the first embodiment.

To those skilled in the art, it will be apparent that the measured quantity $\Phi$ is insensitive to effects of gas in the measuring path of the interferometer, particularly turbulent effects, the paths of the two beams used to generate $\Phi$ being substantially coextensive. This latter feature of the invention makes it possible to obtain the information about cyclic errors with reduced systematic errors that are potentially present as a result of systematic gas flow patterns in a measuring path, i.e., it is not necessary to assume that averaged gas flow patterns in the measurement path produces no systematic errors. This latter feature of the present invention also makes it possible to obtain information about certain of the cyclic errors with reduced statistical errors without having to average over a large number of independent measurements of $\Phi$.

Figure 2A:
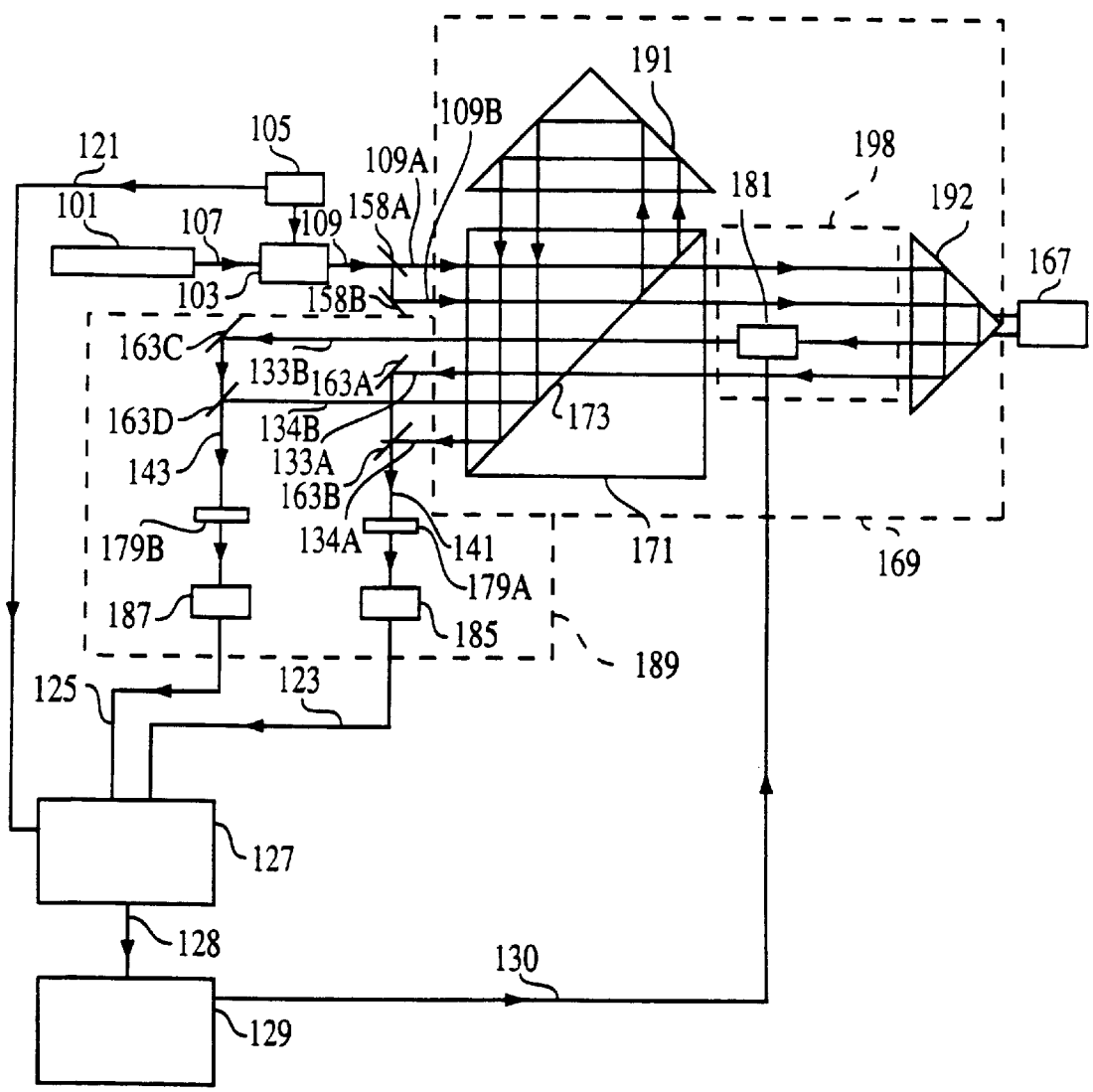
FIGS. 2a and 2c are schematic diagrams of additional embodiments of an interferometry system that characterizes and corrects cyclic errors by using a phase shifter.

FIG. 2a depicts in schematic form in accordance with the preferred apparatus and method of the second embodiment of the present invention. The second embodiment is from the first group of embodiments. Interferometer 169 depicted in FIG. 2a comprises a polarizing, heterodyne, single pass interferometer, light beam 109, and source of light beam 109. The description of light beam 109 and source of light beam 109 is the same as corresponding portions of the description given for light beam 9 and source of light beam 9 of the first embodiment.

Referring to FIG. 2a, a first portion of beam 109 is transmitted by polarizing beam splitter 158A as input beam 109A and a second portion of beam 109 is reflected by polarizing beamsplitter 158A and by mirror 158B to form input beam 109B. Input beams 109A and 109B enter interferometer 169. Retroreflectors 191 and 192 and polarizing beam splitter 171 of the second embodiment perform like operations as retroreflectors 91 and 92 and polarizing beam splitter 71, respectively, of the first embodiment.

The description of the propagation of beam 109A through interferometer 169 to form output measurement and reference beams 133A and 134A, respectively, is the same as corresponding portions of the description given for the propagation of beam 9 through interferometer 69 of the first embodiment to form output measurement and reference beams 33 and 34, respectively.

The description of the propagation of beam 109B through interferometer 169 to form output measurement and reference beams 133B and 134B, respectively, is the same as corresponding portions of the description given for the propagation of beam 9 through interferometer 69 of the first embodiment to form output measurement and reference beams 33 and 34, respectively, except with respect to the variable phase shifter 181.

The description of variable phase shifter 181 of the second embodiment is the same as corresponding portions of the description given for variable phase shifter 81 of the first embodiment. In the second embodiment, variable phase shifter 181 introduces a phase shift $\phi$ in the progenitor of output measurement beam 133B. Interferometer 169 introduces relative phase shift $\Phi_3$ between beams 133A and 134A and relative phase shift $\Phi_4+\phi$ between beams 133B and 134B.

In a next step as shown in FIG. 2a, beams 133A, 134A, 133B, and 134B exit interferometer 169 and enter detector system 189. In detector system 189, beam 133A is reflected by mirror 163A and a portion thereof transmitted by polarizing beam splitter 163B to form a first component of phase shifted beam 141 and a portion of beam 134A is reflected by polarizing beam splitter 163B to form a second component of phase shifted beam 141. In addition, beam 133B is reflected by mirror 163C and a portion thereof transmitted by polarizing beam splitter 163D to form a first component of phase shifted beam 143 and a portion of beam 134B is reflected by polarizing beam splitter 163D to form a second component of phase shifted beam 143.

Phase shifted beams 141 and 143 pass through polarizers 179A and 179B, respectively, and impinge upon photodetectors 185 and 187, respectively, resulting in electrical interference signals, heterodyne signals $s_3$ and $s_4$, respectively, preferably by photoelectric detection. Polarizers 179A and 179B are oriented so as to mix polarization components of phase shifted beam 141 and the polarization components of phase shifted beam 143, respectively. The signals $s_3$ and $s_4$ have the form $$s_i = A_i(t)\cos[\alpha_i(t)], \ i=3 \text{ and } 4, \quad (27)$$

where the time-dependent arguments $\alpha_i(t)$ are given by $$\alpha_3(t)=2\pi f_1 t+\Phi_3+\zeta_3+\Lambda_3, \ \alpha_4(t)=2\pi f_1 t+\Phi_4+\zeta_4+\Lambda_4+\phi, \quad (28)$$

with phase offsets $\zeta_3$ and $\zeta_4$ comprising all contributions to $\alpha_3$ and $\alpha_4$, respectively, that are not related or associated with the optical paths of measurement path 198 or reference paths and excluding nonlinear effects that are represented by $\Lambda_3$ and $\Lambda_4$, respectively, and $\phi$ representing the phase shift produced by phase shifter 181. The description of the representations of $s_3$ and $s_4$ by Eq. (27) is the same as the description given of the corresponding representations of $s_1$ and $s_2$ of the first embodiment by Eq. (9). Heterodyne signals $s_3$ and $s_4$ are transmitted to electronic processor 127 for analysis as electronic signals 123 and 125, respectively, in either digital or analog format, preferably in digital format.

Figure 2B:
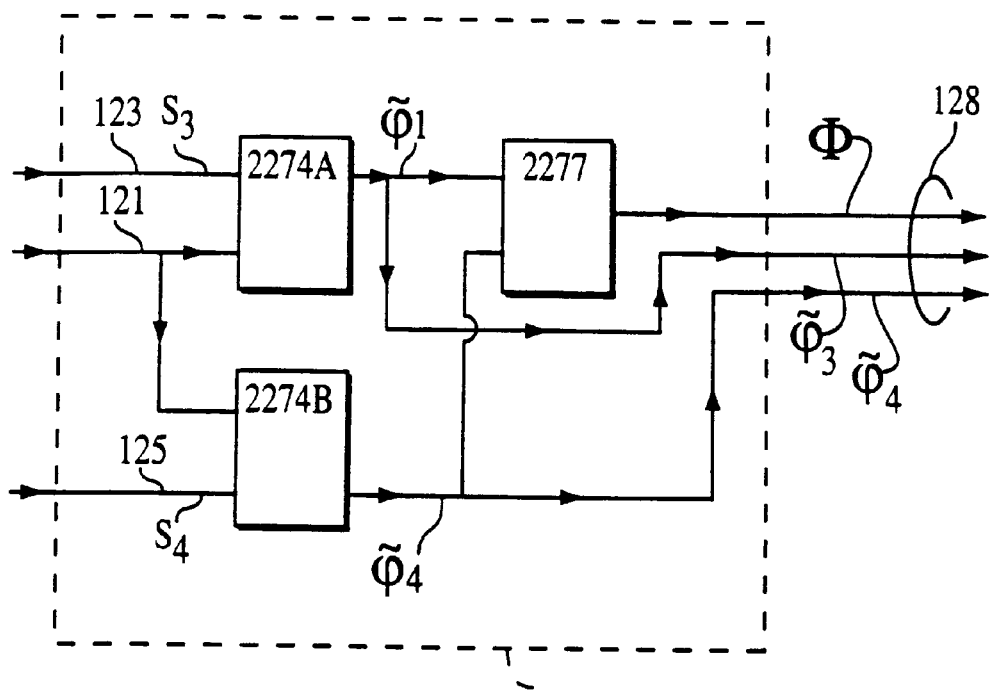
FIG. 2b is a schematic of an electronic circuit for use with the systems of FIGS. 2a and 2c.

Referring now to FIG. 2b, electronic processor 127 comprises electronic processors 2274A, 2274B, and 2277 which perform like functions as electronic processors 1274A, 1274B, and 1277 of the first embodiment. The description of the steps in processing heterodyne signals $s_3$ and $s_4$ by electronic processor 127 for phase $\Phi$ [subsequently defined by Eq. (30)] is the same as corresponding portions of description given for steps in processing heterodyne signals $s_1$ and $s_2$, respectively, of the first embodiment by electronic processor 27 for phase $\Phi$ [defined by Eq. (15)]. Electronic processors 2274A and 2274B determine the measured phases $$\Phi_3=\Phi_3+\zeta_3+\Lambda_3(\Phi_3), \ \Phi_4=\Phi_4+\zeta_4+\Lambda_4(\Phi_4,\phi)+\phi. \quad (29)$$

Electronic processor 1277 subtracts $\Phi_3$ from $\Phi_4$ to form $\Phi$. Formally, $$\Phi=(\Phi_4-\Phi_3) \quad (30)$$

or $$\Phi=pk(n_4L_4-n_3L_3)+(\zeta_4-\zeta_3)+[\Lambda_4(\Phi_4,\phi)-\Lambda_3(\Phi_3)]+\phi. \quad (31)$$

Note that the effects of Doppler shifts produced by the translation of retroreflector 192 cancel out in $\Phi$.

The nonlinearity $\Lambda_i$ is expressed in terms of cyclic nonlinearity $\psi_i$ and a non-cyclic nonlinearity $\eta_i$, i.e.

$$\Lambda_i = \psi_i + \eta_i, \ i=3 \text{ and } 4, \quad (32)$$

where $\psi_i$ for i=3 and 4 can to a high order of accuracy be written as $$\psi_3(\varphi_3) = \sum_{q=1} C_{3,q}(\varphi_3), \quad (33)$$

$$\psi_4(\varphi_4,\phi) = \sum_{q=1} C_{4,q}(\varphi_4)\cos q\phi + \sum_{q=1} S_{4,q}(\varphi_4)\sin q\phi$$

with $$\psi_{i,1}(\varphi_i) = \sum_{q=1} C_{iq}(\varphi_i) = \sum_{r=1}\left(\sum_{q=1} a_{iqr}\right)\cos r\varphi_i + \sum_{r=1}\left(\sum_{q=1} b_{iqr}\right)\sin r\varphi_i, \quad (34)$$

$i$ = 3 and 4

$$C_{iq}(\varphi_i) = \left(\sum_{r=1} a_{iqr}\cos r\varphi_i + \sum_{r=1} b_{iqr}\sin r\varphi_i\right), \ \begin{cases}q=1,2,\ldots, \\ i=3 \text{ and } 4,\end{cases} \quad (35)$$

$$S_{iq}(\varphi_i) = \left(\sum_{r=1} a'_{iqr}\cos r\varphi_j + \sum_{r=1} b'_{iqr}\sin r\varphi_i\right), \ \begin{cases}q=1,2,\ldots, \\ i=3 \text{ and } 4.\end{cases} \quad (36)$$

The $C_{iq}$ and $S_{iq}$ are written in Eqs. (35) and (36) in terms of cosine and sine series terms with arguments of the series terms being harmonics of $\Phi_i$. For some configurations of interferometers, in particular multiple pass interferometers, it is possible for a system comprising a source, interferometer, and detector to generate cyclic nonlinearities that are subharmonics of $\Phi_i$ or aliases of harmonics and/or subharmonics of $\Phi_i$. Should subharmonic, aliases of harmonics, and/or aliases of subharmonics type cyclic errors be present in the system, Eqs. (35) and (36) are augmented so as to include cosine and sine series terms with arguments that are subharmonics, aliases of harmonics, and/or aliases of subharmonics of $\Phi_i$ as well as subharmonics, aliases of harmonics, and/or aliases of subharmonics of $\phi$. The subsequent description of procedures the determine the coefficients in the cosine and sine series will be in terms of the series representations given by Eqs. (33), (34), (35), and (36) without departing from the spirit and scope of the present invention.

The difference in the structure of the series representations of Eqs. (18), (19), (20), and (21) of the first embodiment and the structure of the series representations of Eqs. (33), (34), (35), and (36) of the second embodiment is significant. The difference in structures is significant because as will be shown, substantially all of the cyclic errors present in the second embodiment can be measured and monitored in contrast to the situation present in the first embodiment wherein the cyclic error terms $C_{1,0}$ and $C_{2,0}$ can not be measured and monitored as described herein.

The difference in structure arises because variable phase shifter 181 in the second embodiment is located in the measurement path 198 in between beam splitter 171 and retroreflector 192 whereas in the first embodiment, variable phase shifter 81 is located external to interferometer 69. As an example of the effect of the relative locations of variable phase shifters 181 and 81, consider the impact of the respective locations of the variable phase shifters on spurious beams passing along the measurement paths of interferometers 169 and 69, spurious beams being generated by spurious internal multiple reflections. Those spurious beams leading to components of the output measurement beams that have made multiple passes to the retroreflectors will experience multiple phase shifts through variable phase shifter 181 of the second embodiment in comparison to only a single pass through the variable phase shifter 81 of the first embodiment.

The magnitude of cyclic errors $C_{3,q}$ and $C_{4,q}$ $q\geq 1$, can be substantially the same. However, the magnitude of cyclic errors $C_{3,q}$ and $C_{4,q}$, $q\geq 1$, are generally not equal because of departures of reflection and transmission properties of the beam splitters 158A, 158B, 163B, 163D, and 173 from desired properties.

Noncyclic nonlinearity $\eta_i$ will be omitted in subsequent description of the second embodiment as so indicated in the description of the first embodiment.

In a next step, $\Phi$ is measured as a function $\Phi_3$ and $\Phi_4$ for a set of values for $\phi$, the required number of different values of $\phi$ being dependent on the complexity of $\psi_3$ and $\psi_4$ and the precision required for the measured values of $\psi_3$ and $\psi_4$. The set of values of $\phi$ introduced by variable phase shifter 181 is controlled by electronic signal 130 from computer 129. From the measured values of $\Phi$, measured values of the quantity $$\psi_4(\Phi_4,\phi)-\psi_4(\Phi_4,\phi_0)+(\phi-\phi_0) \tag{37}$$

are obtained from $[\Phi(\Phi_3,\phi)-\Phi(\Phi_3,\phi_0)]$ where $\phi_0$ is an initial value used for $\phi$.

An expression for $\psi_4(\Phi_4,\phi)-\psi_4(\Phi_4,\phi_0)$, according to Eq. (33), can be written as $$\psi_4(\varphi_4,\phi)-\psi_4(\varphi_4,\phi_0) = \sum_{q=1} C_{4,q}(\varphi_4)(\cos q\phi - \cos q\phi_0) + \sum_{q=1} S_{4,q}(\varphi_4)(\sin q\phi - \sin q\phi_0). \tag{38}$$

A procedure is described for the determination of certain of the Fourier coefficients listed in Eqs. (35) and (36) for an end use application requiring compensation for cyclic errors in $\Phi_3$ but not in $\Phi_4$. A second procedure is described for the determination of the Fourier coefficients listed in Eqs. (35) and (36) for an end use application requiring compensation for cyclic errors in both $\Phi_3$ and $\Phi_4$. These two procedures are presented as examples of two possible procedures and the presentation of particular two procedures by way of examples does not limit the scope and spirit of the present invention.

The second of the two procedures is described first wherein compensation for cyclic errors in both $\Phi_3$ and $\Phi_4$ is accomplished. For the second procedure, the Fourier coefficients $a_{4qr}$, $b_{4qr}$, $a'_{4qr}$, and $b'_{4qr}$, $q \geq 1$ and $r \geq 1$, can be determined as a function of q and r by one of several procedures for the magnitude of cyclic errors typically found in interferometers. For conditions where the cyclic nonlinearity term $\psi_4 \leq 1/10$, corresponding to an error in position of $\leq 5$ nm in a single pass interferometer with $\lambda=633$ nm, the Fourier coefficients representing $[\psi_4(\Phi_4,\phi)-\psi_4(\Phi_4,\phi_0)]$ can be obtained from the measured quantity $\Phi$ by an efficient iterative process. For a situation where the cyclic nonlinearity term $\psi_4 \sim 1$, the Fourier coefficients in $[\psi_4(\Phi_4,\phi)-\psi_4(\Phi_4,\phi_0)]$ can be obtained by generation of a series of simultaneous transcendental equations of the Fourier coefficients. The iterative procedure for determination of the Fourier coefficients will be described herein, the iterative process the same as the corresponding iterative process of the second procedure described for the first embodiment, the condition $\psi_4 \leq 1/10$ generally being met in interferometry systems and the iterative procedure being a simpler procedure.

The next step in the cyclic error evaluation procedure addresses the cyclic error $\psi_3$ in $\Phi_3$ using $(\Phi_4-\psi_4-\phi)$ as the variable of integration in a Fourier analysis of $[(\Phi_4-\psi_4)-\phi-\Phi]$, the difference between $\Phi_3$ and $(\Phi_4-\psi_4-\phi)$ being small other than a constant $(\zeta_4-\zeta_3)$ which can be determined. The Fourier coefficients of $\cos r\Phi_3$ and $\sin r\Phi_3$, $$\sum_{q=1} a_{3,qr}, \sum_{q=1} b_{3,qr}, r=1,2,3,\ldots, \tag{39}$$

respectively, can be determined as a function of r by one of several procedures. For the conditions where the cyclic nonlinearity term $\psi_3 \leq 1/10$, a condition generally being met in interferometry systems, the Fourier coefficients in $\psi_3$ can obtained from the measured quantity $[(\Phi_4-\psi_4)-\phi-\Phi]$ by an iterative process the same as the corresponding iterative process described for the second procedure of the first embodiment.

The next procedure to be described is the first of the two procedures wherein compensation for cyclic errors in $\Phi_3$ is accomplished with the effects of cyclic errors in $\Phi_4$ being eliminated by a signal filtering process although the cyclic errors in $\Phi_4$ are not determined. The first step in the first procedure is to measure $\Phi_4$ as a function of $\Phi_4$ and a set of values for $\phi$, the required number of different values of $\phi$ being dependent on the complexity of $\psi_3$ and $\psi_4$ and the relative precision required for the measured values of $\psi_3$. The set of values of $\phi$ introduced by variable phase shifter 181 is controlled by electronic signal 130 from computer 129. The next step is to filter $\Phi_4$ by an integral transform so as to eliminate terms with $C_{4,q}(\Phi_4)$ and $S_{4,q}(\Phi_4)$, $q \geq 1$, as factors in the representation of $\psi_4$ and therefore in the representation of $\Phi_4$. The integral transform $\Phi_4^I$ of $\Phi_4$ for stationary values for $\Phi_4$ is given by the formula $$\tilde{\varphi}_4^I = \frac{\int \tilde{\varphi}_4 d\phi}{\int d\phi} \tag{40}$$

where the range of integration over $\phi$ is modulo $2\pi$. For an application where the series representation for $\psi_4$ given by Eq. (33) has been augmented to include terms with arguments that are subharmonics of $\Phi_4$, the integration range over $\phi$ in Eq. (40) will be modified from modulo $2\pi$ to a range such that integration of the subharmonic terms is zero. A similar procedure would be used for an application where the series representation for $\psi_4$ given by Eq. (33) has been augmented to include terms with arguments that correspond to nonharmonics and/or non-subharmonics of $\Phi_4$ generated for example by aliasing. The integral transform in Eq. (40) can be generalized to include non-stationary values for $\Phi_4$ such as $\Phi_4$ changing a constant rate, constant to a relative precision sufficient to meet requirements of an end use application where for example air turbulence in the measurement path does not present a limitation.

The integral filter in Eq. (40) will, in practice, generally be implemented as a digital filter by a digital signal processor (see, e.g., J. G. Proakis and D. G. Manolakis, ibid.).

The filtered $\Phi_4$, $\Phi_4^I$, is equivalent to the iterated value obtained for $\Phi_4$ in the second procedure described for determination of the cyclic errors in $\Phi_3$ and $\Phi_4$. The remaining description of the properties of $\Phi_4^I$ is the same as corresponding portions of the description given for the iterated $\Phi_4$. The remaining steps in the determination of the cyclic errors in $\Phi_3$ is the same as corresponding steps in the determination of the cyclic errors in $\Phi_3$ of the second procedure, $\Phi_4^I$ being used in place of iterated value of $\Phi_4$.

The remaining description of the first procedure for the determination of the cyclic errors in part in $\Phi_3$ is the same as corresponding portions of the description given for the determination of the cyclic errors in part in $\Phi_3$ and $\Phi_4$ of the second procedure.

The remaining description of the second embodiment of the present invention is the same as corresponding portions of the description given for the first embodiment.

The principal advantage of the second embodiment of the present invention in relation to the first embodiment of the present invention is in the substantially complete determination of the cyclic errors in an interferometer system, the first embodiment of the present invention permitting a determination of a subset of the cyclic errors. However, the second embodiment of the present invention can require significantly more data to obtain a given level of statistical accuracy for the determined cyclic errors as compared to the amount of data required with the first embodiment for a cyclic error determination made with gas in the measurement path.

Figure 2C:
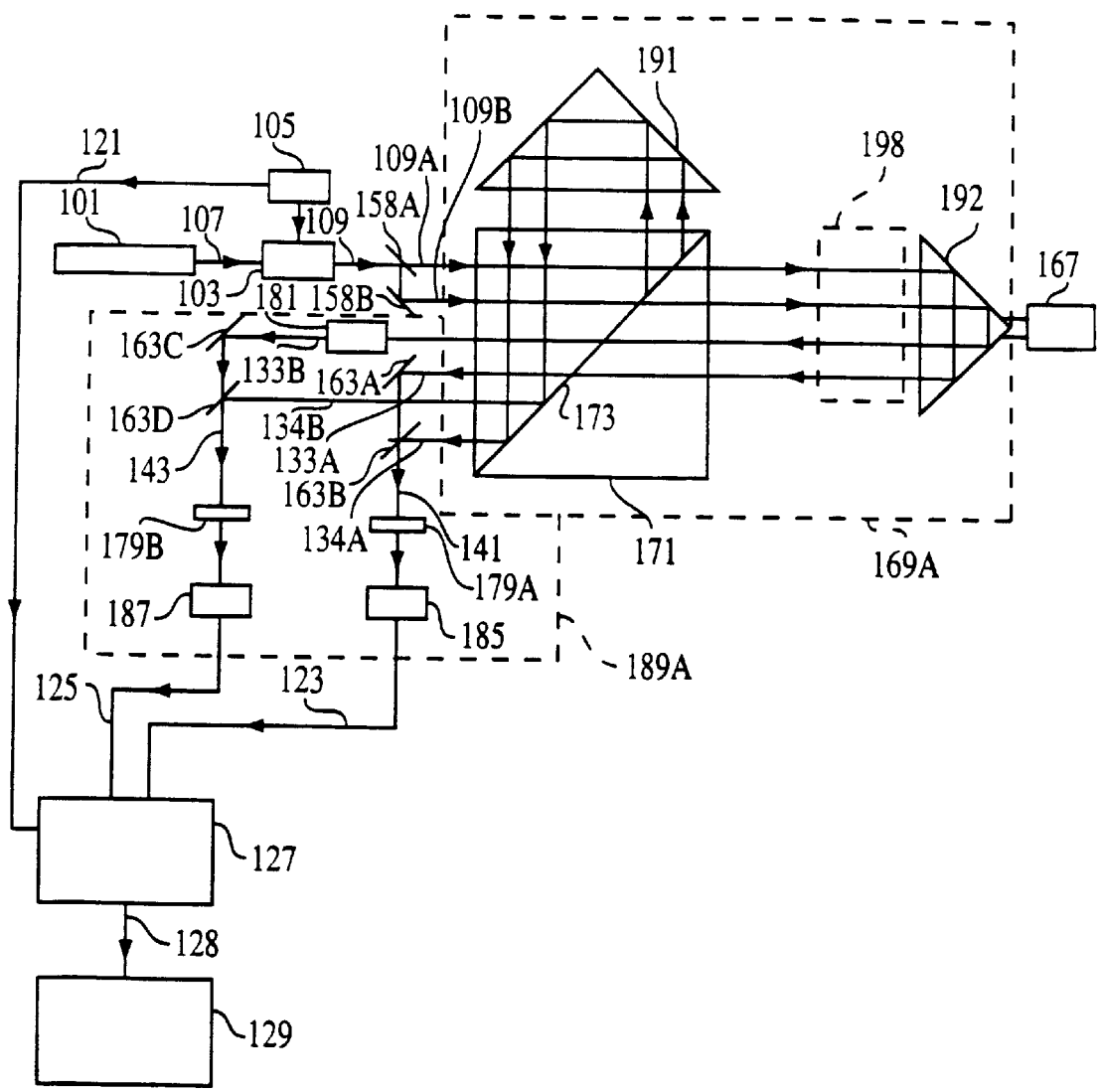

In accordance with a variant of the second embodiment of the present invention, an apparatus and method is described from the first group of embodiments. The variant of the second embodiment is depicted in diagrammatic form in FIG. 2c. The difference between the variant of the second embodiment and the second embodiment is in the location of the variable phase shifter 181. In the variant of the second embodiment, interferometer 169A is the same as interferometer 169 of second embodiment except for variable phase shifter 181 that is located external to interferometer 169A.

The properties of the variant of the second embodiment with respect to cyclic errors in the measured relative phase of measurement and reference output beams are formally equivalent to the properties of the first embodiment with respect to the cyclic errors. The difference in the properties of the second embodiment and the variant of the second embodiment with respect to cyclic errors in the measured relative phase of measurement and reference output beams is a consequence of the respective locations of the variable phase shifter 181 in the second embodiment and the variant of the second embodiment, the location being internal to an interferometer in one case and external to an interferometer in a second case.

The remaining description of the variant of the second embodiment is the same as corresponding portions of the description given for the second embodiment of the present invention.

Figure 3A:
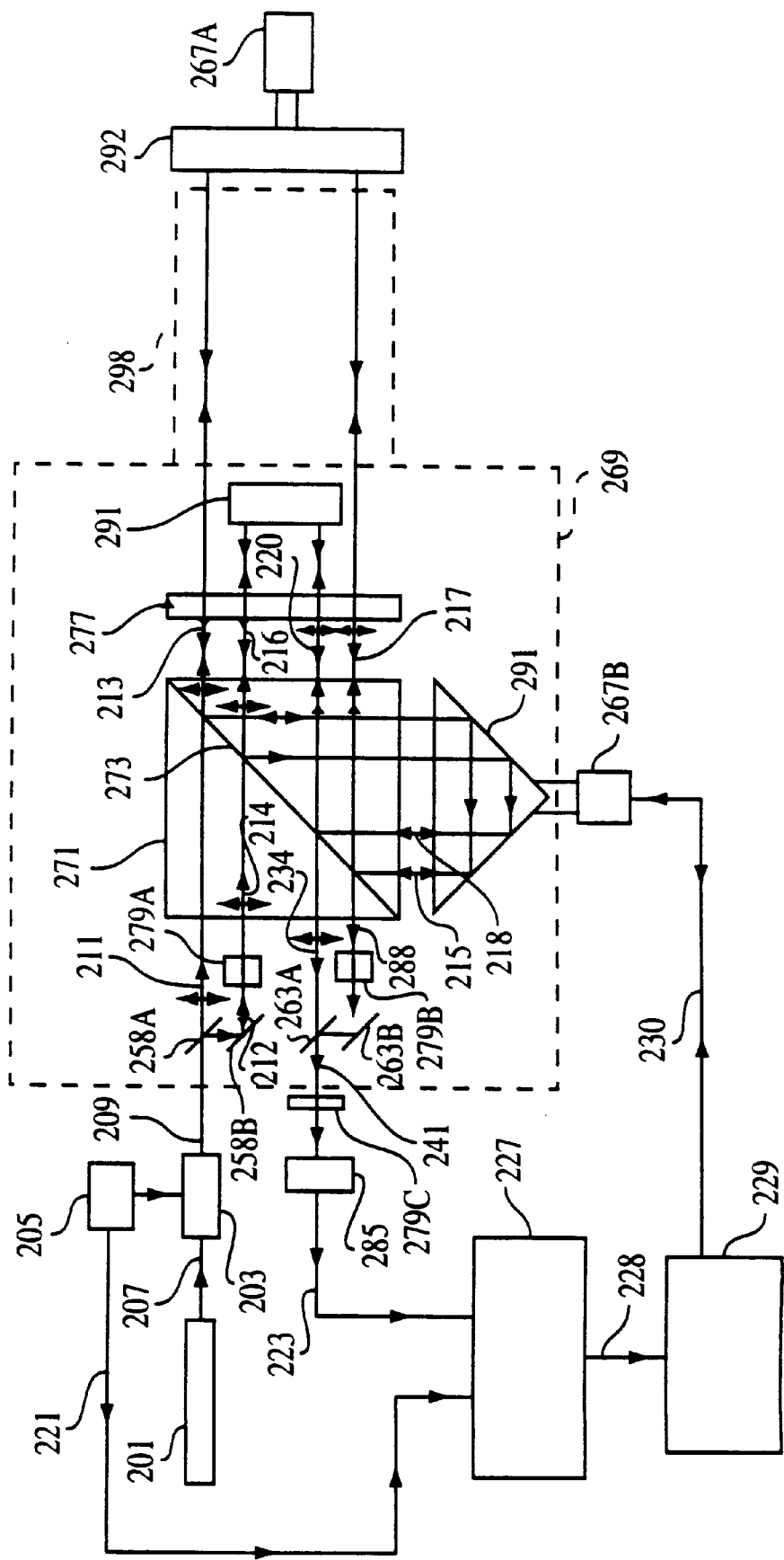
FIG. 3a is a schematic diagram of an additional embodiment of an interferometry system that characterizes and corrects cyclic errors by using a phase shifter.

FIG. 3a depicts in schematic form in accordance with the preferred apparatus and method of the third embodiment of the present invention. The third embodiment is from the first group of embodiments. Interferometer 269 depicted in FIG. 3a comprises a differential plane mirror interferometer, object mirror 292, light beam 209, and source of light beam 209. The description of light beam 209 and source of light beam 209 is the same as corresponding portions of the description given for light beam 9 and source of light beam 9 of the first embodiment.

Referring to FIG. 3a, beam 209 enters interferometer 269. A first portion of beam 209 is transmitted by polarizing beam splitter 258A as input measurement beam 211 polarized in the plane of FIG. 3a. A second portion of beam 209 is reflected by polarizing beamsplitter 258A and reflected by mirror 258B to form input beam 212 polarized orthogonal to the plane of FIG. 3a. Beam 212 is transmitted by half wave phase retardation plate 279A as input reference beam 214 polarized in the plane of FIG. 3a, half wave phase retardation plate 279A being oriented so as to rotate the plane of polarization of beam 212 by 90°.

Measurement beam 211 is transmitted by polarizing interface 273 of polarizing beam splitter 271 and reflected back by object mirror 292 to retrace its path to polarizing beam splitter 271 as beam 213. The measurement beam double passes a quarter wave phase retardation plate 277 so that measurement beam 213 is polarized orthogonal to the plane of FIG. 3a, quarter wave phase retardation plate 277 being located between object mirror 292 and polarizing beam splitter 271 and oriented so that a double pass rotates the plane of polarization of the measurement beam by 90°.

Measurement beam 213 is reflected by polarizing interface 273 and retroreflected by retroreflector 291 as beam 215 polarized perpendicular to the plane of FIG. 3a. Measurement beam 215 is reflected by polarizing interface 273 and reflected back by object mirror 292 to retrace its path to polarizing beam splitter 271 as beam 217. The measurement beam double passes quarter wave phase retardation plate 277 so that measurement beam 217 is polarized in the plane of FIG. 3a. Measurement beam 217 is transmitted by polarizing interface 273 as exit measurement beam 233 polarized in the plane of FIG. 3a.

Reference beam 214 is transmitted by polarizing interface 273 and reflected back by reference mirror 291 to retrace its path to polarizing beam splitter 271 as beam 216. The reference beam double passes quarter wave phase retardation plate 277 so that reference beam 216 is polarized orthogonal the plane of FIG. 3a.

Reference beam 216 is reflected by polarizing interface 273 and retroreflected by retroreflector 291 as beam 218 polarized perpendicular to the plane of FIG. 3a. Reference beam 218 is reflected by polarizing interface 273 and reflected back by reference mirror 291 to retrace its path to polarizing beam splitter 271 as beam 220. The reference beam double passes quarter wave phase retardation plate 277 so that reference beam 220 is polarized in the plane of FIG. 3a. Reference beam 220 is transmitted by polarizing interface 273 as exit reference beam 234 polarized in the plane of FIG. 3a.

Exit reference beam 234 is transmitted by polarizing beam splitter 263A as one component of phase-shifted output beam 241. Exit measurement beam 233 is transmitted by half wave phase retardation plate 279B, reflected by mirror 263B, and reflected by polarizing beam splitter 263A as a second component of phase-shifted output beam 241. Half wave phase retardation plate 279B is oriented so as to rotate the plane of polarization of exit measurement beam 233 by 90°.

In a next step as shown in FIG. 3a, phase-shifted output beam 241 passes through polarizer 279C and impinges upon photodetector 285 resulting in a electrical interference signal, heterodyne signal $s_5$, preferably by photoelectric detection. Polarizer 279C is oriented so as to mix polarization components of phase-shifted output beam 241. Signal $s_5$ has the form $$s_5 = A_5(t) \cos [\alpha_5(t)], \qquad (41)$$

where time-dependent argument $\alpha_5(t)$ is given by $$\alpha_5(t) = 2\pi f_1 t + \Phi_5 + \zeta_5 + \Lambda_5(\Phi_5, \phi) \qquad (42)$$

and $\phi$ is the phase shift introduced into both the measurement and reference beams by translation of retroreflector 291 by translation transducer 267B. The description of the representation of $s_5$ by Eq. (41) is the same as the description given of the corresponding representations of $s_1$ and $s_2$ of the first embodiment by Eq. (9). Heterodyne signal $s_5$ is transmitted to electronic processor 227 for analysis as electronic signal 223 in either digital or analog format, preferably in digital format.

Note that $\phi$ does not appear directly in Eq. (42) for $\alpha_5$ except through $\Lambda_5(\Phi_5, \phi)$ in contrast to measured phases $\Phi_2$ and $\Phi_4$ of the first and second embodiments, respectively. The reason that $\phi$ does not appear directly in Eq. (42) is because translation of retroreflector 291 introduces a phase shift $\phi$ in both measurement and reference beams simultaneously. However, $\phi$ does appear in $\Lambda_5(\Phi_5, \phi)$ though terms which represent cyclic errors arising for example from spurious beams making multiple passes to the object mirror 292, the spurious beams being generated for example by spurious reflections and/or departures of quarter wave phase retardation plates from desired properties.

Figure 3B:
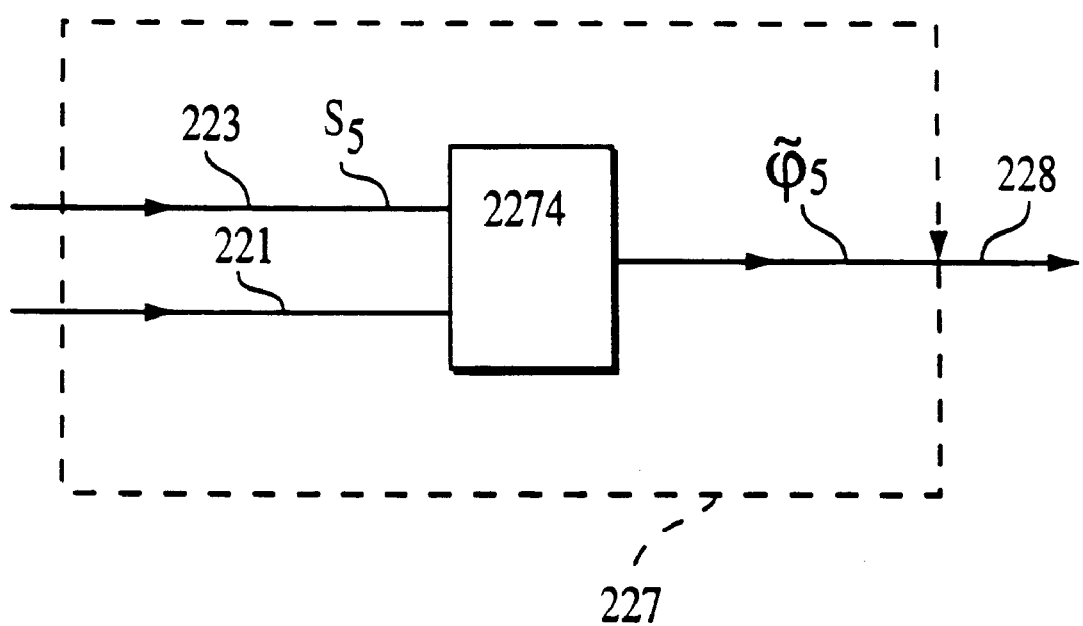

Referring to FIG. 3b, electronic processor 227 comprises electronic processor 2274. Electronic processor 2274 performs like function as electronic processor 1274A of the first embodiment. The description of the step in processing heterodyne signal $s_5$ by electronic processor 227 for phase $\Phi_5$ is the same as corresponding portions of the description given of steps in the processing of heterodyne signal $s_1$ of first embodiment by electronic processor 27. The measured phase $\Phi_5$ is expressed in terms of other quantities according to the equation $$\Phi_5 = \bar{\Phi}_5 + \zeta_5 + \Lambda(\Phi_5, \phi) \quad (43)$$

where phase offset $\zeta_5$ comprises all contributions to $\Phi_5$ that are not related or associated with the optical paths of the measurement path 298 or reference paths and are not related or associated with nonlinear effects and $\Lambda_5$ comprises the nonlinear effects.

The nonlinearity $\Lambda_5$ is expressed in terms of cyclic nonlinearity $\psi_5$ and a non-cyclic nonlinearity $\eta_5$, i.e.

$$\Lambda_5 = \psi_5 + \eta_5. \quad (44)$$

The cyclic nonlinearity $\psi_5$ can to a high order of accuracy be written as $$\psi_5(\varphi_5, \phi) = C_{5,0}(\varphi_5) + \sum_{q=1} C_{5,q}(\varphi_5)\cos q\phi + \sum_{q=1} S_{5,q}(\varphi_5)\sin q\phi \quad (45)$$

with $$C_{5,q}(\varphi_5) = \left(\sum_{r=1} a_{5,qr}\cos r\varphi_5 + \sum_{r=1} b_{5,qr}\sin r\varphi_5\right), q = 0, 1, 2, \ldots, \quad (46)$$

$$S_{5,q}(\varphi_5) = \left(\sum_{r=1} a'_{5,qr}\cos r\varphi_5 + \sum_{r=1} b'_{5,qr}\sin r\varphi_5\right), q = 0, 1, 2, \ldots. \quad (47)$$

The $C_{5,q}$ and $S_{5,q}$ are written in Eqs. (46) and (47) in terms of cosine and sine series terms of harmonics of $\Phi_5$. For some configurations of interferometers, in particular multiple pass interferometers, it is possible for a system comprising a source, interferometer, and detector to generate cyclic nonlinearities that are subharmonics of $\Phi_5$. Should subharmonic cyclic errors be present in the system, Eqs. (46) and (47) are augmented so as to include cosine and sine series terms with arguments that are subharmonics of $\Phi_5$ as well as subharmonics $\phi$. The subsequent description of procedures to determine the coefficients in the cosine and sine series will be in terms of the series representations given by Eqs. (45), (46), and (47) without departing from the spirit and scope of the present invention.

It is possible for a system comprising a source, interferometer, detector, and digital signal processing to generate cyclic nonlinearities that are neither subharmonics or harmonics of $\Phi_i$. The non-subharmonic, nonharmonic cyclic errors are produced for example by aliasing in the digital signal processing and have frequencies which are aliases of harmonics and subharmonics of $\Phi_i$. Should non-subharmonic, nonharmonic cyclic errors be present in a system, Eqs. (46) and (47) are augmented so as to include cosine and sine series terms with arguments that are the appropriate aliases of harmonics and/or subharmonics of $\Phi_i$.

The subsequent description of procedures to determine the coefficients in the cosine and sine series will be in terms of the series representations given by Eqs. (45), (46), and (47) without departing from the spirit and scope of the present invention.

The cyclic error terms $C_{5,q}$ and $S_{5,q}$, $q \geq 1$, are principally the result of cyclic error generation by interferometer 269 and object mirror 292, e.g., spurious internal multiple reflections of beams in the measurement and/or reference legs and/or departures of quarter wave phase retardation plates and polarizing beam splitters from desired properties. The remaining cyclic term $C_{5,0}$ is generally effected by polarization and frequency mixing from a number of different sources operating independently or in combination, e.g., polarization and frequency mixing in the interferometer source, misalignment of the interferometer source with respect to the interferometer, departures from desired properties of a polarizing beam splitter used to separate reference and measurement beams based on relative states of polarization, and alignment properties of the detector units including mixers and analyzers with respect to the interferometer.

The non-cyclic nonlinearity $\eta_i$ will be omitted in subsequent description of the third embodiment as so indicated in the description of the first embodiment.

In a next step, $\Phi_5$ is measured as a function $\phi$ for a set of values for $\Phi_5$, the required number of different values of $\phi$ and $\Phi_5$ being dependent on the complexity of $\psi_5$ and the precision required for the measured values of $\psi_5$. The set of values of $\phi$ introduced by translation of retroreflector 291 by translation transducer 267B is controlled by electronic signal 230 from computer 229. From the measured values of $\Phi_5$, measured values of the quantity $$\Phi_5(\Phi_5,\phi) - \Phi_5(\Phi_5,\phi_0) \quad (48)$$

are obtained where $\phi_0$ is an initial value used for $\phi$.

An expression for $\Phi_5(\Phi_5,\phi) - \Phi_5(\Phi_5,\phi_0)$, according to Eq. (45), can be written as $$\tilde{\varphi}_5(\varphi_5, \phi) - \tilde{\varphi}_5(\varphi_5, \phi_0) = \quad (49)$$
$$\sum_{q=1} C_{5,q}(\varphi_5)(\cos q\phi - \cos q\phi_0) + \sum_{q=1} S_{5,q}(\varphi_5)(\sin q\phi - \sin q\phi_0).$$

The Fourier coefficients $C_{5,q}(\Phi_5)$ and $S_{5,q}(\Phi_5)$, $q \geq 1$, are obtained in a next step by a Fourier analysis of $\Phi_5(\Phi_5,\phi) - \Phi_5(\Phi_5,\phi_0)$ for the set of values of $\Phi_5$.

The Fourier coefficients $a_{5,qr}$, $b_{5,qr}$, $a'_{5,qr}$, and $b'_{5,qr}$, $q \geq 1$ and $r \geq 1$, can be determined as a function of q and r by iterative procedures for the magnitude of cyclic errors typically found in interferometers. For conditions where the cyclic nonlinearity term $\psi_5 \leq \frac{1}{10}$, the Fourier coefficients $a_{5,q}$, $b_{5,qr}$, $a'_{5,qr}$, and $b'_{5,qr}$, $q \geq 1$ can be obtained from the Fourier coefficients $C_{5,q}(\Phi_5)$ and $S_{5,q}(\Phi_5)$, $q \geq 1$, the Fourier coefficients obtained in the last step, by an efficient iterative process. A cyclic nonlinearity term $\psi_5 \leq \frac{1}{10}$ corresponds to an error in measurement object position of $\leq 5$ nm in a single pass interferometer with $\lambda = 633$ nm. For a situation where the cyclic nonlinearity term $\psi_5 \sim 1$, the Fourier coefficients $a_{5,qr}$, $b_{5,qr}$, $a'_{5,qr}$, and $b'_{5,qr}$, $q \geq 1$ can be obtained from the Fourier coefficients $C_{5,q}(\Phi_5)$ and $S_{5,q}(\Phi_5)$, $q \geq 1$, by generation of a series of simultaneous transcendental equations of the Fourier coefficients. The description of the iterative procedure for determination of the Fourier coefficients $a_{5,qr}$, $b_{5,qr}$, $a'_{5,qr}$, and $b'_{5,qr}$, $q \geq 1$ and $r \geq 1$, is the same as corresponding portions of the description of the iterative process described for second procedure of the first embodiment, the condition $\psi_5 \leq 1/10$ generally being met in interferometry systems.

The relative precision to which the cyclic errors $[\psi_5(\Phi_5, \phi) - C_{5,0}(\Phi_5)]$ can be determined by the third embodiment will have a magnitude of the order of magnitude of $C_{5,0}(\Phi_5)/2$, the cyclic error term $C_{5,0}(\Phi_5)$ being expressed in radians, combined with an absolute precision, expressed in radians, to which $\phi$ is known. The magnitude of the cyclic error term $C_{5,0}(\Phi_5)$ effects the relative precision to which the cyclic errors $[\psi_5(\Phi_5,\phi) - C_{5,0}(\Phi_5)]$ can be determined because $C_{5,0}(\Phi_5)$ is not determined in the third embodiment. The residual cyclic errors from $[\psi_5(\Phi_5,\phi) - C_{5,0}(\Phi_5)]$ in $\Phi_5$ after correction for $[\psi_5(\Phi_5,\phi) - C_{5,0}(\Phi_5)]$ may be described as entering as a second order effects comprising products of first order effects, first order effects such as $[\psi_5(\Phi_5,\phi) - C_{5,0}(\Phi_5)]$, $C_{5,0}(\Phi_5)$, and the absolute precision to which $\phi$ is known.

The apparatus and method of the third embodiment permits measurement and subsequent correction for cyclic errors in $\Phi_5$, excluding $C_{5,0}(\Phi_5)$ which is not determined in the third embodiment, to a relative precision determined by the magnitude of $[\psi_5(\Phi_5,\phi) - C_{5,0}(\Phi_5)]$ and $C_{5,0}(\Phi_5)$ and the absolute precision to which $\phi$ is known. As previously noted, the $C_{5,0}(\Phi_5)$ term is generally effected by polarization and frequency mixing from a number of different sources operating independently or in combination, e.g., polarization and frequency mixing in the interferometer source, misalignment of the interferometer source with respect to the interferometer, departures from desired properties of a polarizing beam splitter used to separate reference and measurement beams based on relative states of polarization, and alignment properties of the detector units including mixers and analyzers with respect to the interferometer. Thus, the third embodiment can measure and compensate for cyclic errors principally the result of cyclic error generation by interferometer 269 and object mirror 292, e.g., spurious internal multiple reflections of beams in the measurement and/or reference legs and/or departures of quarter wave phase retardation plates and polarizing beam splitters from desired properties.

The remaining description of the third embodiment is the same as corresponding portions of the description given for the first embodiment of the present invention.

It will be evident to those skilled in the art that phase shift $\phi$ introduced by translation of retroreflector 291 can be introduced by an additional phase shifter, the same type of phase shifter as phase shifter 81 of the first embodiment, located between retroreflector 291 and beam splitter 271 position to intercept corresponding measurement and reference beams, e.g., beams 215 and 218, without departing from the scope and spirit of the present invention.

A variant of the third embodiment is described wherein the phase shift $\phi$ is modulated at a frequency large compared to the heterodyne frequency of the heterodyne signal and with an amplitude of modulation modulo $\pi$ and the detected heterodyne phase is filtered by a low pass filter to effectively filter out the cyclic error $[\phi_5(\Phi_5,\phi) - C_{5,0}(\Phi_5)]$. For an application where the series representation for $\psi_5$ given by Eq. (45) has been augmented to include terms with arguments that are subharmonics of $\Phi_5$, the amplitude of modulation of $\phi$ will be modified from modulo $\pi$ to a amplitude such that integration of the subharmonic terms by the low pass filtering is zero.

The description of the first preferred embodiment noted that the configuration of interferometer illustrated in FIGS. 1a–1f is known in the art as polarized Michelson interferometer. The description of the third embodiment noted that the configuration of the interferometer illustrated in FIGS. 3a and 3b is known in the art as a differential plane mirror interferometer. Other forms of the Michelson interferometer and forms of other interferometers such as the high stability plane mirror interferometer, or the angle-compensating interferometer or similar device such as is described in an article entitled "Differential interferometer arrangements for distance and angle measurements: Principles, advantages and applications" by C. Zanoni, *VDI Berichte Nr.* 749, 93–106 (1989), may be incorporated into the apparatus of the present invention, the foregoing article being herein incorporated by reference, as when working with stages commonly encountered in the lithographic fabrication of integrated circuits without departing from the spirit or scope of the present invention.

It will be evident to those skilled in the art that the apparatus and method of the first embodiment and the apparatus and method of the third embodiment can be combined into a combined apparatus and method wherein substantially complete determination of the cyclic errors for the interferometer system of the combined apparatus and method. The description of the first embodiment noted that the apparatus and method of the first embodiment permits measurement and subsequent correction for cyclic errors generated principally in the source and/or beam transport to the interferometer, misalignment of the source with respect to the interferometer, and departures from desired properties of a polarizing beam splitter used to separate reference and measurement beams, the cyclic errors to generated generally being modified by alignment properties of the detector units including mixers and analyzers with respect to the interferometer. The description of the third embodiment noted that the apparatus and method of the third embodiment permits measurement and subsequent correction for cyclic errors principally the result of cyclic error generation by interferometer 269 and object mirror 292, e.g., spurious internal multiple reflections of beams in the measurement and/or reference legs and/or departures of quarter wave phase retardation plates and polarizing beam splitters from desired properties.

The principal advantage of the combined apparatus and method of the first and third embodiments in relation to either the first embodiment or the third embodiment is the same as the principal advantage of the second embodiment, i.e. the substantially complete determination of the cyclic errors for an interferometer system, the first embodiment and the third embodiment permitting determinations of substantially mutually exclusive subsets of the cyclic errors.

Figure 4:
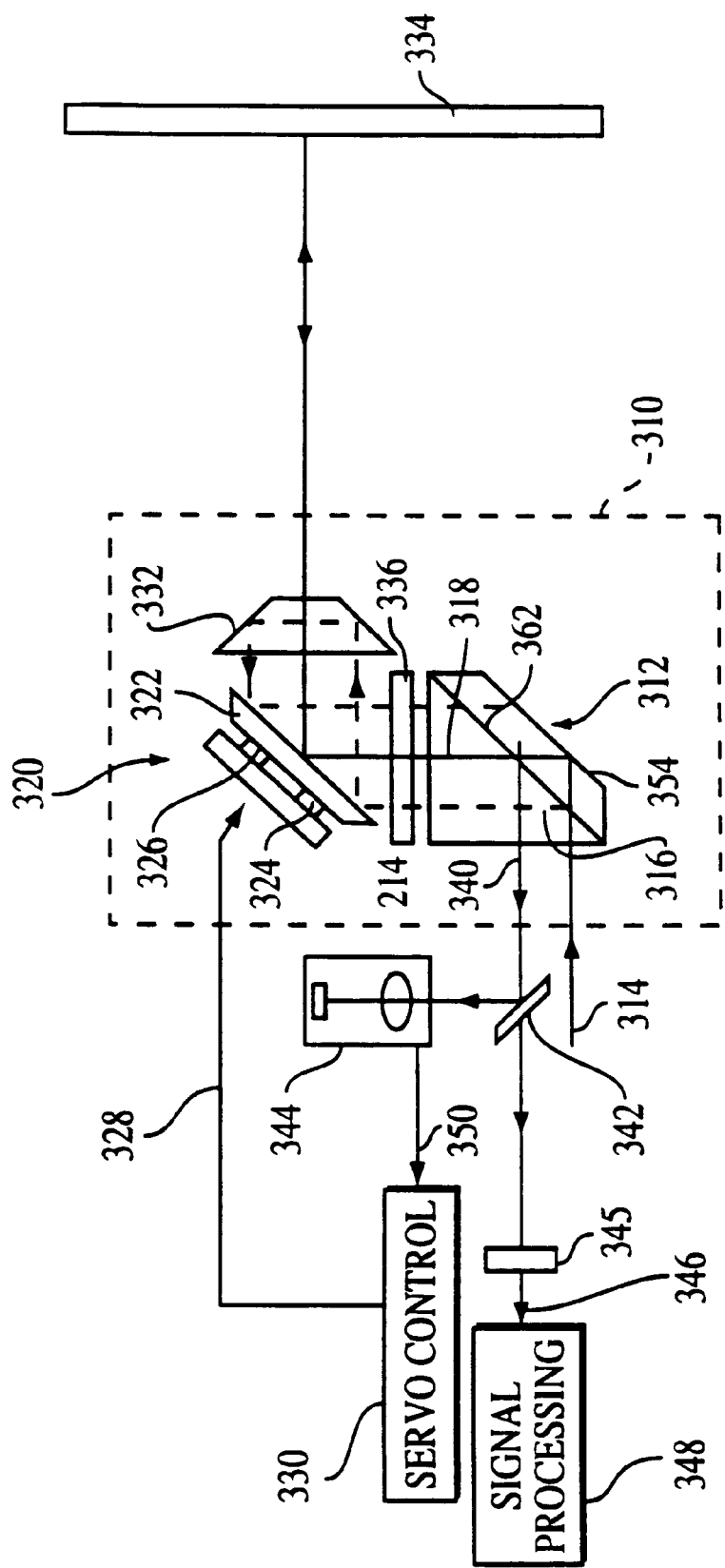
FIG. 4 is a schematic diagram of an additional embodiment of an interferometry system that characterizes and corrects cyclic errors by using a phase shifter.

FIG. 4 depicts in schematic form in accordance with the preferred apparatus and method of the fourth embodiment of the present invention. The fourth embodiment is from the first group of embodiments. The apparatus of the fourth embodiment comprises an interferometer 310 having a dynamic beam steering assembly which redirects the measurement and reference beams to minimize undesired consequences of changes in the angular orientation of the measurement object mirror 334.

As shown in FIG. 4, polarizing beam splitter 312 in an interferometer 310 receives an input beam 314 from a laser source (not shown) and separates input beam 314 into reference beam 316 (dotted line) and measurement beam 318 (solid line), which are linearly polarized orthogonal to one another. The polarizing beam splitter 312 includes a polarizing interface 362 for reflecting beams having a polarization orthogonal to the plane of FIG. 4 and a back reflective surface 364 for reflecting beams transmitted through polarizing interface 362.

The description of input beam 314 is the same as the corresponding description given for light beam 9 of the first embodiment.

Polarizing beam splitter 312 directs the measurement beam 318 to a beam steering assembly 320, which includes a beam steering mirror 322 and a pair of piezoelectric transducers 324 and 326. The transducers are coupled to the beam steering mirror 322 by flexures to orient the beam steering mirror in response to a signal 328 from a servo controller 330. The beam steering assembly may include capacitance gauges to measure changes in orientation and/or position of the beam steering mirror 322. The capacitance gauges may also be used to measure and/or monitor the properties of the piezoelectric transducers 324 and 326.

Beam steering assembly 320 directs the measurement beam through reference retroreflector 332, reference retroreflector 332 being truncated so that a beam passing centrally through retroreflector 332 is not retroreflected, to contact a stage mirror 334, i.e., the measurement object, at substantially normal incidence. Stage mirror 334 then reflects the measurement beam back to retrace its path to beam steering assembly 320 and polarizing beam splitter 312. The measurement beam double passes a quarter wave plate 336, which is positioned between the beam steering assembly 320 and polarizing beam splitter 312 and which rotates the linear polarization of the measurement beam by 90°.

Polarizing beam splitter 312 directs the reference beam 316 to the beam steering assembly 320, which in turn directs the reference beam to reference retroreflector 332. The reference retroreflector then directs the reference beam back to beam steering assembly 320 and onto polarizing beam splitter 312. The reference beam also double passes quarter wave plate 336, which rotates the linear polarization of the reference beam by 90°.

Polarizing beam splitter 312 then recombines the polarization-rotated reference and measurement beams to form overlapping exit reference and measurement beams, which together form an output beam 340. A beam splitter 342 sends a portion of output beam 340 to a detector system 344, which measures the difference in directions of propagation of the exit reference and measurement beams. The detector system sends an error signal 350 indicative of any such difference in directions of propagation to servo controller 330, which sends signal 328 to beam steering assembly 320 in response to the error signal. The beam steering assembly 320 changes, in response to signal 328, the orientation of beam steering mirror 322 preferably about a nodal point of reference retroreflector 332, changes in orientation of beam steering mirror 322 about a nodal point of reference retroreflector 332 producing substantially reduced lateral shear effects experienced by the reference beam.

Alternatively when the direction of the input beam 314 is constant, detector system 344 can measure the difference in position of the exit measurement beam from a reference position in the detector system and generate error signal 350 indicative of that difference in position, a difference in position of the exit measurement beam being the consequence of a change n direction of propagation of the exit measurement beam component of output beam 340. For example, the reference position can be the position of the exit measurement beam in the detector system corresponding to the measurement beam retroreflecting from stage mirror 334, i.e., contacting the stage mirror at normal incidence, and the stage mirror 334 being at a nominal null orientation. In other embodiments, the detector system can include multiple detectors for determining the direction and position of the exit reference and measurement beams and can generate an error signal based on such information.

Changes in the angular orientation of stage mirror 334 change the direction of the measurement beam and the direction of subsequent exit measurement beam. This causes detector system 344 to generate error signal 350. Servo-controller 330 responds to the error signal by directing beam steering assembly 320 to reorient beam steering mirror 322 so as to minimize the error signal, e.g., by directing the measurement beam to the stage mirror at normal incidence. As a result, the exit reference and measurement beams remain substantially parallel to one another and the position of the exit measurement beam remains substantially constant over a range of angular orientations of the stage mirror. Furthermore, since beam steering assembly 1520 also redirects twice both the reference and measurement beams and the measurement beam is directed to the stage mirror at normal incidence, there is no change in the optical path length difference of the reference and measurement beams to first order in any angular orientation change of the stage mirror and beam steering assembly when the paths of the measurement and reference beams have the substantially the same centroids and to first order in translation of beam steering mirror 322 in a direction normal to the reflecting surface of beam steering mirror 322.

The remainder of output beam 340, after beam splitter 342, passes through a polarizer 345, which mixes polarizations of the exit reference and measurement beams to form a mixed beam 346. A signal processing system 348 measures the intensity of the mixed beam preferably by photoelectric detection to produce an electrical interference signal or electrical heterodyne signal, $s_7$, and extracts the phase $\alpha_7$ of the electrical heterodyne signal $s_7$.

Signal $s_7$ has the form $$s_7 = A_7(t) \cos [\alpha_7(t)], \qquad (50)$$

the time-dependent argument $\alpha_7(t)$ being given by $$\alpha_7(t) = 2\pi f_1 t + \Phi_7 + \zeta_7 + \Lambda_7(\Phi_7, \phi) \qquad (51)$$

and $\phi$ is the phase shift introduced into both the measurement and reference beams by translation of beam steering mirror 322 by piezoelectric transducers 324 and 326. The description of the representation of $s_7$ by Eq. (50) is the same as the description given of the corresponding representations of $s_1$ and $s_2$ of the first embodiment by Eq. (9).

Note that $\phi$ does not appear directly in Eq. (51) for $\alpha_7$ except through $\Lambda_7(\Phi_7, \phi)$ in contrast to measured phases $\Phi_2$ and $\Phi_4$ of the first and second embodiments, respectively. The reason that $\phi$ does not appear directly in Eq. (51) is because translation of beam steering mirror 322 introduces a phase shift $\phi$ in both measurement and reference beams simultaneously. However, $\phi$ does appear in $\Lambda_7(\Phi_7, \phi)$ though terms which represent cyclic errors arising for example from spurious beams making multiple passes to the stage mirror 334, the spurious beams being generated for example by spurious reflections and/or departures of quarter wave phase retardation plates from desired properties.

Referring to FIG. 4, signal processor 348 comprises an electronic processor that performs like function as electronic processor 1274A of the first embodiment. The description of the step in processing heterodyne signal $s_7$ by signal processor 348 for phase $\Phi_7$ is the same as corresponding portions of the description given of steps in the processing of heterodyne signal $s_1$ of first embodiment by electronic processor 27. The measured phase $\Phi_7$ is expressed in terms of other quantities according to the equation $$\Phi_7 = \Phi_7 + \zeta_7 + \Lambda(\Phi_7, \phi) \quad (52)$$

where phase offset $\zeta_7$ comprises all contributions to $\Phi_7$ that are not related or associated with the optical paths of measurement or reference paths and does not include nonlinear effects and $\Lambda_7$ comprises the nonlinear effects.

The nonlinearity $\Lambda_7$ is expressed in terms of cyclic nonlinearity $\psi_7$ and a noncyclic nonlinearity $\eta_7$, i.e.

$$\Lambda_7 = \psi_7 + \eta_7. \quad (53)$$

Cyclic nonlinearity $\psi_7$ can to a high order of accuracy be written as $$\psi_7(\varphi_7, \phi) = C_{7,0}(\varphi_7) + \sum_{q=1} C_{7,q}(\varphi_7)\cos q\phi + \sum_{q=1} S_{7,q}(\varphi_7)\sin q\phi \quad (54)$$

with $$C_{7,q}(\varphi_7) = \left( \sum_{r=1} a_{7,qr}\cos r\varphi_7 + \sum_{r=1} b_{7,qr}\sin r\varphi_7 \right), q = 0, 1, 2, \ldots, \quad (55)$$

$$S_{7,q}(\varphi_7) = \left( \sum_{r=1} a'_{7,qr}\cos r\varphi_7 + \sum_{r=1} b'_{7,qr}\sin r\varphi_7 \right), q = 0, 1, 2, \ldots. \quad (56)$$

The coefficients $C_{7,q}$ and $S_{7,q}$ are written in Eqs. (55) and (56) in terms of cosine and sine series terms of harmonics of $\phi_7$. For some configurations of interferometers, in particular multiple pass interferometers, it is possible for a system comprising a source, interferometer, and detector to generate cyclic nonlinearities that are subharmonics of $\phi_7$. Should subharmonic cyclic errors be present in the system, Eqs. (55) and (56) are augmented so as to include cosine and sine series terms with arguments that are subharmonics of $\phi_7$ as well as subharmonics $\phi$. The subsequent description of procedures to determine the coefficients in the cosine and sine series will be in terms of the series representations given by Eqs. (54), (55), and (56) without departing from the spirit and scope of the present invention.

It is possible for a system comprising a source, interferometer, detector, and digital signal processing to generate cyclic nonlinearities that are neither subharmonics or harmonics of $\phi_i$. The non-subharmonic, nonharmonic cyclic errors are produced for example by aliasing in the digital signal processing and have frequencies which are aliases of harmonics and subharmonics of $\phi_i$. Should non-subharmonic, nonharmonic cyclic errors be present in a system, Eqs. (55) and (56) are augmented so as to include cosine and sine series terms with arguments that are the appropriate aliases of harmonics and/or subharmonics of $\phi_i$. The subsequent description of procedures to determine the coefficients in the cosine and sine series will be in terms of the series representations given by Eqs. (54), (55), and (56) without departing from the spirit and scope of the present invention.

The cyclic error terms $C_{7,q}$ and $S_{7,q}$, $q \geq 1$, are principally the result of cyclic error generation by interferometer 310 and stage mirror 334, e.g., spurious internal multiple reflections of beams in the measurement and/or reference legs and/or departures of quarter wave phase retardation plates and polarizing beam splitters from desired properties. The remaining cyclic term $C_{7,0}$ is generally effected by polarization and frequency mixing from a number of different sources operating independently or in combination, e.g., polarization and frequency mixing in the interferometer source, misalignment of the interferometer source with respect to the interferometer, departures from desired properties of a polarizing beam splitter used to separate reference and measurement beams based on relative states of polarization, and alignment properties of the detector units including mixers and analyzers with respect to the interferometer.

The description of the processing for the evaluation of the Fourier coefficients $a_{7qr}$, $b_{7qr}$, $a'_{7qr}$, and $b'_{7qr}$, $q \geq 1$ and $r \geq 1$, is the same as corresponding portions of the description of the iterative process described for the third embodiment. The description of the properties of $[\Psi_7(\phi_7,\phi) - C_{7,0}(\phi_7)]$ and $C_{7,0}(\phi_7)$ is the same as corresponding portions given for the descriptions of the properties of $[\Psi_5(\phi_5,\phi) - C_{5,0}(\phi_5)]$ and $C_{5,0}(\phi_5)$, respectively, of the third embodiment.

The remaining description of the fourth embodiment is the same as corresponding portions of the description given for the third embodiment.

The description of the fourth embodiment noted that the configuration of the interferometer illustrated in FIG. 4 is an interferometer having a dynamic beam steering assembly. Other forms of interferometer having a dynamic beam steering assembly, such as described in commonly owned, U.S. patent application Ser. No. 09/157,131, filed Sep. 18, 1998, and entitled "Interferometer Having A Dynamic Beam Steering Assembly" by Henry A. Hill and Peter de Groot, may be incorporated into the apparatus of the present invention, the foregoing U.S. patent application being herein incorporated in its entirety by reference, as when working with stages commonly encountered in the lithographic fabrication of integrated circuits without departing from the spirit or scope of the present invention.

Figure 5A:
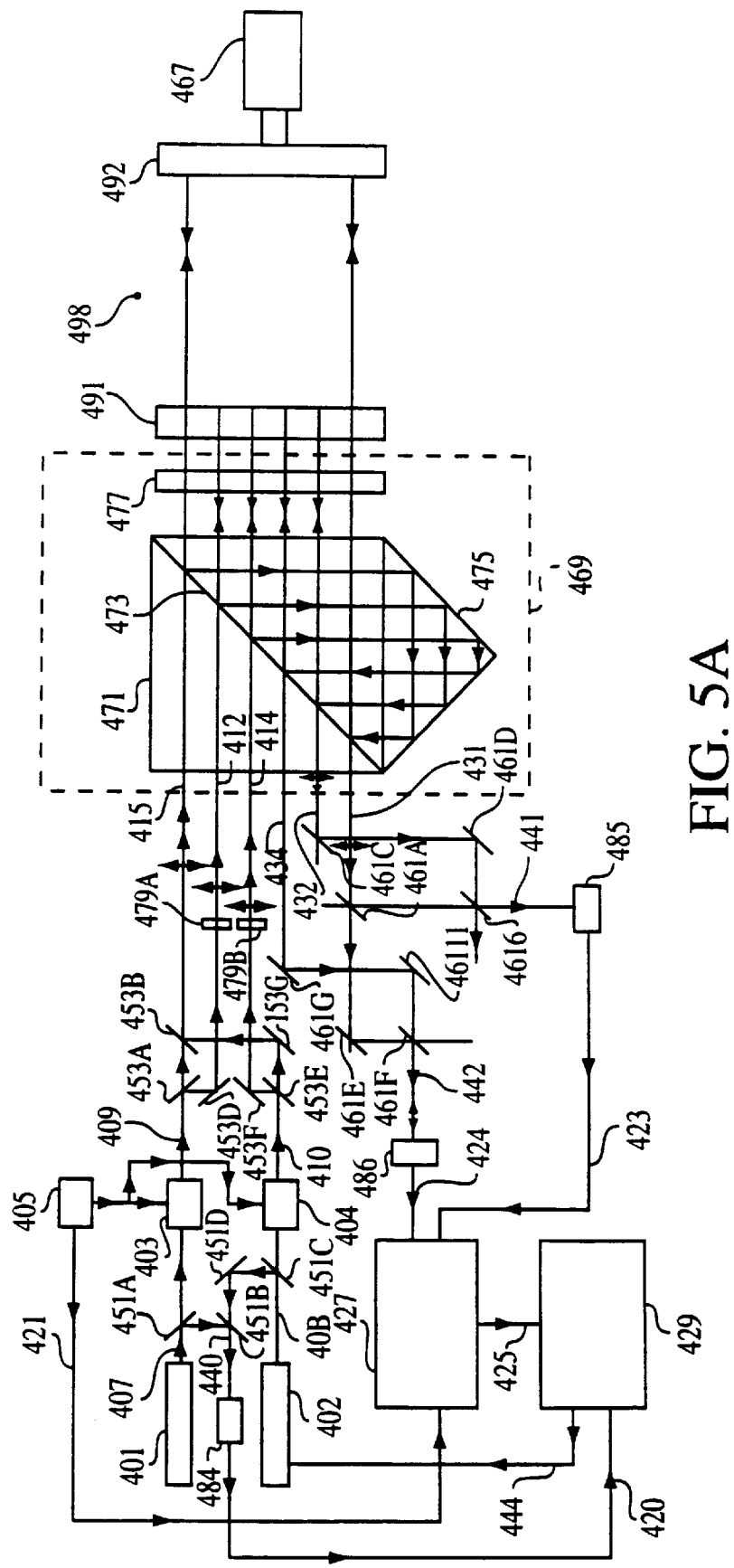
FIG. 5a is a schematic diagram of an interferometry system that characterizes and corrects cyclic errors by using a frequency modulator to produce variable and controlled phase shifts between reference and measurement beams.

FIG. 5a depicts in schematic form in accordance with the preferred apparatus and method of a fifth embodiment of the present invention from the second group of embodiments. The interferometer depicted in FIG. 5a is a double pass differential plane mirror interferometer. In accordance with the preferred apparatus and method of the fifth embodiment, the description of sources 401 and 402 is the same as corresponding portions of the description given for source 1 of the first embodiment except with respect to the control of the wavelength of source 402. Sources 401 and 402 generate beams 407 and 408, respectively, with wavelengths $\lambda_9$ and $\lambda_{10}$, respectively. The wavelength $\lambda_{10}$ of the beam from source 402 is controlled by error signal 444 from computer and controller 429.

As shown in FIG. 5a, a first portion of beam 407 is reflected by nonpolarizing beam splitter 451A and a portion thereof reflected by nonpolarizing beam splitter 651B to form a first component of beam 440. In a next step, a first portion of beam 408 is reflected by nonpolarizing beam splitter 451C, reflected by mirror 451D, and a portion thereof transmitted by nonpolarizing beam splitter 651B to form a second component of beam 440. Beam 440 impinges on wavelength monitor 484 of a well known type configured to monitor the ratio $(\lambda_9/\lambda_{10})$. The measured value of the ratio is transmitted to computer and controller 429 as electronic signal 420. Wavelength monitor 484 may comprise, e.g., interferometers with or without a vacuum in a measurement leg and/or nonlinear elements such as $\beta$-BaBO$_3$ to double the frequency of a beam by second harmonic generation, SHG.

Computer and controller 429 generates error signal 444 related to the difference between the wavelength ratio $(\lambda_9/\lambda_{10})$ the ratio as received from signal 420, and a ratio specified by computer and controller 429. Error signal 444 may control the wavelength, for example, of a laser by controlling the length of the laser cavity with a piezoelectric transducer or of a diode laser by controlling the injection current of the diode laser.

Continuing with FIG. 5a, a second portion of beam 407 is transmitted by nonpolarizing beam splitter 451A and passes through modulator 403 to form beam 409, the description thereof being the same as corresponding portions given in the first embodiment respect to the generation of beam 9 from beam 7. The frequency shifted component of beam 409 is frequency shifted by frequency $f_1$, the frequency of driver 405. In a next step, a second portion of beam 408 is transmitted by nonpolarizing beam splitter 451C and passes through a modulator 404 becoming light beam 410. Modulator 404 is excited by an electronic driver 405, similar to the excitation of modulator 403 and electronic driver 405. The frequency shifted component of beam 410 is frequency shifted by frequency $f_1$.

Continuing with FIG. 5a, a first portion of beam 409 is transmitted by polarizing beam splitter 453A and a portion thereof transmitted by nonpolarizing beam splitter 453B to form a first component of beam 415. A first portion of beam 410 is transmitted by polarizing beam splitter 453E, is reflected by mirror 453G, and a portion thereof reflected by nonpolarizing beam splitter 453B to form a second component of beam 415. The wavelengths of the first and second components of beam 415 are $\lambda_9$ and $\lambda_{10}$, respectively, and both components are polarized in the plane of FIG. 5a.

In a next step, a second portion of beam 409 is reflected by polarizing beam splitter 453A, is reflected by mirror 453D, and passes through half wave phase retardation plate 479A to form beam 412. Polarizer 479A is oriented so as to rotate the polarization of the beam passing through polarizer 479A by 90 degrees. Beam 412 is polarized in the plane of FIG. 5a. The frequency of beam 412 is $[(c/\lambda_9)+f_1]$ where c is the speed of light in a vacuum.

A second portion of beam 410 is reflected by polarizing beam splitter 453E, is reflected by mirror 453F, and passes through half wave phase retardation plate 479B to form beam 414. Polarizer 479B is oriented so as to rotate the polarization of the beam passing through polarizer 479B by 90 degrees. Beam 414 is polarized in the plane of FIG. 5a. The frequency of beam 414 is $[(c/\lambda_{10})+f_1]$.

Beam 415 enters differential plane mirror interferometer 469 and makes a double pass through the measuring path 498. As depicted in FIG. 5a, beams 412 and 414 enter differential plane mirror interferometer 469 and make double passes through respective reference paths. Beams 415, 412, and 414 exit differential plane mirror interferometer 469 as beams 431, 432, and 434, respectively.

Differential plane mirror interferometer 469 and external mirrors 491 and 492 comprise optical means to introduce phase shift $\phi_9$ between the $\lambda_9$ wavelength component of beam 415 and beam 412 and a phase shift $\phi_{10}$ between the $\lambda_{10}$ wavelength component of beam 415 and beam 414. The magnitude of phase shifts $\phi_9$ and $\phi_{10}$ are related to round-trip physical length $L_9$ and $L_{10}$ of measurement path 498 according to the formula $$\phi_i = L_i p k_i n_i, \quad i=9 \text{ and } 10, \tag{57}$$

where p is the number of passes through the respective reference and measurement legs and $n_i$ is the refractive index of gas in measurement path 498 corresponding to wavenumber $k_i = 2\pi/\lambda_i$. The nominal value for $L_i$ corresponds to twice the difference of the physical length between the reflecting surfaces of the external mirrors 491 and 492. The position of external mirror 492 is controlled by translator 467. The interferometer shown in FIG. 5a is for p=2 so as to illustrate in the simplest manner the function of the apparatus of the fifth preferred embodiment of the present invention. To those skilled in the art, the generalization to the case when p≠2 is a straight forward procedure.

In a next step as shown in FIG. 5a, a first portion of beam 431 is reflected by nonpolarizing beam splitter 461A and a portion thereof transmitted by nonpolarizing beam splitter 461B to form a measurement beam component of a first output beam 441. A first portion of beam 432 is reflected by mirrors 461C and 461D and a portion thereof reflected by nonpolarizing beam splitter 461B to form a reference beam component of the first output beam 441. A second portion of beam 431 is transmitted by nonpolarizing beam splitter 461A, reflected by mirror 461E, and a portion thereof reflected by nonpolarizing beam splitter 461F to form a measurement beam component of a second output beam 442. Beam 434 is reflected by mirrors 461G and 461H and a portion thereof transmitted by nonpolarizing beam splitter 461E to form a reference beam component of the second output beam 442. Output beams 441 and 442 are mixed beams and impinge on detectors 485 and 486, respectively, to produce electrical interference signals, preferably by photoelectric detection.

The electrical interference signals comprise heterodyne signals $s_9$, $s_{10}$, and two other heterodyne signals. The heterodyne signals $s_9$ and $s_{10}$ each have a heterodyne frequency equal to frequency $f_1$. The heterodyne frequencies for the two other heterodyne signals are $|\Delta f| \pm f_1$, $$\Delta f \equiv c\left(\frac{1}{\lambda_{10}} - \frac{1}{\lambda_9}\right) = \left(\frac{c}{\lambda_9}\right)\left(\frac{\lambda_9}{\lambda_{10}} - 1\right) \tag{58}$$

where c is the speed of light in a vacuum. The apparatus and method of the fifth embodiment are operated such that $$|\Delta f| \gg f_1. \tag{59}$$

With the condition of Eq. (59) operative, the two other heterodyne signals, although they could be processed for additional information, are easily separated from heterodyne signals $s_9$ and $s_{10}$ and eliminated in detectors 485 and 486 and/or in electronic processor 427 by electronic filtering.

The heterodyne signals $s_9$ and $s_{10}$ generated in detectors 485 and 486, respectively, have the form $$s_i = A_i(t)\cos[a_i(t)], \quad i=9 \text{ and } 10. \tag{60}$$

The time-dependent arguments $\alpha_i(t)$ are given by $$\alpha_9(t) = 2\pi f_1 t + \phi_9 + \zeta_9 + \Lambda_9,$$

$$\alpha_{10}(t) = 2\pi f_1 t + \phi_{10} + \zeta_{10} + \Lambda_{10}, \tag{61}$$

where phase offsets $\zeta_9$ and $\zeta_{10}$ comprise all contributions to $\alpha_9$ and $\alpha_{10}$, respectively, that are not related or associated with the optical path of the measurement path 498 or reference path and not related or associated with nonlinear errors, and $\Lambda_9$ and $\Lambda_{10}$ comprise the nonlinear errors including cyclic error effects. The description of the representations of $s_9$ and $s_{10}$ by Eqs. (60) is the same as the description given of the corresponding representations of $s_1$ and $s_2$ of the first embodiment by Eqs. (9). Heterodyne signals $s_9$ and $s_{10}$ are transmitted to electronic processor 427 for analysis as electronic signals 423 and 424, respectively, in either digital or analog format, preferably in digital format.

Figure 5B:
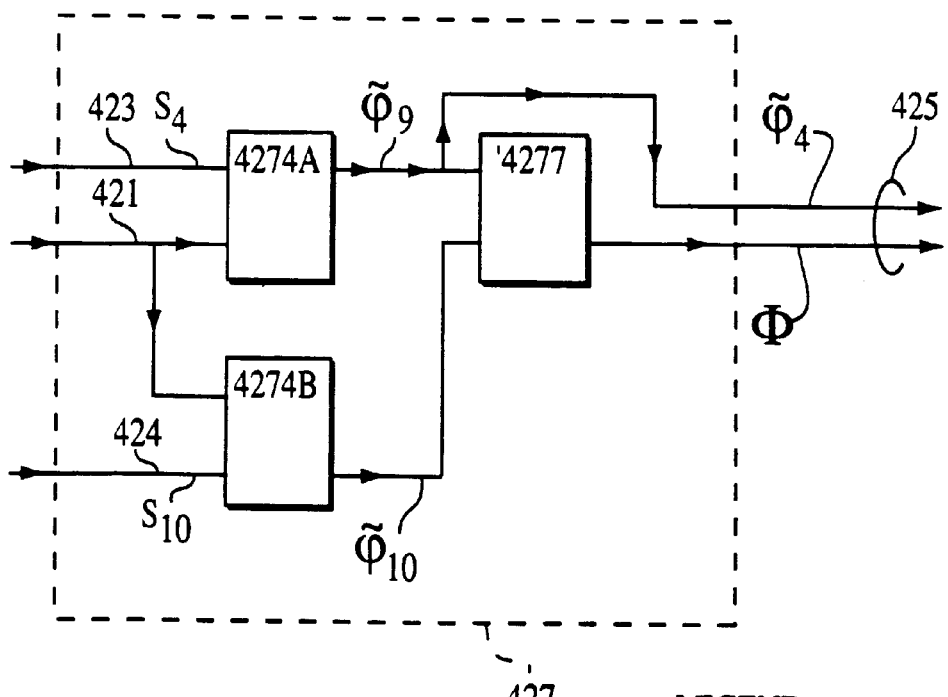

Referring now to FIG. 5b, electronic processor 427 comprises electronic processors 4274A, 4274B, and 4277 which perform like functions as electronic processors 1274A, 1274B, and 1277 of the first embodiment. The description of the steps in processing heterodyne signals $s_9$ and $s_{10}$ by electronic processor 427 for a phase $\Phi$ [$\Phi$ as subsequently defined by Eq. (63)] is the same as corresponding portions of the description given of steps in the processing of the heterodyne signals $s_1$ and $s_2$, respectively, of the first embodiment by electronic processor 27 for a corresponding phase. Electronic processors 4274A and 4274B determine the measured phases $\phi_9$ and $\phi_{10}$, $$\tilde{\phi}_9 = \phi_9 + \zeta_9 + \Lambda_9(\phi_9),$$

$$\tilde{\phi}_{10} = \phi_{10} + \zeta_{10} + \Lambda_{10}(\phi_{10}), \tag{62}$$

using the phase of driver 405 transmitted by signal 421. Electronic processor 4277 subtracts $\tilde{\phi}_9$ from $\tilde{\phi}_{10}$ to form $\Phi$, i.e.

$$\Phi = (\tilde{\phi}_{10} - \tilde{\phi}_9). \tag{63}$$

Phase $\Phi$ may be expressed in terms of other quantities as $$\Phi = pk_9(n_{10}L_{10} - n_9L_9) + pn_{10}L_{10}(2\pi\Delta f/c) + (\zeta_{10} - \zeta_9) + [\psi_{10}(\psi_{10}) - \psi_9(\phi_9)], \tag{64}$$

where the nonlinearity terms $\eta_9$ and $\eta_{10}$ have been omitted as per description given with respect to the first embodiment. The effects of turbulence on the refractive index of the gas in the measuring path cancel out in $\Phi$ as well the effects of Doppler shifts produced by the translation of mirror 492 by translator 467. The turbulence effects on the refractive index of the gas in the measuring path cancel out in $\Phi$ because the measurement beam components of beams 441 and 442, the beams used to generate heterodyne signals $s_9$ and $s_{10}$, respectively, are derived from different frequency components of beam 415 which are substantially coextensive in measurement path 498. In addition, $L_9$ and $L_{10}$ can be made equal to a high level of accuracy.

Cyclic nonlinearities $\psi_9$ and $\psi_{10}$ can to a high order of accuracy be written as $$\psi_9 = \sum_{r=1} a_{9,r}\cos r\varphi_9 + \sum_{r=1} b_{9,r}\sin r\varphi_9, \tag{65}$$

$$\psi_{10} = \sum_{r=1} a_{10,r}\cos r\varphi_{10} + \sum_{r=1} b_{10,r}\sin r\varphi_{10}.$$

Cyclic nonlinearities $\psi_9$ and $\psi_{10}$ are written in Eqs. (65) in terms of cosine and sine series terms of harmonics of $\phi_9$ and $\phi_{10}$, respectively. For some configurations of interferometers, in particular multiple pass interferometers, it is possible for a system comprising a source, interferometer, and detector to generate cyclic nonlinearities that are subharmonics of $\phi_9$ and/or $\phi_{10}$. Should subharmonic cyclic errors be present in the system, Eqs. (65) are augmented so as to include cosine and sine series terms with arguments that are subharmonics of $\phi_9$ and/or $\phi_{10}$. The subsequent description of procedures to determine the coefficients in the cosine and sine series will be in terms of the series representations given by Eqs. (65) without departing from the spirit and scope of the present invention.

It is possible for a system comprising a source, interferometer, detector, and digital signal processing to generate cyclic nonlinearities that are neither subharmonics or harmonics of $\phi_i$. The non-subharmonic, nonharmonic cyclic errors are produced for example by aliasing in the digital signal processing and have frequencies which are aliases of harmonics and subharmonics of $\phi_i$. Should non-subharmonic, nonharmonic cyclic errors be present in a system, Eqs. (65) are augmented so as to include cosine and sine series terms with arguments that are the appropriate aliases of harmonics and/or subharmonics of $\phi_i$. The subsequent description of procedures to determine the coefficients in the cosine and sine series will be in terms of the series representations given by Eqs. (65) without departing from the spirit and scope of the present invention.

The equation for cyclic nonlinearity $\psi_{10}$ from Eqs. (65) may be rewritten in the form $$\psi_{10} = \sum_{r=1} a_{10,r}\cos r[\varphi_9 + pn_{10}(2\pi\Delta f/c)L_{10}] + \tag{66}$$

$$\sum_{r=1} b_{10,r}\sin r[\varphi_9 + pn_{10}(2\pi\Delta f/c)L_{10}]$$

noting that to a good approximation, $$\phi_{10} = \phi_9 + pn_{10}(2\pi\Delta f/c)L_{10}. \tag{67}$$

A term $pk_9(L_{10}n_{10} - L_9n_9)$ has been omitted in Eq. (67), this term being of the order of $10^{-4}$ radians for a $\Delta f = 500$ Mhz, $L_{10} = 1$ m, and the gas comprised of air at room temperature and at atmospheric pressure. The terms in Eq. (66) may be expanded using trigonometric identities and rearranged according to the formula $$\psi_{10} = \sum_{r=1} \cos r\varphi_9 \left\{ \begin{array}{l} a_{10,r}\cos r[pn_{10}(2\pi\Delta f/c)L_{10}] + \\ b_{10,r}\sin r[pn_{10}(2\pi\Delta f/c)L_{10}] \end{array} \right\} + \tag{68}$$

$$\sum_{r=1} \sin r\varphi_9 \left\{ \begin{array}{l} -a_{10,r}\sin r[pn_{10}(2\pi\Delta f/c)L_{10}] + \\ b_{10,r}\cos r[pn_{10}(2\pi\Delta f/c)L_{10}] \end{array} \right\}.$$

In a next step, $\Phi$ is measured as a function $\phi_9$ and for a set of values for $\Delta f$ [defined in Eq. (58)], the required number of different values of $\Delta f$ being dependent on the complexity of $\psi_i$ and the precision required for the measured values of $\psi_i$. From the measured values of $[\Phi - pn_{10}L_{10}(2\pi\Delta f/c)]$, measured values of the quantity $$\psi_{10}(\phi_{10},\Delta f) - \psi_{10}(\phi_{10},\Delta f_0) \tag{69}$$

are generated where $\Delta f_0$ is an initial value of $\Delta f$.

The difference of cyclic errors $\psi_{10}(\phi_{10},\Delta f) - \psi_{10}(\phi_{10},\Delta f_0)$ of Eq. (69) is written in terms of other quantities using Eq. (68) as $$\psi_{10}(\varphi_{10}, \Delta f) - \psi_{10}(\varphi_{10}, \Delta f_0) = \qquad (70)$$

$$\sum_{r=1} \cos r\varphi_9 \begin{pmatrix} a_{10,r}\{\cos r[n_{10}(2\pi\Delta f/c)L_{10}] - \cos r[n_{10}(2\pi\Delta f_0/c)L_{10}]\} \\ b_{10,r}\{\sin r[n_{10}(2\pi\Delta f/c)L_{10}] - \sin r[n_{10}(2\pi\Delta f_0/c)L_{10}]\} \end{pmatrix} +$$

$$\sum_{r=1} \sin r\varphi_9 \begin{pmatrix} -a_{10,r}\{\sin r[n_{10}(2\pi\Delta f/c)L_{10}] - \sin r[n_{10}(2\pi\Delta f_0/c)L_{10}]\} \\ b_{10,r}\{\cos r[n_{10}(2\pi\Delta f/c)L_{10}] - \cos r[n_{10}(2\pi\Delta f_0/c)L_{10}]\} \end{pmatrix}.$$

The Fourier coefficients $a_{9,r}$, $b_{9,r}$, $a_{10,r}$, and $b_{10,r}$ can be determined by a procedure comprising a sequence of iterative procedures.

The first step in the procedure is to obtain a first solution for $a_{10,r}$ and $b_{10,r}$, $r \geq 1$, from an analysis of $\psi_{10}(\phi_{10}, \Delta f) - \psi_{10}(\phi_{10}, \Delta f_0)$. The analysis comprises Fourier analyses of $\psi_{10}(\phi_{10}, \Delta f) - \psi_{10}(\phi_{10}, \Delta f_0)$ wherein $\phi_9$ is used as the variable of integration to yield values of the coefficients of $\cos r\phi_9$ and $\sin r\phi_9$ in Eq. (70) as functions of $\Delta f$. The values of coefficients of $\cos r\phi_9$ and $\sin r\phi_9$ in Eq. (70) generate a set of simultaneous equations in $a_{10,r}$ and $b_{10,r}$, $r \leq 1$, and the set of simultaneous equations are solved for the first solution for $a_{10,r}$ and $b_{10,r}$, $r \leq 1$. The absolute precision to which the first solution for $a_{10,r}$ and $b_{10,r}$, $r \leq 1$, can be determined will have a magnitude of the order of magnitude of the product of the cyclic error term $|\psi_9|/2$ expressed in radians and the cyclic error term $|\psi_{10}|$ expressed in radians. The combined effect of cyclic error terms $|\psi_9|$ and $|\psi_{10}|$ enters as a second order effect in the absolute precision to which $\psi_{10}$ can be determined.

The second step in the procedure is to generate a first iterated solution for $a_{9,r}$ and $b_{9,r}$, $r \geq 1$. The second step comprises iterated Fourier analyses of $[\Phi - pn_{10}L_{10}(2\pi\Delta f/c)]$ minus a $\psi_{10}$ based on the first solution for $a_{10,r}$ and $b_{10,r}$, $r \leq 1$, wherein $\phi_{10}$, corrected for a $\psi_{10}$ based on the first solution for $a_{10,r}$ and $b_{10,r}$, $r \leq 1$, is used as the variable of integration in the iterated Fourier analyses. The description of the iterated Fourier analyses is the same as corresponding portions of the description of the iterative procedure of the first embodiment.

The absolute precision to which the first solution iterated solution for $a_{9,r}$ and $b_{9,r}$ can be determined will have a magnitude of the order of magnitude of the product of the cyclic error term $|\psi_9|$ expressed in radians and the absolute precision to which cyclic error term $|\psi_{10}|$ expressed in radians is determined by the first solution for $a_{10,r}$ and $b_{10,r}$, $r \leq 1$. The combined effect of cyclic error terms $|\psi_9|$ and $|\psi_{10}|$ enters as a third order effect in the absolute precision to which $\psi_9$ can be determined, second order in the magnitude of $|\psi_9|$ expressed in radians and first order in the magnitude of $|\psi_{10}|$ expressed in radians.

The third step in the procedure is obtain a second solution for $a_{10,r}$ and $b_{10,r}$, $r \geq 1$, from an analysis of $\psi_{10}(\phi_{10}, \Delta f) - \psi_{10}(\phi_{10}, \Delta f_0)$. The third step is the same as the first step except that the variable of integration used in the Fourier analyses of the first step is replaced in the third step by $\phi_9$ corrected for $\psi_9$ based on the first iterated solution for $\psi_9$. The absolute precision to which the second solution for $a_{10,r}$ and $b_{10,r}$, $r \leq 1$, can be determined will have a magnitude of the order of magnitude of the product the cyclic error term $|\psi_{10}|$ expressed in radians and the absolute precision to which cyclic error term $|\psi_9|$ expressed in radians is determined by the first iterated solution for $a_{9,r}$ and $b_{9,r}$, $r \leq 1$. The combined effect of cyclic error terms $|\psi_9|$ and $|\psi_{10}|$ enters as a fourth order effect in the absolute precision to which $\psi_9$ can be determined, second order in the magnitude of $|\psi_9|$ expressed in radians and second order in the magnitude of $|\psi_{10}|$ expressed in radians.

The fourth step in the procedure is obtain a second iterated solution for $a_{9,r}$ and $b_{9,r}$, $r \geq 1$. The fourth step comprises iterated Fourier analyses of $[\Phi - pn_{10}L_{10}(2\pi\Delta f/c)]$ minus a $\psi_{10}$ based on the second solution for $a_{10,r}$ and $b_{10,r}$, $r \leq 1$, wherein $\phi_{10}$, corrected for a $\psi_{10}$ based on the second solution for $a_{10,r}$ and $b_{10,r}$, $r \leq 1$, is used as the variable of integration in the iterated Fourier analyses. The fourth step is the same as the second step except for the variable of integration used in the respective Fourier analyses. The absolute precision to which the second iterated solution for $a_{9,r}$ and $b_{9,r}$, $r \geq 1$, can be determined will have a magnitude of the order of magnitude of the product the cyclic error term $|\psi_9|$ expressed in radians and the absolute precision to which cyclic error term $|\psi_{10}|$ expressed in radians is determined by the second solution for $a_{10,r}$ and $b_{10,r}$, $r \leq 1$. The combined effect of cyclic error terms $|\psi_9|$ and $|\psi_{10}|$ enters as a fifth order effect in the absolute precision to which $\psi_9$ can be determined, third order in the magnitude of $|\psi_9|$ expressed in radians and second order in the magnitude of $|\psi_{10}|$ expressed in radians.

The iterative process in the sequence of iterative procedures as described is continued until the Fourier coefficients $a_{9,r}$, $b_{9,r}$, $a_{10,r}$, and $b_{10,r}$, $r \geq 1$, are determined to requisite precision for an end use application. The iterative procedure of the iterative process should converge in several cycles to desired precision for $|\psi_9| \lesssim \frac{1}{3}$ and $|\psi_{10}| \lesssim \frac{1}{3}$.

The remaining description of the fifth embodiment of the present invention is the same as corresponding portions of the description given for the first and second embodiments.

There are two beams, one from the nonpolarizing beam splitter 461B and one from the nonpolarizing beam splitter 461F, which can also be used in the second embodiment either to improve the statistical error for example or in a manner of the first embodiment.

It will be evident to those skilled in the art that means other than the acousto-optical modulator 403 can be used to produce a set of beam components frequency shifted by $f_0$ and $f_0 + f_1$ without departing from the scope and spirit of the invention as disclosed in the second embodiment. For example, a second laser source such as diode laser can be used as a source of a frequency shifted beam components. For a diode laser, the change in the frequency shift $f_0$ could be effected by changing the injection current and/or the temperature of the diode laser.

It will be evident to those skilled in the art that certain features of the first, second, third, and fifth embodiments can beneficially be used together in an apparatus for determination of effects of cyclic errors without departing from the scope and spirit of the present invention.

Figure 6A:
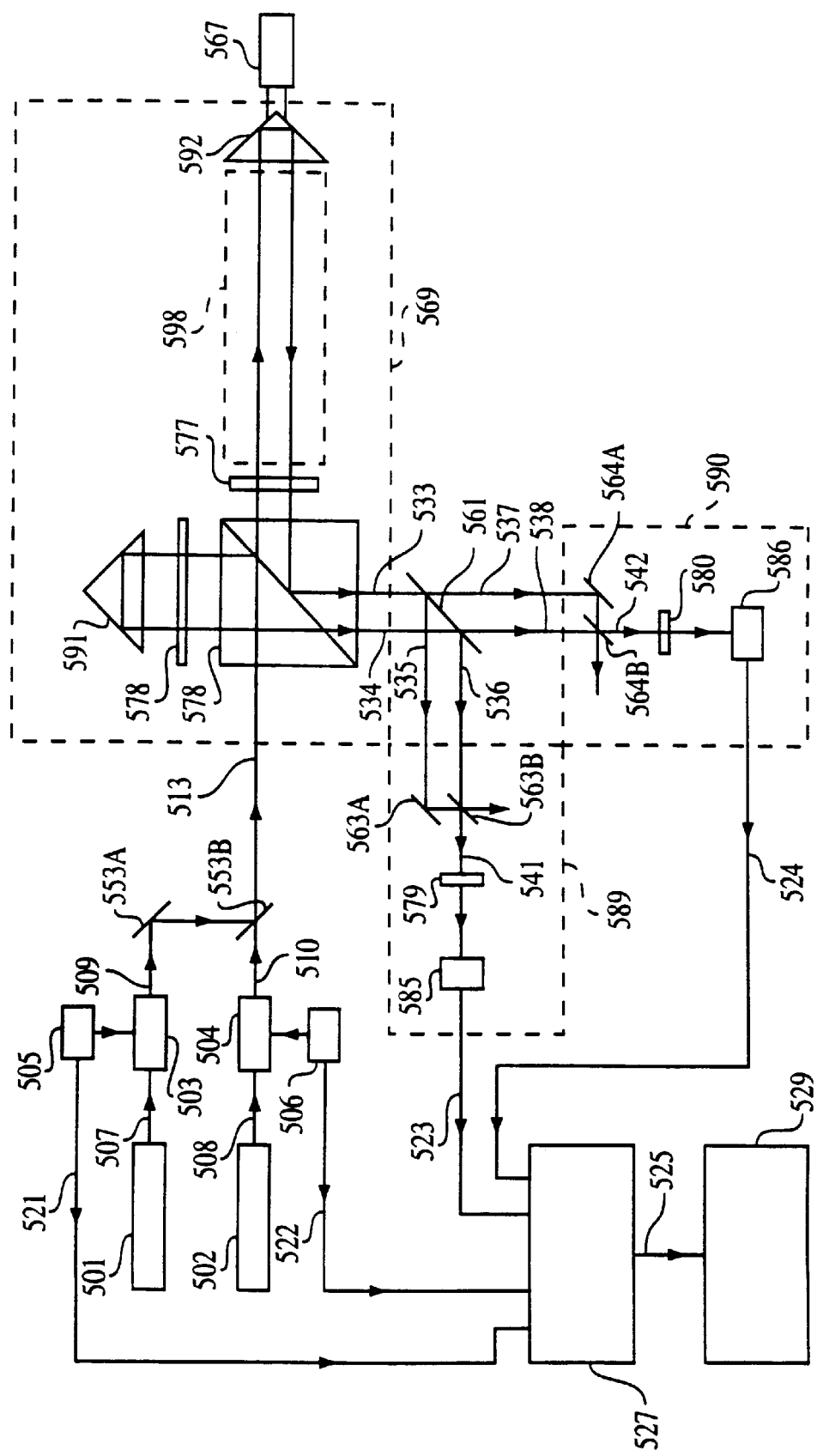
FIG. 6a is a schematic diagram of an embodiment of an interferometry system that characterizes and corrects cyclic errors by analyzing dispersion measurements.
Figure 6B:
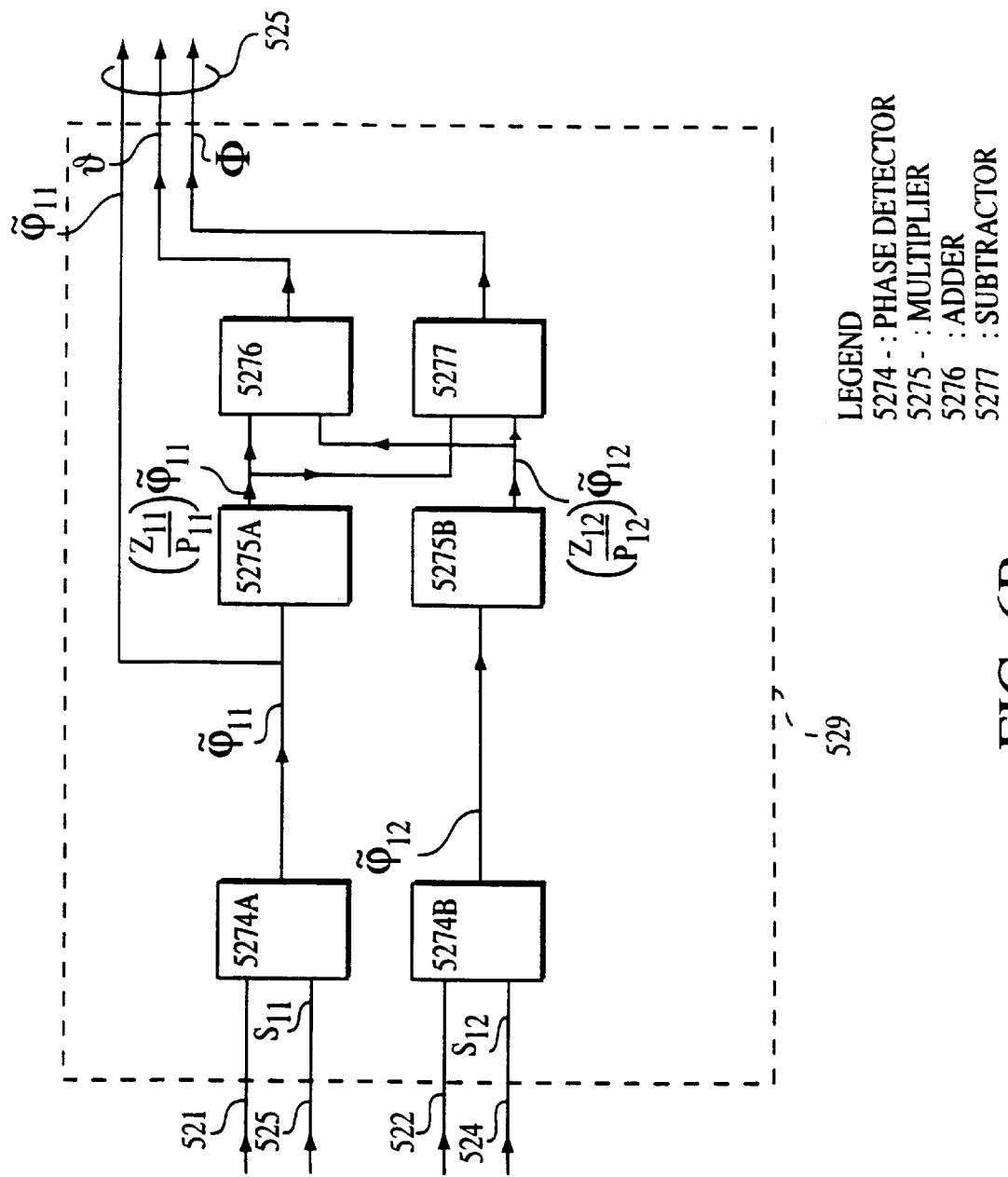

FIGS. 6a and 6b depict in schematic form a sixth embodiment of the present invention. The sixth embodiment is from the third group of embodiments. Embodiments of the third group of embodiments comprise both apparatus and methods for measuring and correcting for cyclic errors in optical dispersion related signals such as used to measure and correct for effects of a gas in a measuring path of a distance measuring interferometer. However, for embodiments of the third group of embodiments, a measured phase corresponding to a phase used for determination of changes in optical path length of a measurement path in a distance measuring interferometer is not corrected for cyclic errors. The effects of cyclic errors in corrections for effects of a gas in a measuring path, corrections generated from optical dispersion related signals, are greater than the effects of cyclic errors in the measured phase by one and a half or more orders of magnitude.

The sixth embodiment comprises apparatus and method for measuring and monitoring the dispersion of a gas in a measurement path and/or the change in the optical path length of the measurement path due to the gas. The refractive index of the gas and/or the physical length of the measurement path may be changing. In addition, the ratio of the wavelengths of light beams generated by adopted light sources is matched with a certain relative precision to a known ratio value comprised of low order nonzero integers.

The sixth embodiment may also be considered, in part, as an extension of the apparatus and method of the fifth embodiment, the ratio of adopted wavelengths for the fifth embodiment being of the order of 1 and the ratio of the adopted wavelengths of sixth embodiment being of the order of 2.

Referring to FIG. 6a and in accordance with the preferred apparatus and method of the sixth embodiment, the description of light beam 509 and the source of light beam 509 is the same as corresponding portions of the description given for light beam 9 and the source of light beam 9 of the first embodiment. The wavelength of source 501 is $\lambda_{11}$. In a next step, a light beam 508 emitted from a source 502 passes through a modulator 504 becoming light beam 510. Modulator 504 is excited by an electronic driver 506 similar to the excitation of modulator 503 by electronic driver 505, respectively. Source 502, similar to source 501, is preferably a laser or like source of polarized, coherent radiation, but preferably at a different wavelength, $\lambda_{12}$.

The ratio of the wavelengths $(\lambda_{11}/\lambda_{12})$ has a known approximate ratio value $l_{11}/l_{12}$, i.e.

$$(\lambda_{11}/\lambda_{12}) \cong (l_{11}/l_{12}), \tag{71}$$

where $l_{11}$ and $l_{12}$ comprise low order nonzero integer values. The x polarized components of beams 509 and 510 have oscillation frequencies shifted by amounts $f_1$ and $f_2$, respectively, with respect to the y polarized components of beams 509 and 510, respectively. The oscillation frequency $f_2$ is determined by electronic driver 506. In addition, the directions of the frequency shifts of the x components of beams 509 and 510 are the same.

It will be appreciated by those skilled in the art that beams 507 and 508 may be provided alternatively be a single laser source emitting more than one wavelength, by a single laser source combined with optical frequency doubling means to achieve frequency doubling, a laser source with a nonlinear element internal to the laser cavity, etc., two laser sources of differing wavelengths combined with sum-frequency generation or difference-frequency generation, or any equivalent source configuration capable of generating light beams of two or more wavelengths. It will also be appreciated by those skilled in the art that one or both of the frequency shifts $f_1$ and $f_2$ may be the result of Zeeman splitting, birefringent elements internal to a laser cavity, or like phenomena characteristic of the laser sources themselves. The generation of beams by a single laser with two widely separated wavelengths and for each beam, a pair of orthogonally polarized components, one component of each pair frequency shifted with respect to the second component of the corresponding pair, is described in U.S. Pat. No. 5,732,095 entitled "Dual Harmonic-Wavelength Split-Frequency Laser" and issued March 1998 to P. Zorabedian.

It will be further appreciated by those skilled in the art that both the x and y polarization components of beam 509 and/or of beam 510 may be frequency shifted without departing from the scope and spirit of the invention, $f_1$ remaining the difference in frequencies of the x and y polarization components of beam 509 and $f_2$ remaining the difference in frequencies of the x and y polarization components of beam 510. Improved isolation of an interferometer and a laser source is generally possible by frequency shifting both x and y polarization components of a beam, the degree of improved isolation depending on the means used for generating the frequency shifts.

In a next step, beam 509 is reflected by mirror 553A and a portion thereof reflected by dichroic nonpolarizing beamsplitter 553B to become a component of beam 513, the $\lambda_{11}$ component. A portion of beam 510 is transmitted by dichroic nonpolarizing beamsplitter 553B to become a second component of beam 513, the $\lambda_{12}$ component, wherein the $\lambda_{12}$ component is preferably parallel and coextensive with the $\lambda_{11}$ component. In a further step, beam 513 propagates to an interferometer 569 comprised of optical means for introducing a phase shift $\phi_{11}$ between the x and y polarization components of the $\lambda_{11}$ component of beam 513 and a phase shift $\phi_{12}$ between the x and y polarization components of the $\lambda_{12}$ component of beam 513. The magnitude of phase shifts $\phi_{11}$ and $\phi_{12}$ are related to round-trip physical length L of measurement path 598 according to the formulae $$\phi_i = Lpk_i n_i, \quad i=11 \text{ and } 12, \tag{72}$$

where p is the number of passes through the respective reference and measurement legs for a multiple pass interferometer, and $n_i$ is the refractive index of gas in measurement path 598 corresponding to wavenumber $k_i = (2\pi)/\lambda_i$.

As shown in FIG. 6a, interferometer 569 is comprised of a reference retroreflector 591, object retroreflector 592 with a position controlled by translator 567, quarter-wave phase retardation plates 577 and 578, and a polarizing beam splitter 573. This configuration is known in the art as a polarized Michelson interferometer and is shown as a simple illustration with p=1.

Eqs. (72) are valid for the case where the paths for beams with one wavelength and the paths for beams with the second wavelength are substantially coextensive, a case chosen to illustrate in the simplest manner the function of the invention in the sixth embodiment. To those skilled in the art, the generalization to the case where the respective paths for beams with the two different wavelengths are not substantially coextensive is a straight forward procedure.

After passing through interferometer 569, the portion of beam 513 passing through She measurement path becomes a phase-shifted beam 533 and the portion of beam 513 passing through the reference path containing retroreflector 591 becomes phase-shifted beam 534. Phase-shifted beams 533 and 534 are polarized orthogonal to the plane and in the plane of FIG. 6a, respectively. A conventional dichroic beam splitter 561 separates those portions of beam 533 corresponding to wavelengths $\lambda_{11}$ and $\lambda_{12}$ into beams 535 and 537, respectively, and those portions of beam 534 corresponding to wavelengths $\lambda_{11}$ and $\lambda_{12}$ into beams 536 and 538, respectively. Beams 535 and 536 enter detector system 589 and beams 537 and 538 enter detector system 590.

In detector system 589 as shown in FIG. 6a, beam 535 is first reflected by mirror 563A and then reflected by polarizing beam splitter 563B to form one component of beam 541. Beam 536 is transmitted by polarizing beam splitter 563B to become a second component of beam 541. In detector system 590, beam 537 is first reflected by mirror 564A and then reflected by polarizing beam splitter 564B to form one component of beam 542. Beam 538 is transmitted by polarizing beam splitter 564B to become a second component of beam 542. Beams 541 and 542 pass through polarizers 579 and 580, respectively, impinge upon photodetectors 585 and 586, respectively, and generate preferably by photoelectric detection two electrical interference signals. The two electrical interference signals comprise two heterodyne signals $s_{11}$ and $s_{12}$, respectively. Polarizers 579 and 580 are preferably oriented so as to mix x and y polarization components of beams 541 and 542, respectively. The heterodyne signals $s_{11}$ and $s_{12}$ correspond to wavelengths $\lambda_{11}$ and $\lambda_{12}$, respectively.

Signals $s_i$, i=11 and 12, have the form $$s_i = A_i(t)\cos[\alpha_i(t)], \quad i=11 \text{ and } 12. \tag{73}$$

Time-dependent arguments $\alpha_i(t)$ are given by $$\alpha_{11}(t)=2\pi f_1 t+\phi_{11}+\zeta_{11}+\Lambda_{11},$$
$$\alpha_{12}(t)=2\pi f_2 t+\phi_{12}+\zeta_{12}+\Lambda_{12}, \tag{74}$$

where phase offsets $\zeta_i$ comprise all contributions to the arguments $\alpha_i$ that are not related or associated with measurement path 798 or reference paths and not related or associated with nonlinear errors and the $\Lambda_i$ comprise the nonlinear errors including cyclic error terms. The description of the representations of $s_{11}$ and $s_{12}$ by Eqs. (73) is the same as corresponding portions of the description given of the representations of $s_1$ and $s_2$ of the first embodiment by Eq. (9). Heterodyne signals $s_{11}$ and $s_{12}$ are transmitted to electronic processor 527 for analysis as electronic signals 523 and 524, respectively, in either digital or analog format, preferably in digital format.

Referring now to FIG. 6b, electronic processor 527 comprises electronic processors 5274A and 5274B to determine measured phases $\phi_{11}$ and $\phi_{12}$, respectively, $$\phi_i = \phi_i + \zeta_i + \Lambda_i, \quad i=11 \text{ and } 12, \tag{75}$$

by either digital or analog signal processes, preferably digital processes, using time-based phase detection such as a digital Hilbert transform phase detector (R. E. Best, ibid.) or the like and the phase of electronic drivers 505 and 506, respectively.

The phases of electronic drivers 505 and 506 are transmitted by electrical signals, reference signals 521 and 522, respectively, in either digital or analog format, preferably in digital format, to electronic processor 527. Reference signals, alternatives to reference signals 521 and 522, may also be generated by an optical pick off means and detectors (not shown in figures) by splitting off portions of beams 509 and 510 with beam splitters, preferably nonpolarizing beam splitters, mixing the respective portions of beam 509 and beam 510 that are split off, and detecting the mixed portions to produce alternative heterodyne reference signals.

Referring again to FIG. 6b, phase $\phi_{11}$ and phase $\phi_{12}$ are next multiplied by $l_{11}/p$ and $l_{12}/p$, respectively, in electronic processors 5275A and 5275B, respectively, preferably by digital processing, to produce phases $(l_{11}/p)\phi_{11}$ and $(l_{12}/p)\phi_{12}$, respectively. Phases $(l_{11}/p)\phi_{11}$ and $(l_{12}/p)\phi_{12}$ are next added together in electronic processor 5276 and subtracted one from the other in electronic processor 5277, preferably by digital processes, to create the phases $\vartheta$ and $\Phi$, respectively. Formally, $$\vartheta = \left(\frac{l_{12}}{p}\tilde{\varphi}_{12} + \frac{l_{11}}{p}\tilde{\varphi}_{11}\right), \tag{76}$$

$$\Phi = \left(\frac{l_{12}}{p}\tilde{\varphi}_{12} - \frac{l_{11}}{p}\tilde{\varphi}_{11}\right). \tag{77}$$

Using the definitions given by Eqs. (75), phases $\vartheta$ and $\Phi$ can also be written as $$\vartheta = \left\{L[\chi(n_{12}+n_{11})+K(n_{12}-n_{11})]+\left(\frac{1}{p}\right)(l_{12}\zeta_{12}+l_{11}\zeta_{11})+ \right. \tag{78}$$
$$\left. \left(\frac{1}{p}\right)[l_{12}\Lambda_{12}(\varphi_{12})+l_{11}\Lambda_{11}(\varphi_{11})]\right\},$$

$$\Phi = \left\{L[\chi(n_{12}-n_{11})+K(n_{12}+n_{11})]+\left(\frac{1}{p}\right)(l_{12}\zeta_{12}-l_{11}\zeta_{11})+ \right. \tag{79}$$
$$\left. \left(\frac{1}{p}\right)[l_{12}\Lambda_{12}(\varphi_{12})-l_{11}\Lambda_{11}(\varphi_{11})]\right\},$$

where $$\chi=(l_{12}k_{12}+l_{11}k_{11})/2, \tag{80}$$

$$K=(l_{12}k_{12}-l_{11}k_{11})/2. \tag{81}$$

The phases $\phi_{11}$, $\vartheta$, and $\Phi$ are transmitted to computer 529 as signal 525, in either digital or analog format, preferably in digital format.

The noncyclic nonlinearity $\eta_i$ is omitted in subsequent description of the sixth embodiment, the basis for the omission being the same as the basis given for omission of the corresponding noncyclic nonlinearity in the latter portion of the description of the first embodiment.

The dispersion $(n_{12}-n_{11})$ of the gas can be determined from $\vartheta$ and $\Phi$ using the formula $$(n_{12}-n_{11}) = \frac{1}{\chi L[1-(K/\chi)^2]}\{[\Phi-\vartheta(K/\chi)]+Q_\psi+Q\}, \tag{82}$$

where $$Q_\psi = \xi_\psi(K/\chi)-Z_\psi, \tag{83}$$

$$\xi_\psi = \left(\frac{l_{12}}{p}\psi_{12}+\frac{l_{11}}{p}\psi_{11}\right), \tag{84}$$

$$Z_\psi = \left(\frac{l_{12}}{p}\psi_{12}-\frac{l_{11}}{p}\psi_{11}\right), \tag{85}$$

$$Q = \xi(K/\chi)-Z, \tag{86}$$

$$\xi = \left(\frac{l_{12}}{p}\zeta_{12}+\frac{l_{11}}{p}\zeta_{11}\right), \tag{87}$$

$$Z = \left(\frac{l_{12}}{p}\zeta_{12}-\frac{l_{11}}{p}\zeta_{11}\right). \tag{88}$$

For those applications related to distance measuring interferometry, the heterodyne phase $\phi_{11}$ and phases $\vartheta$ and $\Phi$ may be used to determine the distance L as a quantity independent of the effects of the refractive index of the gas in the measuring path of the distance measuring interferometer using the formula $$L = \frac{1}{(\chi-K)}\left\{\begin{array}{c}\frac{l_{11}}{p}(\tilde{\varphi}_{11}-\zeta_{11}-\psi_{11})- \\ \frac{\Gamma}{[1+(K/\chi)]}[\Phi-(K/\chi)\vartheta+Q_\psi+Q]\end{array}\right\} \quad (89)$$

where $\Gamma$, the reciprocal dispersive power of the gas, is defined as $$\Gamma = \frac{(n_{11}-1)}{(n_{12}-n_{11})}. \quad (90)$$

It is evident from the definition of K given by Eq. (81) that $(K/\chi)=0$ corresponds to the wavelengths $\lambda_{11}$ and $\lambda_{12}$ being strictly harmonically related. For an application where $|k/\chi|>0$ and the value of $(K/\chi)$ must be known to a certain precision in the use of Eqs. (82) and/or (89) to meet an end use requirement, $(K/\chi)$ is measured by wavelength monitors (not shown in the figures). The wavelength monitors may comprise interferometers with or without vacuum cells and/or frequency doubling of light beams by SHG. For an application where the value of $\chi$ must be known to another certain precision in the use of Eqs. (82) and/or (89), $\chi$ is measured by a wavelength monitor. In addition, when values for $\chi$ and $(K/\chi)$ are both required, they may both be obtained from the same apparatus.

A value for the reciprocal dispersive power $\Gamma$ can be obtained to a certain relative precision from known refractive properties of known constituents of a gas in the measuring path. For those applications where the gas composition is not known to a requisite accuracy and/or the refractive properties of the gas constituents is not known to a corresponding requisite accuracy, $\Gamma$ can be measured by apparatus such as described in commonly owned copending U.S. application Ser. No. 08/942,848 filed Oct. 2, 1997 and entitled "Apparatus And Methods For Measuring Intrinsic Optical Properties Of A Gas," U.S. application filed Oct. 21, 1998 and entitled "Interferometric Method And Apparatus For Measuring Intrinsic Optical Properties Of A Gas," and U.S. Provisional Application No. 60/075,595 filed Feb. 23, 1998 and entitled "Apparatus And Methods For Measuring Intrinsic Optical Properties Of A Gas," all three applications by Henry A. Hill, the foregoing applications being incorporated herein in their entirety by reference.

The relative precision to which the dispersion $(n_{12}-n_{11})$ can be determined is limited in part by the effect of cyclic errors, the magnitude of the effect, according to Eq. (82), being of the order of $$\left[\left(\frac{l_i}{p}\right)|\psi_i|\right]/L\chi(n_{12}-n_{11}), \quad i=11 \text{ and } 12. \quad (91)$$

Consider for example, an application where $\lambda_{11}=0.633$ μm, $\lambda_{11}=2\lambda_2$, p=1, L=0.5 m, and the gas is comprised of air at 25° C. and a pressure of one atmosphere. For the example conditions, the magnitude of the contribution of $\psi_{11}$ to the relative precision as expressed by Eq. (91) is $$\approx 0.019|\psi_{11}|, \quad (92)$$

$\psi_{11}$ being expressed in radians and $|\psi_{11}|$ indicating the absolute value of $\psi_{11}$. Continuing with the example, for a specific cyclic error of $|\psi_{11}|=0.1$ radians, a cyclic error in phase corresponding in the example to a cyclic error in a distance measurement of 5 nm, the specific cyclic error limits the relative precision to which the dispersion $(n_{12}-n_{11})$ can be measured to $\approx 0.2\%$. If a source for the $\lambda_{11}$ beam is a NbYAG laser with $\lambda_{11}=1.06$ μm, the corresponding limits on the relative precision to which the dispersion $(n_{12}-n_{11})$ can be measured is $\approx 0.6\%$.

The limitations of effects of cyclic errors on the relative precision to which the dispersion $(n_{12}-n_{11})$ can be determined propagate directly to limitations of the effects of cyclic errors on corrections for refractivity effects of gas in a measurement path of a distance measuring interferometer using dispersion interferometry. From inspection of Eq. (89), it is evident that the magnitude of the cyclic error contribution of $\psi_i$ entering through $Q_\psi$ is $\cong \Gamma|\psi_i|$ relative to the magnitude of the cyclic error contribution $|\psi_{11}|$ entering through $\phi_{11}$. For the two cases of $\lambda_{11}=0.633$ μm with $\lambda_{11}=2\lambda_{12}$ and $\lambda_{11}=1.06$ μm also with $\lambda_{11}=2\lambda_{12}$, the values for $\Gamma$ are 24 and 75, respectively. Thus the effects of cyclic error contributions to the correction term in Eq. (89) for the refractivity of a gas in a measuring path must be reduced by approximately one and a half or more orders of magnitude if the effects of the cyclic error contributions resulting from the correction term are to be of the order of or less than the effects of the cyclic error contributions resulting directly from $\phi_{11}$.

The cyclic error terms $Z_\psi$ given by Eq. (85) can be expressed as $$(1/p)[l_{12}C_{12}(\phi_{12})-l_{11}C_{11}(\phi_{11})] \quad (93)$$

where $$\psi_{11}(\phi_{11})=C_{11}(\phi_{11}),$$
$$\psi_{12}(\phi_{12})=C_{12}(\phi_{12}), \quad (94)$$

and $$C_i(\varphi_i) = \left(\sum_{r=1} a_{ir}\cos r\varphi_i + \sum_{r=1} b_{ir}\sin r\varphi_i\right), \quad i=11 \text{ and } 12. \quad (95)$$

The $C_i$ are written in Eqs. (95) in terms of cosine and sine series terms with arguments of the series terms being harmonics of $\phi_i$. For some configurations of interferometers, in particular multiple pass interferometers, it is possible for a system comprising a source, interferometer, and detector to generate cyclic nonlinearities that are subharmonics of $\phi_i$. Should subharmonic cyclic errors be present in a system, Eqs. (95) are augmented so as to include cosine and sine series terms with arguments that are subharmonics $\phi_i$. The subsequent description of procedures for the determination of the coefficients in the cosine and sine series will be in terms of the series representations given by Eqs. (94) and (95) without departing from the spirit and scope of the present invention.

It is possible for a system comprising a source, interferometer, detector, and digital signal processing to generate cyclic nonlinearities that are neither subharmonics or harmonics of $\phi_i$. The non-subharmonic, nonharmonic cyclic errors are produced for example by aliasing in the digital signal processing and have frequencies which are aliases of harmonics and subharmonics of $\phi_i$. Should non-subharmonic, nonharmonic cyclic errors be present in a system, Eqs. (95) are augmented so as to include cosine and sine series terms with arguments that are the appropriate aliases of harmonics and/or subharmonics of $\phi_i$. The subsequent description of procedures to determine the coefficients in the cosine and sine series will be in terms of the series representations given by Eqs. (94) and (95) without departing from the spirit and scope of the present invention.

In a next step, $\Phi$ is measured as a function of $\phi_{11}$ and $\phi_{12}$ over a certain range of values of $\phi_{11}$ and $\phi_{12}$. The measured values of $\Phi$ can be written, according to Eq. (79), as $$\Phi = L\chi(n_{12} - n_{11}) + LK(n_{12} + n_{11}) + Z_\psi + Z. \quad (96)$$

For changes in L of the order of $10\lambda_{11}$ to $100\lambda_{11}$, it is evident from Eq. (96) that, for the condition $K/\chi \leq [(n_{12} - n_{11})/(n_{12} + n_{11})]$, the $Z_\psi$ term is the dominant term with respect generating changes in $\Phi$, typically by several orders of magnitude, other terms $K$, $\chi$, and $Z$ being constants and $[(n_{12} - n_{11})/(n_{12} + n_{11})] \leq 1/(2 \times 10^5)$ for air at 25° C. and at a pressure of one atmosphere, $\lambda_{11} \geq 0.6 \ \mu m$, and $\lambda_{11} \cong 2\lambda_{12}$. As a consequence, the measured values of $\Phi$ can be used directly in an effective procedure for determination of $Z_\psi$.

The ratio of the wavelengths $\lambda_{11}/\lambda_{12}$ in the sixth embodiment can be expressed as the ratio of low order nonzero integers, $l_{11}/l_{12}$ as per Eq. (71), with a certain relative precision. The ratio of $\phi_{11}/\phi_{12}$ can therefore be expressed as $$\frac{\varphi_{11}}{\varphi_{12}} = \frac{l_{12}}{l_{11}} \quad (97)$$

with the same certain relative precision.

The two parameter representation of $Z_\psi$, the two parameters being $\phi_{11}$ and $\phi_{12}$ according to Eqs. (85), (94), and (95), can be reduced to a one parameter representation by using Eq. (97) to eliminate either $\phi_{11}$ or $\phi_{12}$ in the two parameter representation of $Z_\psi$. The subsequent description of the sixth embodiment will be in terms of the elimination of $\phi_{12}$, although the elimination of $\phi_{11}$ could have been chosen as the parameter to eliminate yielding substantially the same end results in terms of the determination of $Z_\psi$. The resulting one parameter representation for $Z_\psi$ is $$Z_\psi = \left(\frac{l_{12}}{p}\right)\left[\sum_{r=1} a_{12,r}\cos r\left(\frac{l_{11}}{l_{12}}\right)\varphi_{11} + \sum_{r=1} b_{12,r}\sin r\left(\frac{l_{11}}{l_{12}}\right)\varphi_{11}\right] - \left(\frac{l_{11}}{p}\right)\left(\sum_{r=1} a_{11,r}\cos r\varphi_{11} + \sum_{r=1} b_{11,r}\sin r\varphi_{11}\right). \quad (98)$$

With the ratio $(l_{11}/l_{12})$ being comprised of the ratio of low order nonzero integers, the terms in the one parameter representation for $Z_\psi$ can be rewritten as a cosine and sine series with arguments that are harmonics of $\phi_{11}$, the ratio $(l_{11}/l_{12})$ being an integer, e.g., 2, 3, . . . , or as a cosine and sine series with arguments that include subharmonics of $\phi_{11}$, the ratio $(l_{11}/l_{12})$ being a noninteger, e.g., 3/2, 4/3, etc. The one parameter representation for $Z_\psi$ as rewritten will be referenced as the reduced representation for $Z_\psi$.

The procedure for evaluation of the Fourier coefficients of the reduced representation for $Z_\psi$ uses $\phi_{11}$ as the variable of integration in the Fourier analysis such as described for the first step in the procedure used to obtain a first solution for $a_{10,r}$ and $b_{10,r}$, $r \geq 1$, of the fifth embodiment. The relative precision to which the cyclic error term $Z_\psi$ can be determined by the sixth embodiment will have a magnitude of the order of magnitude of ½ the cyclic error, expressed in radians, in $\phi_{11}$, or if larger, the effect of the certain relative precision that the ratio of wavelengths $(\lambda_{11}/\lambda_{12})$ is expressed as the ratio of $l_{11}/l_{12}$. Thus the residual contribution of cyclic errors to $\Phi$ post correction will enter as a second order effect, first order in the cyclic errors in $\Phi$ and either first order in the cyclic errors in either $\phi_{11}$ or $\phi_{12}$ depending upon which of $\phi_{11}$ and $\phi_{12}$ are used as the variable of integration in the Fourier analysis or the certain relative precision that the ratio of wavelengths $(\lambda_{11}/\lambda_{12})$ is expressed as the ratio of $l_{11}/l_{12}$.

The remaining description of the sixth embodiment is the same as corresponding portions of the descriptions given for the first and fifth embodiments of the present invention.

A first variant of the sixth embodiment of the present invention is described wherein the first variant of the sixth embodiment is from the third group of embodiments. The description of the first variant of the sixth embodiment is the same as that given for the description of the sixth embodiment except with respect to the treatment of cyclic errors. In the first variant of the sixth embodiment, the phase $\Phi$ given by Eq. (96) is filtered by either an integral transform of $\Phi$ with respect to $\phi_{11}$ over an interval of $2\pi l_{12}$ or multiples thereof or the integral transform of $\Phi$ with respect to $\phi_{12}$ over an interval of $2\pi l_{11}$ or multiples thereof. The description of the integral transform is similar to the description given for the integral transform used in the first procedure of the first embodiment of the present invention.

The design of the integral transform algorithm is based on the properties of the reduced representation of $Z_\psi$. The effectiveness of an integral transform in reducing or eliminating the effect of cyclic errors will depend on the magnitude of the cyclic errors in $\phi_{11}$ and $\phi_{12}$. The residual contribution of cyclic errors to $\Phi$ post filtering by an integral transform will enter as a second order effect, first order in the cyclic errors in $\Phi$ and either first order in the cyclic errors in either $\phi_{11}$ or $\phi_{12}$ depending upon which of $\phi_{11}$ and $\phi_{12}$ are used in execution of the integral transform or the effect of the certain relative precision that the ratio of wavelengths $(\lambda_{11}/\lambda_{12})$ is expressed as the ratio of $l_{11}/l_{12}$. For an optimal integral transform, the residual second order effect will have an order of magnitude of $Z_\psi$ multiplied by either ½ the magnitude of the cyclic errors, expressed in radians, in either $\phi_{11}$ or $\phi_{12}$ whichever one is used in the integral transform or the effect of the certain relative precision that the ratio of wavelengths $(\lambda_{11}/\lambda_{12})$ is expressed as the ratio of $l_{11}/l_{12}$.

The first variant of the sixth embodiment does not place any restrictions on the motion of the mirror 592 in order to be effective other than that there be some motion initially corresponding to either phase space $2\pi l_{12}$, $2\pi l_{11}$, or multiples thereof used in the integral transform procedure of the filter and that the cyclic errors do not change significantly between the periods when mirror 592 is moved over a distance corresponding to the phase space $2\pi l_{12}$, $2\pi l_{11}$, or multiples thereof used in the integral transform procedure of the filter. The filtering out of cyclic errors by the first variant of the sixth embodiment effectively eliminates problems encountered in prior art based on filtering methods wherein there is an integration over fixed periods of time.

A group of other variants of the sixth embodiment of the present invention are described, the other group of variants of the sixth embodiment comprising the apparatus and method of the sixth embodiment and at least one of the apparatus and methods of the first, second, third, and fifth embodiments of the present invention. The group of other variants of the sixth embodiment are from the fourth group of embodiments, embodiments of the fourth group of embodiments comprising apparatus and methods for measuring and correcting for cyclic errors in both the measured phase used for determination of changes in optical path length of a measurement path in a distance measuring interferometer and the associated optical dispersion related signal used to correct the changes in optical path length for effects of gas in the measuring path of the distance measuring interferometer.

A second variant of the sixth embodiment from the other group of variants of the sixth embodiment comprises the apparatus and method of the sixth embodiment and the apparatus and method of the first embodiment of the present invention. For the second variant of the sixth embodiment, the cyclic errors present in phases corresponding to $\phi_{11}$ and $\phi_{12}$ of the sixth embodiment and generated in the source and/or beam transport to the interferometer, misalignment of the source with respect to the interferometer, and departures from desired properties of a polarizing beam splitter used to separate reference and measurement beams, the cyclic errors so generated generally being modified by alignment properties of the detector units including mixers and analyzers with respect to the interferometer, can be corrected to a high level of precision, i.e., corrected up to second order effects in combination of cyclic errors and/or the absolute precision to which $\phi$ is known. The corresponding contributions of cyclic errors to a $\Phi$ of the second variant of the sixth embodiment, the $\Phi$ corresponding to the $\Phi$ of the sixth embodiment, are thus corrected to a level of precision higher than for the corresponding $\Phi$ in the sixth embodiment, i.e., corrected up to third order effects in combination of cyclic errors and/or the absolute precision to which $\phi$ is known.

The remaining description of the second variant of the sixth embodiment is the same as corresponding portions of the descriptions given for the first and sixth embodiments.

The advantage of the second variant of the sixth embodiment is realized when the cyclic errors in phases of the second variant of the sixth embodiment corresponding to $\phi_{11}$ and $\phi_{12}$ of the sixth embodiment are primarily generated in the source and/or beam transport to the interferometer, misalignment of the source with respect to the interferometer, and departures from desired properties of a polarizing beam splitter used to separate reference and measurement beams.

A third variant of the sixth embodiment from the other group of variants of the sixth embodiment comprises the apparatus and method of the sixth embodiment and the apparatus and method of the third embodiment of the present invention. For the third variant of the sixth embodiment, the cyclic errors present in phases corresponding to $\phi_{11}$ and $\phi_{12}$ of the sixth embodiment and generated by the interferometer and object mirror, e.g., spurious internal multiple reflections of beams in the measurement and/or reference legs and/or departures of phase retardation plates and polarizing beam splitters from desired properties, can be corrected to a high level of precision, i.e., corrected up to second order effects in the product of cyclic errors and/or the absolute precision to which $\phi$ is known. The corresponding contributions of cyclic errors to a $\Phi$ of the third variant of the sixth embodiment, the $\Phi$ corresponding to the $\Phi$ of the sixth embodiment, are thus corrected to a level of precision higher than in the sixth embodiment, i.e., corrected up to third order effects in products of cyclic errors and/or the absolute precision to which $\phi$ is known.

The remaining description of the third variant of the sixth embodiment is the same as corresponding portions of the descriptions given for the third and sixth embodiments.

The advantage of the third variant of the sixth embodiment is realized when the cyclic errors in phases of the third variant of the sixth embodiment corresponding to $\phi_{11}$ and $\phi_{12}$ of the sixth embodiment are primarily generated by the interferometer and object mirror, e.g., spurious internal multiple reflections of beams in the measurement and/or reference legs and/or departures of phase retardation plates and polarizing beam splitters from desired properties.

A fourth variant of the sixth embodiment from the other group of variants of the sixth embodiment comprises the apparatus and method of the sixth embodiment and the apparatus and method of the second embodiment of the present invention. For the fourth variant of the sixth embodiment, substantially all of the cyclic errors present in phases of the fourth variant of the sixth embodiment corresponding to $\phi_{11}$ and $\phi_{12}$ of the sixth embodiment can be corrected to a high level of precision, that precision typically being at least second order in products of cyclic errors and/or an absolute precision to which $\phi$ is known. The corresponding contributions of cyclic errors to a $\Phi$ of the fourth variant of the sixth embodiment, the $\Phi$ corresponding to the $\Phi$ of the sixth embodiment, are thus corrected to a level of precision higher than for the corresponding $\Phi$ in the sixth embodiment, that precision typically being at least third order in products of cyclic errors and/or an absolute precision to which $\phi$ is known.

The remaining description of the fourth variant of the sixth embodiment is the same as corresponding portions of the descriptions given for the second and sixth embodiments.

The principal advantage of the fourth variant of the sixth embodiment in relation to the second and third variants of the sixth embodiment is in the substantially complete determination of the cyclic errors corresponding to $\phi_{11}$ and $\phi_{12}$ of the sixth embodiment, cyclic errors arising from the interferometer system including the source and detectors present, the second and third variants of the sixth embodiment permitting a determination of a subset of cyclic errors.

A fifth variant of the sixth embodiment from the other group of variants of the sixth embodiment comprises the apparatus and method of the sixth embodiment and the apparatus and method of the fifth embodiment of the present invention. In the fifth variant of the sixth embodiment, the apparatus and methods of the fifth embodiment are operative for only certain beams and/or beam components, those beams and/or beam components having one of the two different wavelengths, $\lambda_{11}$ or $\lambda_{12}$.

For the purpose of discussion, let the beams and/or beam components with wavelength $\lambda_{11}$ be the certain beams and/or beam components. In a first step of the fifth variant of the sixth embodiment, the cyclic errors present in the certain beams and/or beam components and in particular in a phase corresponding to $\phi_{11}$ of the sixth embodiment are determined by application of the procedures of the fifth embodiment. In a second step of the fifth variant of the sixth embodiment, cyclic errors present in certain other of the beams and/or beam components, those beams and/or beam components having wavelength $\lambda_{12}$, are determined in a Fourier analysis of a phase corresponding to $\phi_{12}$ of the sixth embodiment using for the variable of integration in the Fourier analysis $\phi_{11}$ corrected for effects of cyclic errors. Either $\phi_{11}$ or $\phi_{12}$ corrected for effects of cyclic errors is then used to determine effects of cyclic errors in a $\Phi$ of the fifth variant of the sixth embodiment, the $\Phi$ corresponding to the $\Phi$ of the sixth embodiment.

For the fifth variant of the sixth embodiment, substantially all of the cyclic errors present in phases corresponding to $\phi_{11}$ and $\phi_{12}$ of the sixth embodiment can be corrected to a high level of precision, a level of precision the same as the level of precision achieved in the fifth embodiment. The corresponding contributions of cyclic errors to $\Phi$ of the fifth variant of the sixth embodiment are thus corrected to a level of precision higher than for the corresponding $\Phi$ in the sixth embodiment.

The remaining description of the fifth variant of the sixth embodiment is the same as corresponding portions of the descriptions given for the fifth and sixth embodiments.

The principal advantage of the fifth variant of the sixth embodiment in relation to the second and third variants of the sixth embodiment is substantially the same as the advantage described for the fourth variant of the sixth embodiment in relation to the second and third variants of the sixth embodiment.

Figure 7:
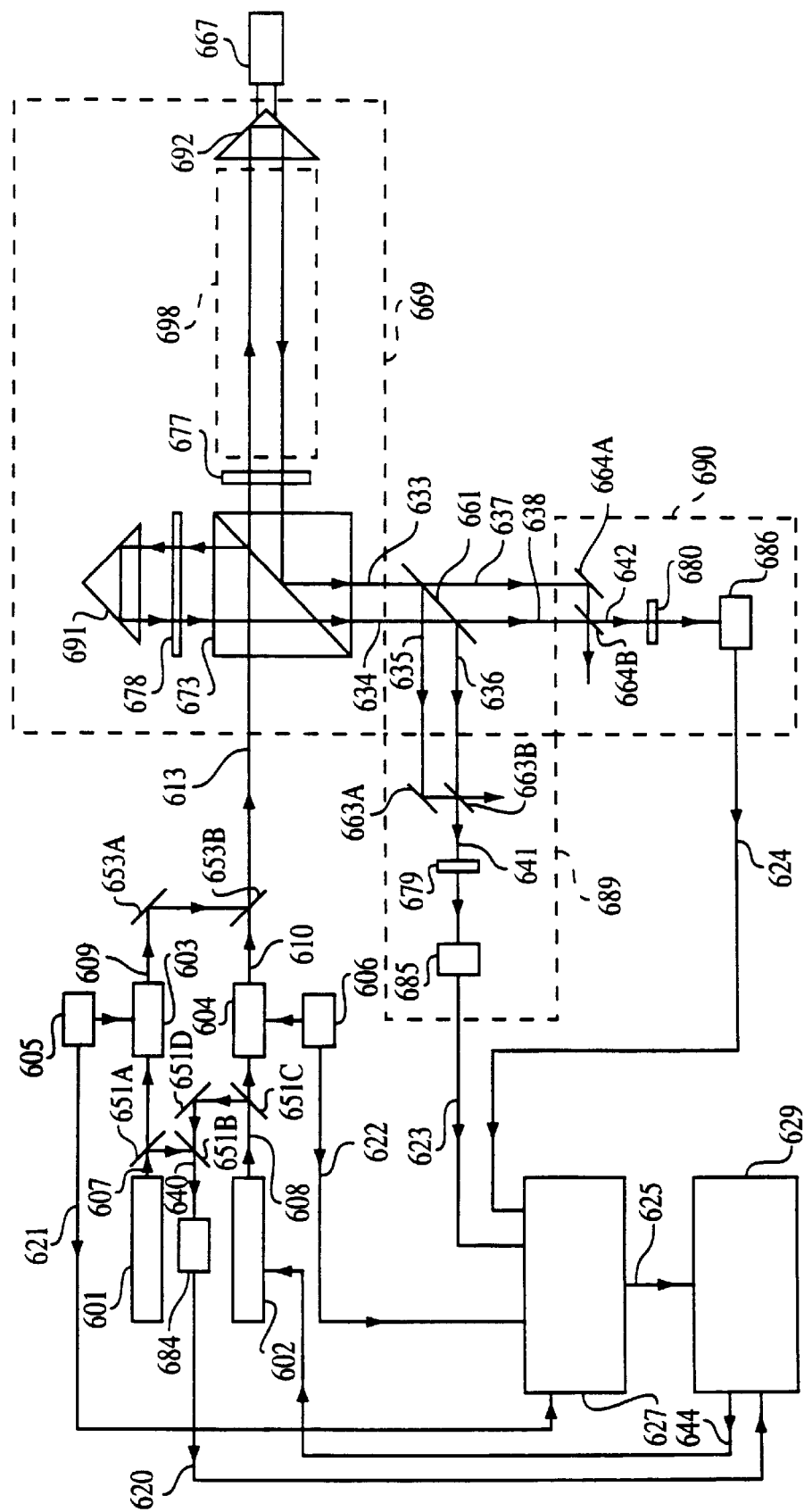
FIG. 7 is a schematic diagram of an embodiment of an interferometry system that characterizes and corrects cyclic errors by using a frequency modulator and analyzing dispersion measurements.

FIG. 7 depicts, in schematic form, a seventh preferred embodiment of the present invention from the fourth group of embodiments. Embodiments of the fourth group of embodiments comprise apparatus and methods for measuring and correcting for cyclic errors in both the measured phase used for determination of changes in optical path length of a measurement path in a distance measuring interferometer and the associated optical dispersion related signal used to correct the changes in optical path length for effects of gas in the measuring path of the distance measuring interferometer.

The distance measuring interferometry of the seventh embodiment comprises apparatus and method for measuring and monitoring the dispersion of a gas in a measurement path and/or the change in the optical path length of the measurement path due to the gas wherein the refractive index of the gas and/or the physical length of the measurement path may be changing and where the ratio of the wavelengths of the light beams generated by the adopted light sources is matched to a known ratio value comprised of the ratio of low order nonzero integers and/or nonintegers.

Many elements of the seventh embodiment perform like functions as elements of the sixth embodiment, the number of an element of the seventh embodiment performing a like function as an element of the sixth embodiment being equal to the number of the element of the sixth embodiment incremented by 100. The descriptions of sources 601 and 602 are the same as corresponding portions of the descriptions given for sources 501 and 502 of the sixth embodiment except with respect to the control of the wavelength of source 602. Sources 601 and 602 generate beams 607 and 608, respectively, with wavelengths $\lambda_{13}$ and $\lambda_{14}$, respectively. The wavelength $\lambda_{14}$ of the beam from source 602 is controlled by error signal 644 from computer and controller 629.

As shown in FIG. 7, a first portion of beam 607 is reflected by nonpolarizing beam splitter 651A and a portion thereof reflected by dichroic beam splitter 651B to form a first component of beam 640. In a next step, a first portion of beam 608 is reflected by nonpolarizing beam splitter 651C, reflected by mirror 651D, and a portion thereof transmitted by dichroic beam splitter 651B to form a second component of beam 640. Beam 640 impinges on wavelength monitor 684 of a well known type configured to monitor the ratio $(\lambda_{13}/\lambda_{14})$. The measured value of the ratio $(\lambda_{13}/\lambda_{14})$ is transmitted to computer and controller 629 as electronic signal 620. Wavelength monitor 684 may comprise, e.g. interferometers with or without a vacuum in a measurement leg and/or nonlinear elements such as $\beta$-BaBO$_3$ to double the frequency of a beam by second harmonic generation, SHG.

Computer and controller 629 generates error signal 644 related to the difference between the measured value of wavelength ratio $(\lambda_{13}/\lambda_{14})$, the ratio as received from signal 620, and a ratio specified by computer and controller 629. The wavelength of source 602 is controlled by error signal 644. Error signal 644 may control the wavelength, for example, of a laser by controlling the length of the laser cavity with a piezoelectric transducer or of a diode laser by controlling the injection current of the diode laser.

Continuing with FIG. 7, a second portion of beam 607 is transmitted by nonpolarizing beam splitter 651A to form the $\lambda_{13}$ component of beam 613 by steps the description thereof being the same as corresponding portions given in the sixth embodiment respect to the $\lambda_{11}$ component of beam 513 being derived beam 507. A second portion of beam 608 is transmitted by nonpolarizing beam splitter 651C to form the $\lambda_{14}$ component of beam 613 by steps the description thereof being the same as corresponding portions given in the sixth embodiment respect to the $\lambda_{12}$ component of beam 513 being derived beam 508.

The description of the propagation of beam 613 through interferometer 669 and the generation of electrical interference signals, heterodyne signals $s_{13}$ and $s_{14}$, transmitted as signals 623 and 624, respectively, is the same as corresponding portions of the description given for the sixth embodiment with respect to the propagation of beam 513 through interferometer 569 and the generation of electrical interference signals $s_{11}$ and $s_{12}$ transmitted as signals 523 and 524, respectively.

The descriptions of the properties of heterodyne signals $s_{13}$ and $s_{14}$ and respective $\phi_{13}$ and $\phi_{14}$ are the same as the corresponding portions of the descriptions given for the properties of heterodyne signals $s_{11}$ and $s_{12}$ and respective phases $\phi_{11}$ and $\phi_{12}$ of the sixth embodiment. Further, equations corresponding to Eqs. (71) through (90) for the seventh embodiment are obtained from Eqs. (71) through (90) by the replacement of all subscripts 11 with subscripts 13 and the replacement of a subscripts 12 with subscripts 14.

A procedure is described for the determination of the cyclic errors in $\phi_{13}$, $\phi_{14}$, and $\Phi$. It will be evident to those skilled in the art that variations of the described procedure can be employed without departing from the spirit and scope of the present invention.

In a first step of the procedure, $\Phi$ is measured as a function $\phi_{13}$ and $\phi_{14}$ for a given range in $\phi_{14}$ and for a set of values for $\lambda_{13}/\lambda_{14}$, the required number of different values of $\lambda_{13}/\lambda_{14}$ being dependent on the complexity of $\psi_{13}$ and $\psi_{14}$ and the precision required for the measured values of $\psi_{13}$ and $\psi_{14}$. The change in values of $\lambda_{13}/\lambda_{14}$ is effected by computer and controller 629 by making changes in $\lambda_{14}$ through error signal 644. From the measured values of $\Phi$, measured values of the quantity $$\psi_{14}[\phi_{14}+n_{14}(2\pi\Delta v_{14}/c)L]-\psi_{14}(\phi_{14}) \qquad (99)$$

are obtained where $\Delta v_{14}$ is defined as $$\Delta v_{14} \equiv c\left(\frac{1}{\lambda_{14}} - \frac{1}{\lambda_{14,0}}\right) \qquad (100)$$

and $\lambda_{14,0}$ is an initial value of $\lambda_{14}$.

The expression for $\{\psi_{14}[\phi_{14}+n_{14}(2\pi\Delta v_{14}/c)L]-\psi_{14}(\phi_{14})\}$ given by Eq. (99) can be written as $$\{\psi_{14}[\varphi_{14} + n_{14}(2\pi\Delta v_{14}/c)L] - \psi_{14}(\varphi_{14})\} = \qquad (101)$$
$$\sum_{r=1} a_{14,r}\{\cos r[\varphi_{14} + n_{14}(2\pi\Delta v_{14}/c)L] - \cos r(\varphi_{14})\} +$$
$$\sum_{r=1} b_{14,r}\{\sin r[\varphi_{14} + n_{14}(2\pi\Delta v_{14}/c)L] - \sin r(\varphi_{14})\}.$$

The Fourier coefficients $a_{14,r}$ and $b_{14,r}$ can be determined by the same type of iterative procedure described for the first embodiment. The result of that analysis is a determination of $\psi_{14}$ for the given range in $\phi_{14}$.

In a next step, the Fourier coefficients $a_{13,r}$ and $b_{13,r}$ are determined by a Fourier analysis of $\Phi$ for a given range in $\phi_{13}$ corresponding to the given range in $\phi_{14}$ using $(n_{13}/n_{14})(\phi_{14}-\psi_{14})$ as the variable of integration. The result of this step is the determination of $\psi_{13}$ for the range of $\phi_{13}$ used in the Fourier analysis.

In a next step, the $\psi_{13}$ and $\psi_{14}$ obtained in the first two steps are used to compute $Q_\psi$ for the given range in $\phi_{14}$. With the determination of $\psi_{13}$, $\psi_{14}$, and $Q_\psi$, the dispersion $(n_{14}-n_{13})$ and changes in path length corrected for effects of gas in the measurement path can be computed that are corrected for cyclic errors over the given range in $\phi_{14}$.

The procedure is repeated for other range values of $\phi_{14}$ as required for the end use application.

Note that the values for $l_{13}$ and $l_{14}$ for the seventh embodiment may comprise both integer and noninteger nonzero values in comparison to the sixth embodiment wherein $l_{11}$ and $l_{12}$ comprise nonzero integer values.

The remaining description of the seventh embodiment is the same as corresponding portions of the descriptions given for the fifth and sixth embodiments.

An advantage of the seventh embodiment is the capability to measure and monitor on line the effects of cyclic errors at the same time that compensation for refractivity effects of gas in the measuring path of a distance measuring interferometer is being performed.

Another advantage of the seventh embodiment is that the adopted wavelengths may be either harmonically related or nonharmonically related.

Another advantage of the seventh embodiment is that the determined values for the cyclic errors have a reduced sensitivity to the effects of turbulence in the gas present in a measuring path, that is the statistical accuracy to which the cyclic errors are determined is only weakly dependent on the effects of turbulence in the gas in the measuring path.

Another advantage of the seventh embodiment is that the cyclic errors can change as the physical length of the measuring path is changed without substantially altering the effectiveness of the seventh embodiment with regard to correcting for the effects of cyclic errors. The values for the logarithmic derivative of the cyclic errors with respect to the measurement path length that will not substantially alter the effectiveness of the seventh embodiment with regard to correcting for the effects of cyclic errors will depend in part on the precision required in correcting for the cyclic errors.

FIGS. 8a and 8b depict, in schematic form, an eighth preferred embodiment of the present invention from the fourth group of embodiments. Embodiments of the fourth group of embodiments comprise apparatus and methods for measuring and correcting for effects of cyclic errors in both the measured phase used for determination of changes in optical path length of a measurement path in a distance measuring interferometer and the associated optical dispersion related signal used to correct the changes in optical path length for effects of gas in the measuring path of the distance measuring interferometer.

The distance measuring interferometry of the eighth embodiment comprises apparatus and method for measuring and monitoring the dispersion of a gas in a measurement path and/or the change in the optical path length of the measurement path due to the gas wherein the refractive index of the gas and the physical length of the measurement path may be changing and where the ratio of the wavelengths of the light beams generated by the adopted light sources is matched to a certain relative precision to a known ratio value comprised of nonzero low order integers and non integers.

Many elements of the eighth embodiment perform like functions as elements of the seventh embodiment and unless indicated otherwise, the number of an element of the eighth embodiment performing a like function as an element of the seventh embodiment being equal to the number of the element of the seventh embodiment incremented by 100. The descriptions of sources 701 and 702B are the same as corresponding portions of the descriptions given for sources 601 and 602, respectively, of the seventh embodiment. The description of source 702A is the same as corresponding portions of the description given for source 602 of the seventh embodiment except that the wavelength of source 702A is fixed. Sources 701, 702A, and 702B generate beams 707, 708A, and 708B, respectively, with wavelengths $\lambda_{15}$, $\lambda_{16A}$, and, $\lambda_{16B}$, respectively. Beams 707, 708A, and 708B are polarized in the plane of FIG. 8.

Wavelength $\lambda_{16B}$ of the beam from source 702B is controlled by error signal 744 from computer and controller 729. For the eighth embodiment, $(\lambda_{16A}-\lambda_{16B})>0$ and $|\lambda_{16A}-\lambda_{16B}|<<\lambda_{16B}$ in order to illustrate in a simple manner the present invention. The eighth embodiment may be configured to operative for negative values for $(\lambda_{16A}-\lambda_{16B})$ and/or for $|\lambda_{16A}-\lambda_{16B}|\vartheta\lambda_{16A}$ without departing from the scope and spirit of the present invention. For configurations of the apparatus of the eighth embodiment where the condition $|\lambda_{16A}-\lambda_{16B}|<<\lambda_{16B}$ is not applicable, it may be desirable to change certain of the nonpolarizing beam splitters described for the eighth embodiment to dichroic beam splitters to improve overall efficiency of the source and interferometer system.

Figure 8:
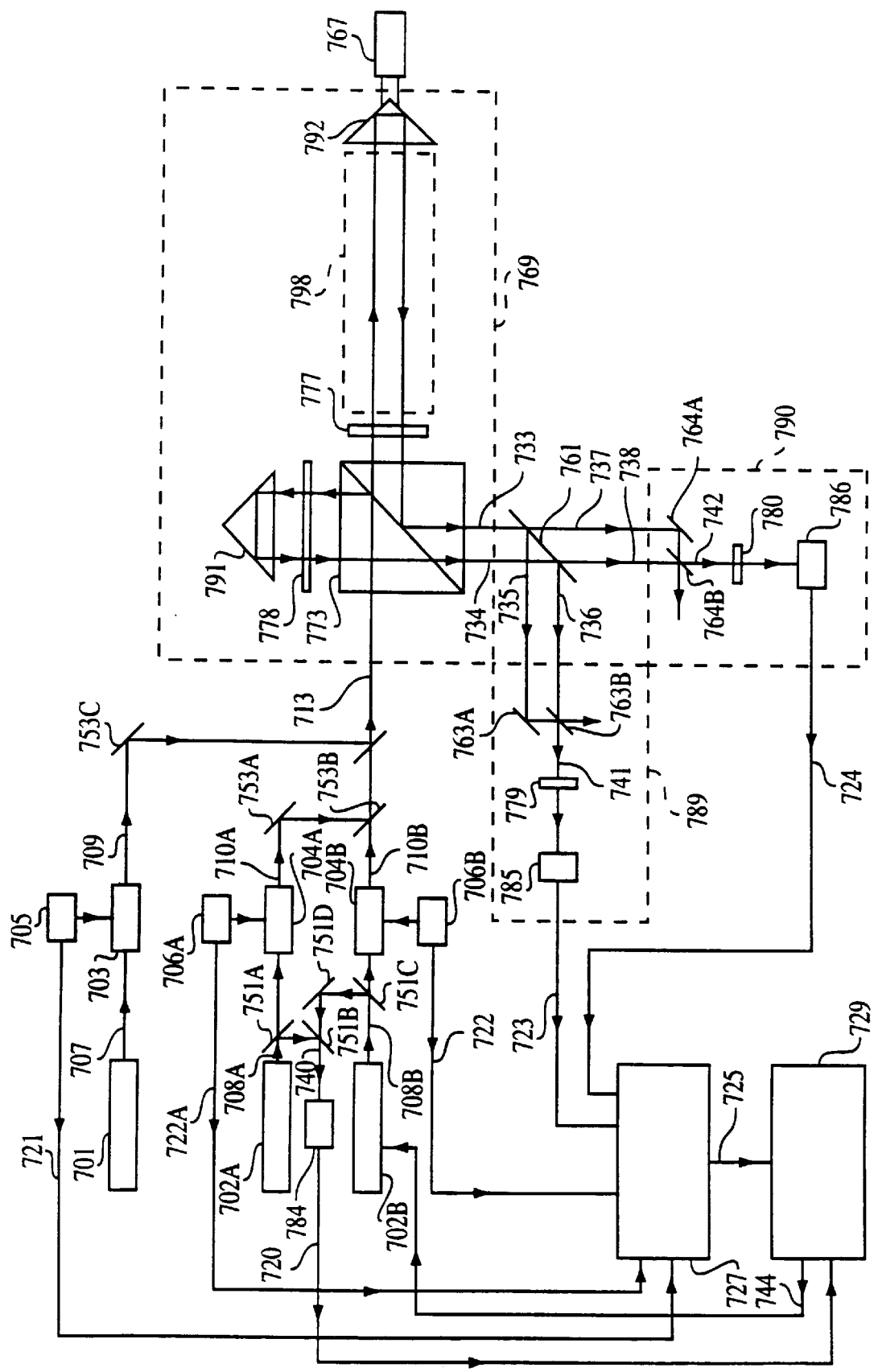
FIG. 8 is a schematic diagram of another embodiment of an interferometry system that characterizes and corrects cyclic errors by using a frequency modulator and analyzing dispersion measurements.

As shown in FIG. 8, a first portion of beam 708A is reflected by nonpolarizing beam splitter 751A and a portion thereof reflected by a nonpolarizing beam splitter 751B to form a first component of beam 740. In a next step, a first portion of beam 708B is reflected by nonpolarizing beam splitter 751C, reflected by mirror 751D, and a portion thereof transmitted by nonpolarizing beam splitter 751B to form a second component of beam 740. Beam 740 impinges on wavelength monitor 784 of a well known type configured to monitor the ratio $(\lambda_{16A}/\lambda_{16B})$. The measured value of the ratio $(\lambda_{16A}/\lambda_{16B})$ is transmitted to computer and controller 729 as electronic signal 720. Wavelength monitor 784 may comprise, for example, interferometers with or without a vacuum in a measurement leg and/or nonlinear elements such as $\beta$-BaBO$_3$ to double the frequency of a beam by second harmonic generation, SHG.

Computer and controller 729 generates error signal 744 related to the difference between the measured value of the wavelength ratio $(\lambda_{16A}/\lambda_{16B})$ the ratio received by signal 720, and a ratio specified by computer and controller 729. The wavelength of source 702B is controlled by error signal 744. Error signal 744 may control, for example, the wavelength of a laser by controlling the length of the laser cavity with a piezoelectric transducer or the wavelength of a diode laser by controlling the injection current of a diode laser.

Continuing with FIG. 8, a second portion of beam 708A is transmitted by nonpolarizing beam splitter 751A, enters modulator 704A, and exits modulator 704A as beam 710A comprised of two coextensive frequency components. Beam 710A is reflected by mirror 753A, a portion thereof reflected by nonpolarizing beam splitter 753B, and a portion thereof transmitted by dichroic beam splitter 753D to form the $\lambda_{16A}$ component and frequency shifted $\lambda_{16A}$ component of beam 713. A second portion of beam 708B is transmitted by nonpolarizing beam splitter 751C, enters modulator 704B, and exits modulator 704B as beam 710B comprised of two coextensive frequency components. A portion of beam 710B is transmitted by nonpolarizing beam splitter 753B and a portion thereof transmitted by dichroic beam splitter 753D to form the $\lambda_{16B}$ component and frequency shifted $\lambda_{16B}$ component of beam 713. Beam 707 enters and exits modulator 703 as beam 709 comprised of two coextensive frequency components. Beam 709 is reflected by mirror 753C and a portion thereof reflected by dichroic beam splitter 753D to form the $\lambda_{15}$ component and frequency shifted $\lambda_{15}$ component of beam 713.

The descriptions of the modulators 703, 704A, and 704B and associated drivers 705, 706A, and 706B are the same as corresponding portions of descriptions given for drivers 603 and 604 and associated drivers 605 and 606 of the seventh embodiment. The frequency shifts introduced by modulators 703, 704A, and 704B are $f_1$, $f_{2A}$, and $f_{2B}$, respectively. The nonfrequency shifted components of beam 713 are polarized in the plane of FIG. 8 and the frequency shifted components of beam 713 are polarized orthogonal to the plane of FIG. 8.

The description of the propagation of beam 713 through interferometer 769 and the generation of electrical interference signals, comprising heterodyne signal $s_{15}$ transmitted as signal 723 and heterodyne signals $s_{16A}$ and $s_{16B}$ transmitted as signal 724, is the same as corresponding portions of the description given for the seventh embodiment with respect to the propagation of beam 613 through interferometer 669 and the generation of electrical interference signals $s_{13}$ and $s_{14}$ transmitted as signals 523 and 524, respectively.

The descriptions of properties of heterodyne signals $s_{15}$, $s_{16A}$, and $s_{16B}$ and respective phases $\phi_{15}$, $\phi_{16A}$ and $\phi_{16B}$ are the same as the corresponding portions of the descriptions given for the properties of heterodyne signals $s_{13}$ and $s_{14}$ and respective phases $\phi_{13}$ and $\phi_{14}$ of the seventh embodiment and the same as corresponding portions of the descriptions given for the properties of heterodyne signals $s_9$ and $s_{10}$ and respective phases $\phi_9$ and $\phi_{10}$ of the fifth embodiment.

The system comprised of sources 702A and 702B, interferometer 769, detector systems 789 and 790, electronic processor 727, and computer and controller 729 is functionally equivalent to the corresponding system of the fifth embodiment depicted in FIG. 5a. In addition, the system comprised of sources 701 and 702B, interferometer 769, detector systems 789 and 790, electronic processor 727, and computer and controller 729 is functionally equivalent to the corresponding system of the seventh embodiment depicted in FIG. 7. Thus, the cyclic errors present in each of the measured phases $\phi_{15}$, $\phi_{16A}$ and $\phi_{16B}$ can be determined by procedures described in the fifth and seventh embodiments.

The remaining description of the eighth embodiment is the same as corresponding portions of the descriptions given for the fifth and seventh embodiments.

The advantages of the eighth embodiment are the same as listed for the seventh embodiment with the following additional advantage. With the eighth embodiment, the distance measuring function and the dispersion based system for compensating for gas in the measuring path, including turbulence effects in the gas, can be executed with two fixed wavelengths, $\lambda_{15}$ and $\lambda_{16A}$, simultaneous with and independent of the cyclic error compensating procedure based on the variable wavelength $\lambda_{16B}$ and one of the fixed wavelengths, either $\lambda_{15}$ or $\lambda_{16A}$.

The distance measuring and dispersion interferometry of the apparatus and method of sixth, seventh, and eight embodiments of the present invention are of two types of distance measuring and dispersion interferometry apparatus and method described in commonly owned U.S. patent application Ser. No. 09/078,254 filed May 13, 1998 and entitled "Interferometric Apparatus And Methods Using Electronic Frequency Processing For Measuring And Compensating For Refractive Index Effects In An Optical Path" and in U.S. Provisional Patent Application No. 60/075,586 filed Feb. 23, 1998 and entitled "Interferometer And Method For Measuring The Refractive Index And Optical Path Length Effects Of Air," both applications by Peter de Groot, Henry A. Hill, and Frank C. Demarest. Other forms of distance measuring and dispersion interferometers and methods such as described in commonly owned U.S. Provisional Patent Application No. 60/075,586, ibid., U.S. patent application Ser. No. 09/078,254, ibid., U.S. patent application Ser. No. 09/078,163 filed May 13, 1998 and entitled "Apparatus And Methods Using Multiple Pass Interferometry For Measuring And Compensating For Refractive Index Effects In An Optical Path" by Henry Allen Hill, Peter J. de Groot, and Franklin C. Demarest, and U.S. Provisional Patent Application No. 60/075,566 filed Feb. 2, 1998 and entitled "Apparatus And Method For Measuring The Refractive Index And Optical Path Effects Of Air Using Interferometry" by Henry A. Hill, Peter de Groot, and Franklin C. Demarest may be incorporated into the apparatus and method of the present invention without departing from the spirit or scope of the present invention, the foregoing applications being incorporated herein in their entirety by reference.

FIGS. 9 depicts, in schematic form, a ninth preferred embodiment of the present invention from the fourth group of embodiments. Many elements of the ninth embodiment perform like functions as elements of the eighth embodiment and unless indicated otherwise, the number of an element of the ninth embodiment performing a like function as an element of the eighth embodiment being equal to the number of the element of the corresponding eighth embodiment incremented by 100. The primary difference between the ninth and eithth embodiment is the use of nonlinear elements, e.g., $\beta$-BaBO$_3$, to double the frequency of certain beams and/or beam components by SHG in source systems and in detector systems of the ninth embodiment.

Figure 9A:
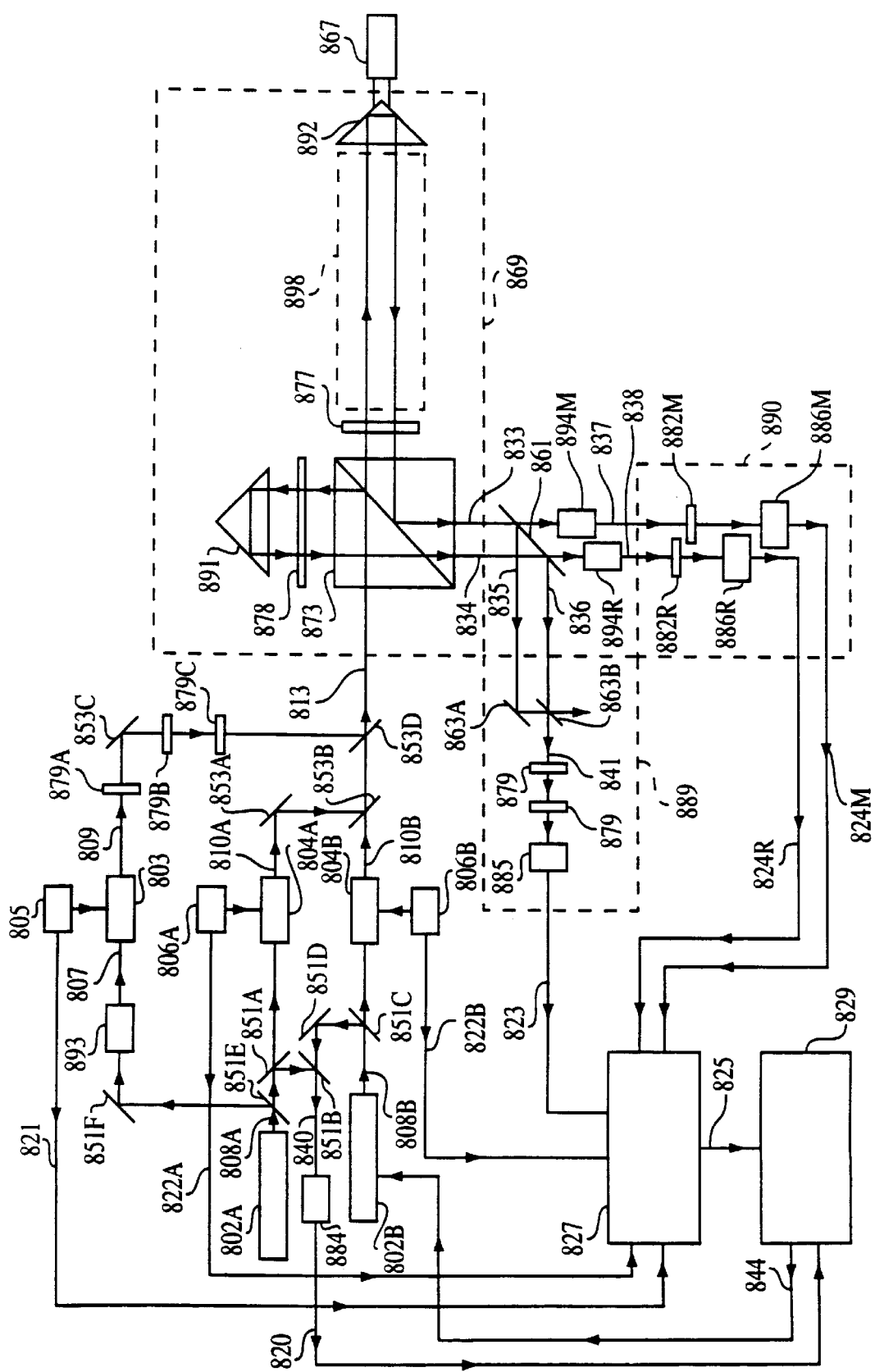
FIG. 9a is a schematic diagram of another embodiment of an interferometry system that characterizes and corrects cyclic errors by using a frequency modulator and analyzing dispersion measurements.

For the ninth embodiment as depicted in FIG. 9a, the descriptions of sources 802A and 802B and corresponding beams 808A and 808B are the same as corresponding portions of the descriptions given for sources 702A and 702B and corresponding beams 708A and 708B of the eighth embodiment. The description of the generation of beam 840 in the eighth embodiment from a portion of beam 808A transmitted by nonpolarizing beam splitter 851E and of beam 808B is the same as the portion of the description given for the generation of beam 740 in the eighth embodiment from beams 708A and 708B. The description of the generation of a $\lambda_{18A}$ component, a frequency shifted $\lambda_{18A}$ component, $\lambda_{18B}$ component, and a frequency shifted $\lambda_{18B}$ component of beam 813 in the ninth embodiment from a portion of beam 808A transmitted by nonpolarizing beam splitter 851E and of beam 808B is the same as the portion of the description given for the generation of the $\lambda_{16A}$ component, a frequency shifted $\lambda_{16A}$ component, a $\lambda_{16B}$ component, and a frequency shifted $\lambda_{16B}$ component of beam 713 in the eighth embodiment from beam 708A and of beam 708B. The frequencies of drivers 806A and 806B are $f_2$ and $f_3$, respectively, so that the frequency shifts of the frequency shifted $\lambda_{18A}$ component and the frequency shifted $\lambda_{18B}$ component of beam 813 are $f_2$ and $f_3$, respectively.

Beam 807 is generated from a second portion of beam 808A (see FIG. 9a), the second portion of beam 808A being reflected by nonpolarizing beam splitter 851E, reflected by mirror 851F, and transmitted by nonlinear element 893. Beam 807 is comprised of two frequency components, one component with wavelength $\lambda_{18A}$ and a frequency doubled component with wavelength $\lambda_{18A}/2$. The frequency doubled component is generated by SHG in nonlinear element 893. The description of the generation of beam 809 from beam 807 is the same as corresponding portions of the description given for the generation of beam 709 in the eighth embodiment from beam 707. The frequency of driver 805 is $f_1$.

Beam 809 is comprised of three spatially coextensive frequency components, the components being a $\lambda_{18A}$ component, a $\lambda_{18A}/2$ component, and a frequency shifted $\lambda_{18A}/2$ component. The frequency shift of the frequency shifted $\lambda_{18A}/2$ component is $f_1$. The $\lambda_{18A}/2$ and frequency shifted $\lambda_{18A}/2$ components of beam 809 are polarized orthogonal to and in the plane of FIG. 9a, respectively. The frequency shifted $\lambda_{18A}/2$ component of beam 809 is transmitted by optical filter 879A, reflected by mirror 853C, transmitted by polarizer 879B, transmitted by half wave plate 879C, and a portion thereof reflected by dichroic beam splitter 853D to form a frequency shifted $\lambda_{18A}/2$ component of beam 813. Half wave phase retardation plate 879C is oriented so as to rotate the polarization of incident frequency shifted $\lambda_{18A}/2$ beam component by 45 degrees. Polarizer 879B is oriented to transmit the frequency shifted $\lambda_{18A}/2$ component of beam 809 and to block the $\lambda_{18A}/2$ component of beam 809. The optical filter 879A blocks the $\lambda_{18A}$ component of beam 809.

The descriptions of the modulator 803 and driver 805 are the same as corresponding portions of descriptions given for driver 703 and driver 705 of the eighth embodiment. The frequency shift introduced by modulator 803 is $f_1$.

Beam splitter 873 depicted in FIG. 9a comprises a polarizing beam splitter interface for the two groups of frequency components of beam 813. One group of the two groups of frequency components comprise a $\lambda_{18A}$ component, a frequency shifted $\lambda_{18A}$ component, a $\lambda_{18B}$ component, and a frequency shifted $\lambda_{18B}$ component. A second group of the two groups of frequency components comprise a frequency shifted $\lambda_{18A}/2$ component. In addition, phase retardation plates 877 and 878 are quarter wave phase retardation plates for the first and second groups of the frequency components of beam 813.

Beam 813 enters interferometer 869 (see FIG. 9a) and exits as two spatially separated exit beams 833 and 834. The $\lambda_{18A}$ component and frequency shifted $\lambda_{18A}$ component of beam 813 are measurement and reference beams, respectively, and exit interferometer 869 as components of beams 833 and 834, respectively. The $\lambda_{18B}$ component and frequency shifted $\lambda_{18B}$ component of beam 813 are measurement and reference beams, respectively, and exit interferometer 869 as other components of beams 833 and 834, respectively. A first portion of the frequency shifted $\lambda_{18A}/2$ component of beam 813 is transmitted by polarizing beam splitter 873 and exits interferometer 869 as a certain other component of exit beam 833. A second portion of the frequency shifted $\lambda_{18A}/2$ component of beam 813 are reflected by polarizing beam splitter 873 and exits interferometer 869 as a certain other component of exit beam 834.

Exit beams 833 and 834 contain information at $\lambda_{18A}$ and $\lambda_{18B}$ about the optical path length in the measuring path including the path through the gas 898 and about the optical path length through the reference path, respectively. A first portion of each of beams 833 and 834 are reflected by nonpolarizing beam splitter 861 as beams 835 and 836, respectively. The description of the propagation of beams 835 and 836 through detector 889 to generate electrical interference signals, heterodyne signals $s_{18A}$ and $s_{18B}$, is the same, except for optical filter 879D, as corresponding portions of the description given for the eighth embodiment with respect to the propagation of beams 735 and 736 through detector 789 to generate heterodyne signals $s_{16A}$ and $s_{16B}$, respectively. Optical filter 879D transmits the first group of frequency components of beam 841 and blocks the second group of frequency components of beam 841.

A second portion of beam 833 is transmitted by nonpolarizing beam splitter 861, enters nonlinear element 894M, and exits nonlinear element 894M as beam 837 comprised of five coextensive components, a $\lambda_{18A}$ component, a $\lambda_{18B}$ component, a second $\lambda_{18A}/2$ component, a second $\lambda_{18B}/2$ component, and a frequency shifted $\lambda_{18A}/2$. The second $\lambda_{18A}/2$ component and second $\lambda_{18B}/2$ component are generated by SHG in nonlinear element 894M from the $\lambda_{18A}$ component and the $\lambda_{18B}$ component, respectively. Beam 837 is incident on optical filter and polarizer 882M with portions thereof transmitted and incident on detector 886M.

A second portion of beam 834 is transmitted by nonpolarizing beam splitter 861, enters nonlinear element 894R, and exits nonlinear element 894R as beam 838 comprised of five spatially coextensive components, a frequency shifted $\lambda_{18A}$ component, a frequency shifted $\lambda_{18B}$ component, a frequency doubled, frequency shifted $\lambda_{18A}$ component, a frequency doubled, frequency shifted $\lambda_{18B}$ component, and a frequency shifted $\lambda_{18A}/2$. The frequency doubled, frequency shifted $\lambda_{18A}$ component and frequency doubled, frequency shifted $\lambda_{18B}$ component are generated by SHG in nonlinear element 894R from the frequency shifted $\lambda_{18A}$ component and the frequency shifted $\lambda_{18B}$ component, respectively. Beam 838 is incident on optical filter and polarizer 882R with portions thereof transmitted and incident on detector 886R.

Optical filter and polarizer 882M transmits the second $\lambda_{18A}/2$ component, the second $\lambda_{18B}/2$ component, and the frequency shifted $\lambda_{18A}/2$ component of beam 837 and optical filter and polarizer 882R transmits the frequency doubled, frequency shifted $\lambda_{18B}$ component, the frequency doubled, frequency shifted $\lambda_{18B}$ component, and the frequency shifted $\lambda_{18A}/2$ component of beam 838. Optical filter and polarizer 882M and optical filter and polarizer 882R further mix the polarization components of the beams 837 and 838, respectively. Optical filter and polarizer 882M further blocks a $\lambda_{18A}$ component and a $\lambda_{18B}$ component and optical filter and polarizer 882R further blocks a frequency shifted $\lambda_{18A}$ component and a frequency shifted $\lambda_{18B}$ component.

Interferometer 869 introduces phase shift $\phi_{18A}$ between the $\lambda_{18A}$ and the frequency shifted $\lambda_{18A}$ components of beam 841 and $\phi_{18B}$ between the $\lambda_{18B}$ and the frequency shifted $\lambda_{18B}$ components of beam 841.

Signal 824M comprises two heterodyne signals with heterodyne frequencies $f_1$ and $\{2[(1/\lambda_{18B})-(1/\lambda_{18A})]c-f_1\}$. Signal 824R comprises two heterodyne signals with heterodyne frequencies $(2f_2-f_1)$ and $\{2[(1/\lambda_{18B})-(1/\lambda_{18A})]c+2(f_3-f_1)\}$. The heterodyne signals with frequencies $\{2[(1/\lambda_{18B})-(1/\lambda_{18A})]c-f_1\}$ and $\{2[(1/\lambda_{18B})-(1/\lambda_{18A})]c+2(f_3-f_1)\}$ are rejected in electronic processor 827 by electronic filtering and therefore not included in subsequent description of the ninth embodiment.

Interferometer 869 further introduces phase shifts $\phi_{18M}$ and $\phi_{18R}$ between certain beam components of beams 837 and 838, respectively, the certain beam components that form heterodyne signals $s_{18M}$ and $s_{18R}$, respectively, with heterodyne frequencies $f_1$ and $(2f_2-f_1)$, respectively. The magnitude of phase shifts $\phi_{18M}$ and $\phi_{18R}$ are related to optical path lengths of respective paths according to the formulae $$\varphi_{18M} = L_M p[k_{18A/2,f_1} n(k_{18A/2,f_1}) - 2k_{18A}n(k_{18A})], \quad (102)$$
$$\varphi_{18R} = L_R p[k_{18A/2,f_1} n(k_{18A/2,f_1}) - 2k_{18A,f_2}n(k_{18A,f_2})],$$
where
$$k_{18A} = (2\pi/\lambda_{18A}), \quad (103)$$
$$k_{18A/2,f_1} = 2\pi[(2/\lambda_{18A}) + (f_1/c)],$$
$$k_{18A,f_2} = 2\pi[(1/\lambda_{18A}) + (f_2/c)],$$

lengths $L_M$ and $L_R$ represent the equivalent physical path lengths from respective sources to respective detectors for the measurement and reference legs, respectively.

The descriptions of the properties of heterodyne signals $s_{18A}$, $s_{18B}$, $s_{18M}$, and $s_{18R}$ in terms of respective phases $\phi_{18A}$, $\phi_{18B}$, $\phi_{18M}$, and $\phi_{18R}$ and respective measured phases $\phi_{18A}$, $\phi_{18B}$, $\phi_{18M}$, and $\phi_{18R}$ are the same as the corresponding portions of the description given for the properties of heterodyne signal $s_i$ and respective phase $\phi_i$ and respective measured phase $\phi_i$ of the first and subsequent embodiments.

Figure 9B:
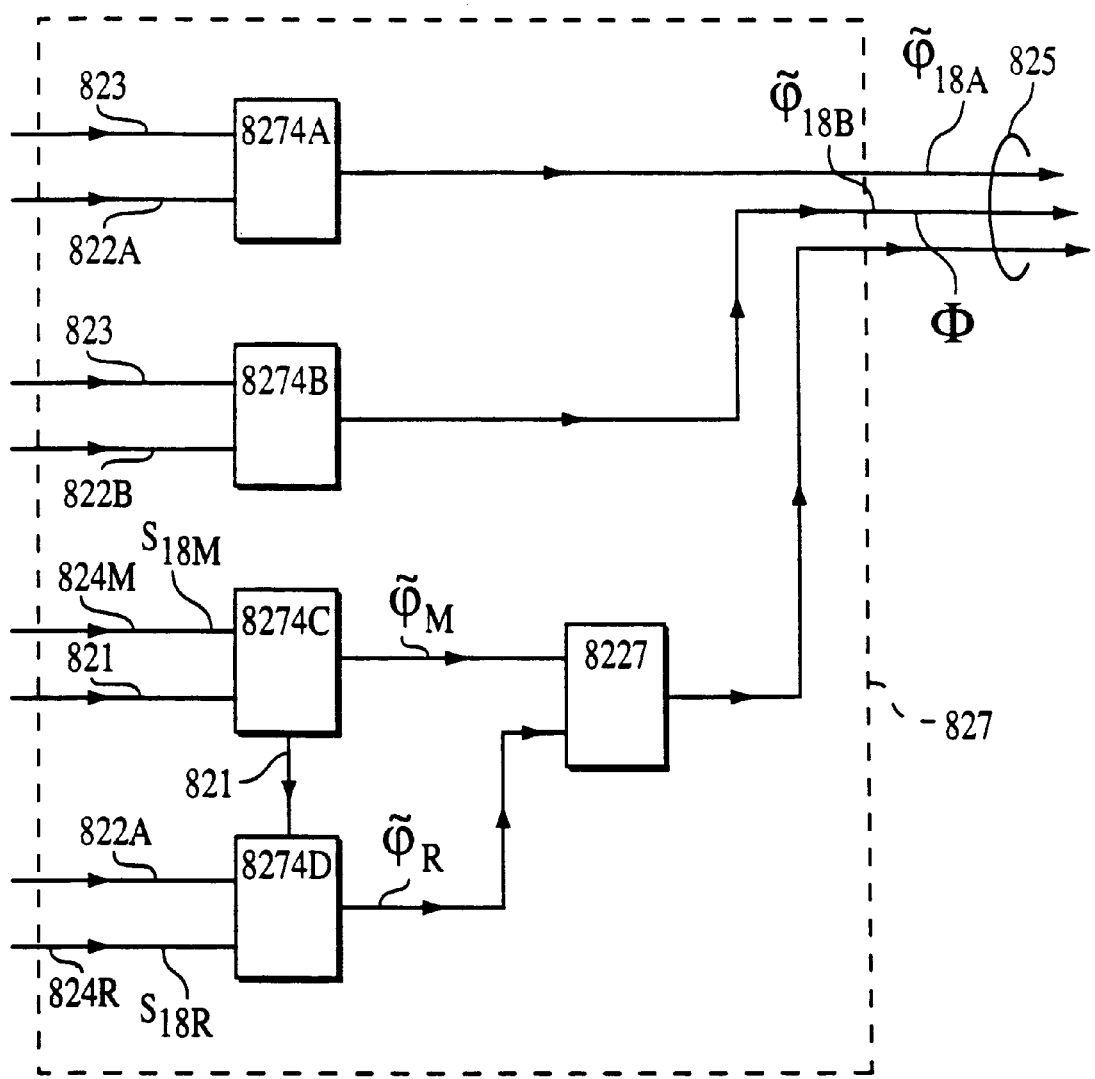

As shown in FIG. 9b, measured phases $\phi_{18A}$ and $\phi_{18B}$ are generated by phase detectors 8274A and 8274B, respectively, from signals heterodyne signals $s_{18A}$ and $s_{18B}$, respectively. The description of the phase detection is the same as the corresponding portions of the description given for the phase detection in electronic processor 27 of the first embodiment.

It is evident that the system comprised of sources 802A and 802B, interferometer 869, detector system 889, and processors 8274A and 8274B of electronic processor 827 of the ninth embodiment is functionally equivalent with respect to generation and processing heterodyne signals $s_{18A}$ and $s_{18B}$ for respective measured phases $\phi_{18A}$ and $\phi_{18B}$ to the system comprised of sources 702A and 702B, interferometer 769, detector system 789 and corresponding phase detectors of electronic processor 727 of the eighth embodiment with respect to generation and processing heterodyne signals $s_{16A}$ and $s_{16B}$ for respective measured phases $\phi_{16A}$ and $\phi_{16B}$. It is further evident that the system comprised of sources 802A and 802B, interferometer 869, detector system 889 and processors 8274A and 8274B of electronic processor 827 of the ninth embodiment is functionally equivalent with respect to generation and processing heterodyne signals $s_{18A}$ and $s_{18B}$ for respective measured phases $\phi_{18A}$ and $\phi_{18B}$ to the system comprised of sources 601 and 602, interferometer 669, detector system 689 and corresponding phase detectors of electronic processor 627 of the seventh embodiment with respect to generation and processing heterodyne signals $s_{13}$ and $s_{14}$ for respective measured phases $\phi_{13}$ and $\phi_{14}$. Thus, cyclic errors present in each of the measured phases $\phi_{18A}$ and $\phi_{18B}$ can be determined by procedures described in the seventh and eighth embodiments.

As shown in FIG. 9b, measured phases $\phi_{18M}$ and $\phi_{18R}$ are generated by phase detectors 8274C and 8274D, respectively, from signals heterodyne signals $s_{18M}$ and $s_{18R}$, respectively. The description of the phase detection is the same as the corresponding portions of the description given for the phase detection in electronic processor 27 of the first embodiment.

In a next step, a phase $\Phi$ is obtained by electronic processor 8277 as the difference between the measured phases $\phi_{18M}$ and $\phi_{18R}$, i.e., $$\Phi = \phi_{18M} - \phi_{18R}. \quad (104)$$

Phase $\Phi$ may be expressed in terms of other quantities according to the formula $$\Phi = Lp2k_{18A}[n(k_{18A}/2) - n(k_{18A})] + Z_\psi + Z \quad (105)$$

where $$Z_\psi = \psi_{18M} - \psi_{18R},$$
$$Z = L_R p2[(2\pi f_2)/c]n(k_{18A},f_2) + \zeta_{18M} - \zeta_{18R}, \quad (106)$$

phase offsets $\zeta_{18M}$ and $\zeta_{18R}$ comprising all contributions to the arguments $\alpha_{18M}$ and $\alpha_{18R}$, respectively, of $s_{18M}$ and $s_{18R}$, respectively, that are not related to the measurement and reference paths, respectively, and $\psi_{18M}$ and $\psi_{18R}$ comprise all cyclic errors in $\phi_{18M}$ and $\phi_{18R}$, respectively. The non-cyclic nonlinearities $\eta_{18M}$ and $\eta_{18R}$ have been omitted for reasons indicated in the description of the first embodiment.

The cyclic error term $Z_\psi$ may be expressed to a good approximation as $$Z_\psi = \sum_{r=1} a_{18M,r} \cos r\{Lp[k_{18A/2,f_1} n(k_{18A/2,f_1})]\} - \quad (107)$$
$$\sum_{r=1} a'_{18M,r} \cos r\{Lp[2k_{18A}n(k_{18A})]\} +$$
$$\sum_{r=1} b_{18M,r} \sin r\{Lp[k_{18A/2,f_1} n(k_{18A/2,f_1})]\} -$$
$$\sum_{r=1} b'_{18M,r} \sin r\{Lp[2k_{18A}n(k_{18A})]\}.$$

Eq. (107) for $Z_\psi$ can be rewritten in the form $$Z_\psi = \sum_{r=1} \overline{a}_{18M,r} \cos r\{Lp[2k_{18A}n(k_{18A})]\} + \quad (108)$$
$$\sum_{r=1} \overline{b}_{18M,r} \sin r\{Lp[2k_{18A}n(k_{18A})]\}$$

where $$\overline{a}_{18M,r} = a_{18M,r} \cos r\phi - a'_{18M,r} + b_{18M,r} \sin r\phi$$
$$\overline{b}_{18M,r} = b_{18M,r} \cos r\phi 31 \, b'_{18M,r} + a_{18M,r} \sin r\phi, \quad (109)$$

and $$\phi = Lp\{(2\pi f_1/c)n(k_{18A/2f_1}) + k_{18A/2f_1}[n(k_{18A/2f_1}) - n(k_{18A})]\}. \quad (110)$$

The effective wavelength associated with $\phi$ is of the order of $(\lambda_{18A})/[n(k_{18A/2f_1}) - n(k_{18A})]$, or $\cong 10^5 \lambda_{18A}$ for a gas comprised of air at 25° C. and at one atmosphere of pressure. Therefore, only the reduced set of coefficients $\overline{a}_{18M,r}$ and $\overline{b}_{18M,r}$ are a function of L. The reduced set of coefficients $\overline{a}_{18M,r}$ and $\overline{b}_{18M,r}$ is determined by a Fourier analysis of q using $\phi_{18A}$ as the variable of integration, the range of integration in $\phi_{18A}/k_{18A}$ being $<<10^5 \lambda_{18A}$ and $\geq \lambda_{18A}$. The phase $\phi_{18A}$ is the phase obtained from $\phi_{18A}$ with the compensation for cyclic errors described as an earlier step in the ninth embodiment.

The cyclic errors in $\Phi$ may also be reduced or eliminated by filtering with an integral transform such as described for the sixth embodiment.

The dispersion and changes in optical path length, respectively, compensated for cyclic errors are computed in the ninth embodiment using Eqs. (82), (83), (86), and (89), respectively, with the substitutions of $\phi_{18A}$, $\Phi$, $Z_\psi$, $Z$, $\zeta_{18A}$, and $\psi_{18A}$ of the ninth embodiment for $\phi_{11}$, $\Phi$, $Z_\psi$, $Z$, $\zeta_{11}$, and $\psi_{11}$ of the sixth embodiment with $\vartheta=0$, $(K/\chi)=0$, $\chi=2k_{18A}$, $l_{11}=2$, and $l_{12}=1$. Calculation of the dispersion corrected for the effects of cyclic errors can also be calculated using Eq. (105).

The remaining description of the ninth embodiment is the same as corresponding portions of the description given for the eighth embodiment.

The advantages of the ninth embodiment are the same as those described for the eighth embodiment.

It will be evident to those skilled in the art that beams used to generate signals for information to determine $\Phi$ may be pulsed beams without departing from the spirit and scope of the present invention. Pulsed beams can be used because of the slow rate of change in $\Phi$ as L is changed. The advantage of using pulsed beams is increased efficiency for generating a second harmonic of a beam using SHG, a pulsed mode of operation allowing increased beam power density during a pulse for the same average power density and the SHG efficiency being proportional to the square of the instantaneous power density of a beam in a nonlinear element.

A tenth embodiment of the present invention (not shown in the figures) is described from the third group of embodiments of the present invention. The tenth embodiment corresponds to the sixth embodiment the same as the ninth embodiment corresponds to the seventh embodiment.

For certain applications, only the effect of changes in the refractivity of the gas in the measuring path such as the result of turbulence in the gas need be compensated in a distance measuring interferometer. Under the condition that there are no other changes in $\phi_{18M}$ of the gas turbulence type, for example, that need be compensated, a variant of the ninth embodiment can beneficially be used wherein $\phi_{18R}$ is not measured. A similar variant of the tenth embodiment can beneficially be used for similar circumstances.

The description of the sixth embodiment noted the enhanced sensitivity to the effects of cyclic errors of measurements of dispersion of a gas relative to the sensitivity to effects of cyclic errors of measurements of refractivity of a gas and enhanced sensitivity to the effects of cyclic errors of measurements of refractivity of a gas relative to the sensitivity to effects of cyclic errors of measurements of index of refraction of a gas. As a consequence, measurement of intrinsic optical properties of a gas, e.g., the reciprocal dispersive power of a gas $\Gamma$, exhibits enhanced sensitivity to the effects of cyclic errors relative to the sensitivity to effects of cyclic errors of measurements of refractivity of a gas and enhanced sensitivity to the effects of cyclic errors relative to the sensitivity to effects of cyclic errors of measurements of index of refraction of a gas.

It will be evident to those skilled in the art that the embodiments of the present invention can beneficially be incorporated into apparatus and methods to measure intrinsic optical properties of a gas such as $\Gamma$ compensated for the effects of cyclic errors without departing from the spirit and scope of the present invention. Examples of apparatus and methods for measurement of intrinsic optical properties of a gas are described in U.S. application Ser. No. 08/942,848, U.S. application entitled "Interferometric Method and Apparatus for Measuring Intrinsic Opitcal Properties of a Gas" filed Oct. 21, 1998, and U.S. Provisional Application No. 60/075,595, ibid.

The interferometry systems described above characterize cyclic errors and use the characterized cyclic errors to correct distance measurements, dispersion measurements, and intrinsic optical property measurements for cyclic non-linearity. As a result, such interferometry systems provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997).

Overlay depends directly on the performance, i.e. accuracy and precision, of the distance measuring interferometers used to position the wafer and reticle (or mask) stages. Since a lithography tool may produce $50–100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the phase measurement portion described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached to, or is supported by the other of the components.

Figure 11A:
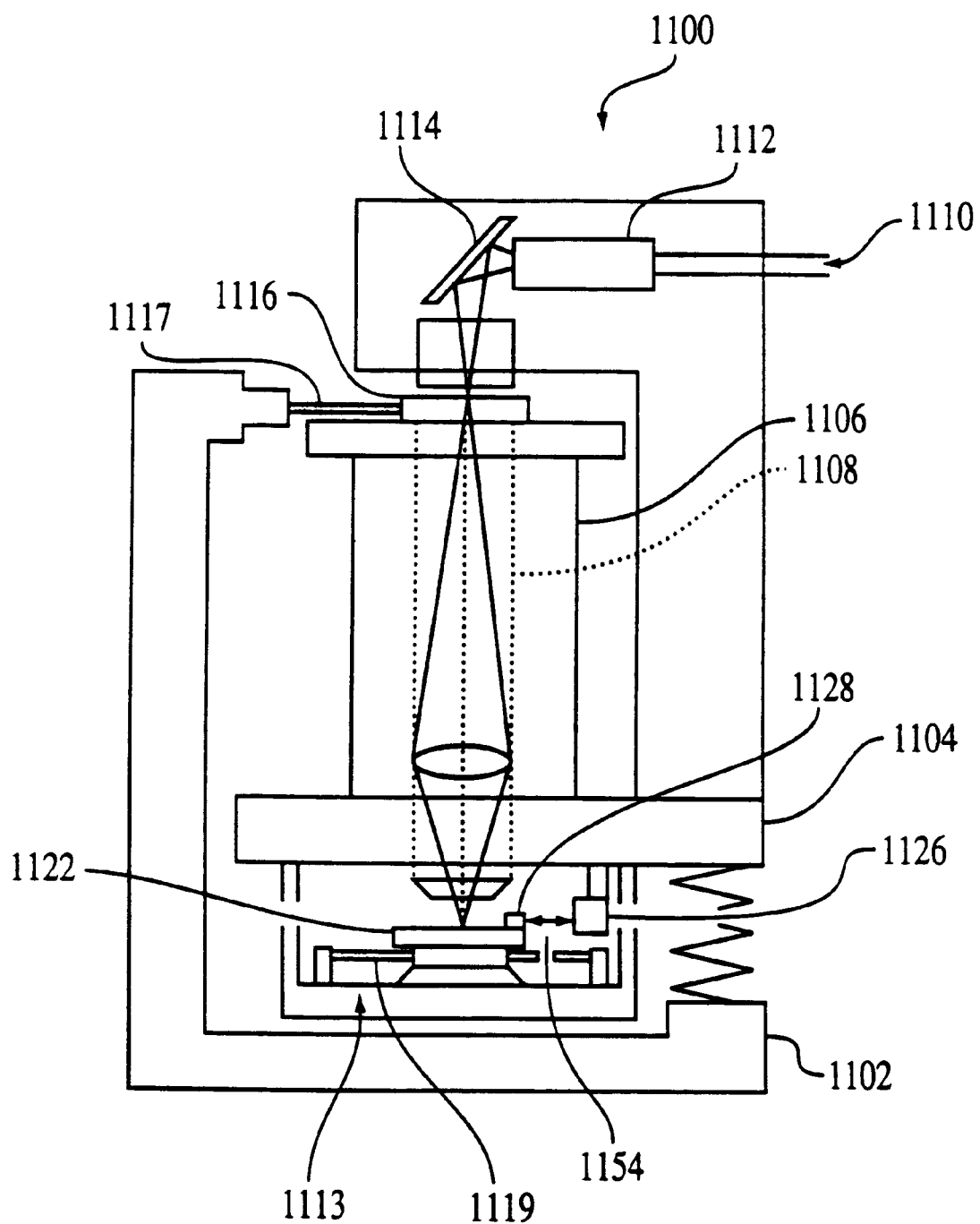
FIG. 11a is schematic diagram of a lithography system that includes an interferometry system described herein and is used to make integrated circuits.

An example of a lithography scanner 1100 using an interferometry system 1126 is shown in FIG. 11a. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 11B:
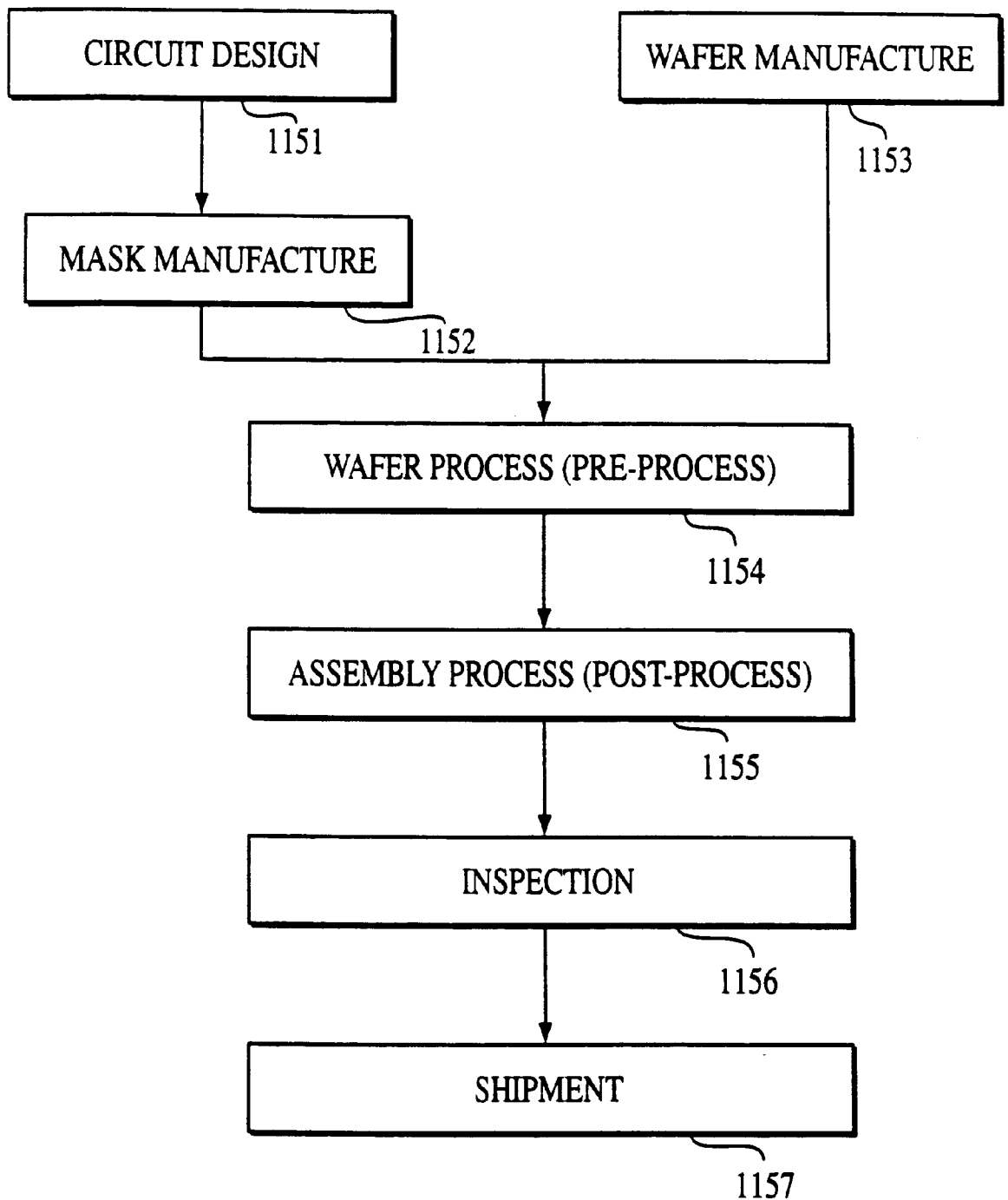
FIGS. 11b–c are flow charts that described steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 11b and 11c. FIG. 11b is a flow chart of the sequence of manufacturing a semiconductor device such as a semiconductor chip (e.g. IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 11C:
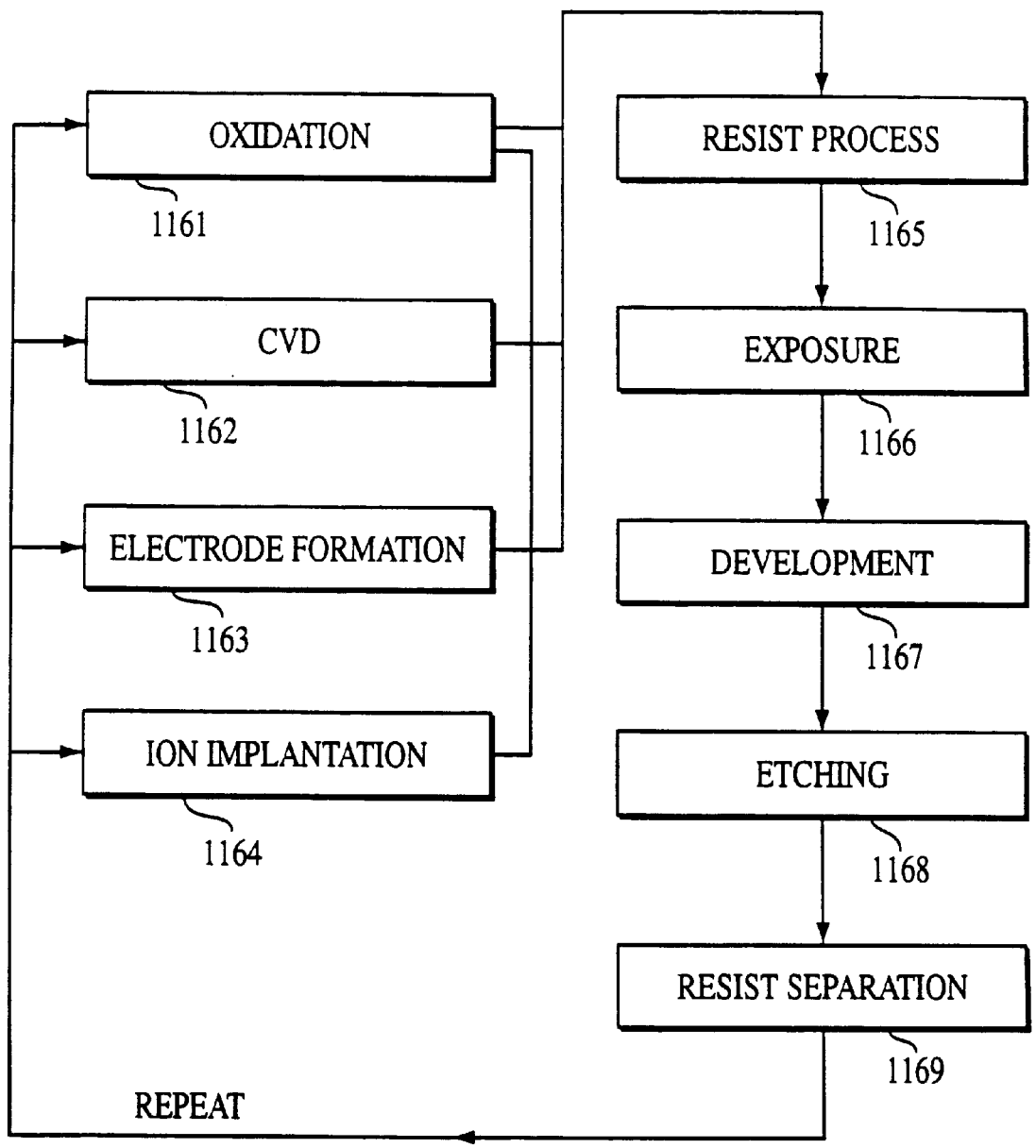

FIG. 11c is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 12:
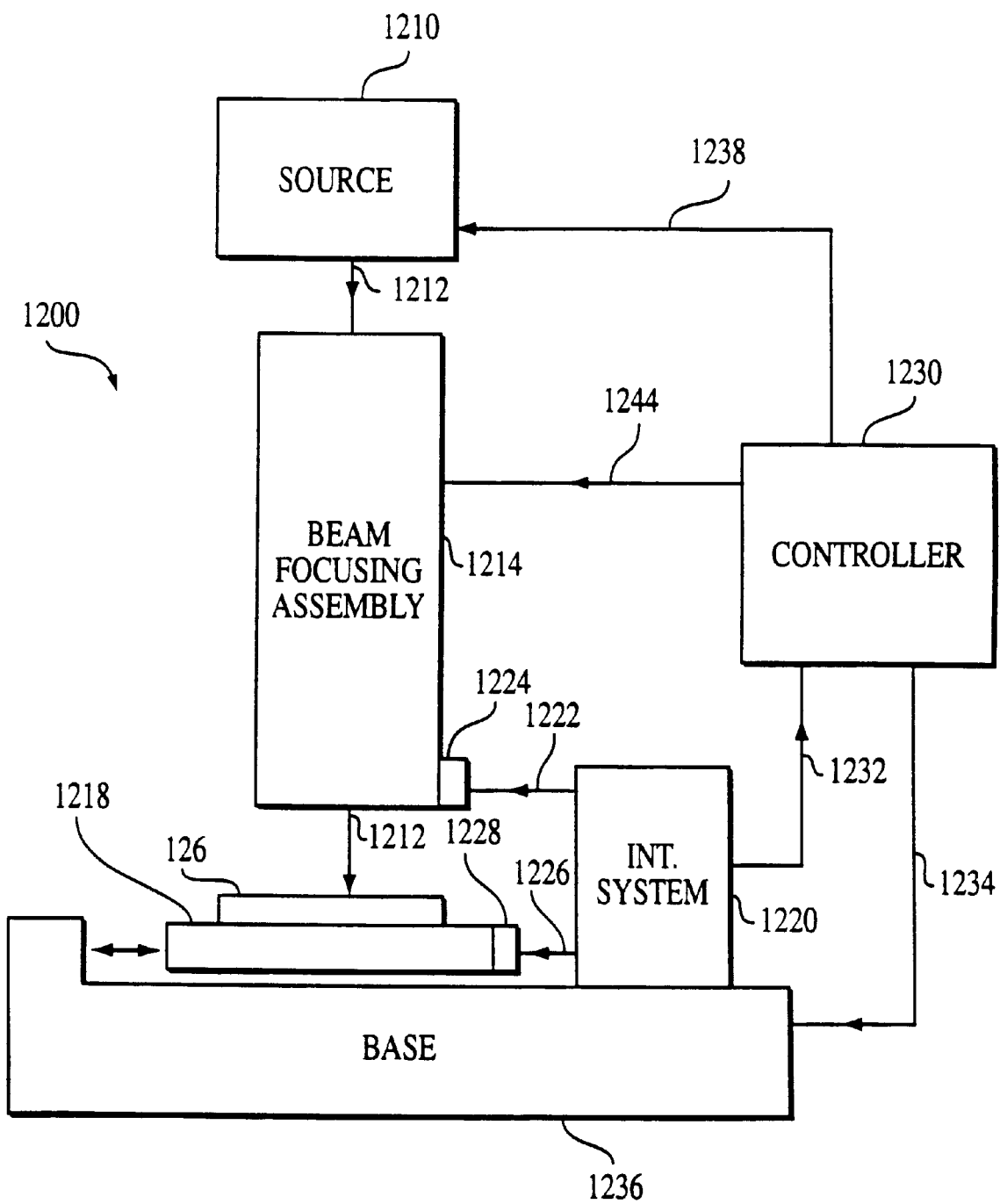
FIG. 12 is a schematic of a beam writing system that includes an interferometry system described herein.

As an example, a schematic of a beam writing system 1200 is shown in FIG. 12. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

Other aspects, advantages, and modifications are within the scope of the following claims.

What is claimed is:

1. An interferometry system comprising:

an interferometer which during operation directs a reference beam along a reference path and a measurement beam along a measurement path contacting a measurement object and combines the reference and measurement beams to produce overlapping exit beams, the overlapping exit beams indicative of changes in a relative optical path length to a measurement object, the interferometer comprising a variable phase shifter which during operation produces a phase shift in at least one of the reference and measurement beams;

a detection system which during operation mixes polarizations of the overlapping exit beams to produce a mixed beam and measures a time-varying intensity of the mixed beam; and an analyzer coupled to the phase shifter and the detection system and which during operation controls the value of the phase shift produced by the phase shifter, measures a phase corresponding to the time-varying intensity of the mixed beam, and determines a spectral representation of cyclic errors in the interferometry system based on the phase of the mixed beam for each of multiple values of the phase shift.

2. The interferometry system of claim 1, wherein the spectral representation is a Fourier sine and cosine series.

3. The interferometry system of claim 1, wherein the phase-shifter produces the phase-shift in one of the reference beam and measurement beam and not in the other of the reference beam and the measurement beam.

4. The interferometry system of claim 1, wherein the phase-shifter produces the phase-shift in the reference beam and the measurement beam.

5. The interferometry system of claim 1, wherein during operation the analyzer determines the spectral representation based on the measured phase of the mixed beam for each of multiple values of the phase shift for each of multiple positions of the measurement object.

6. The interferometry system of claim 1, wherein the analyzer comprises a memory and during operation stores the spectral representation in the memory.

7. The interferometry system of claim 1, wherein the interferometer comprises a beam splitter that combines the reference beam and measurement beam to produce the overlapping exit beams, and wherein the measurement path contacts the phase shifter between the measurement object and the beam splitter.

8. The interferometry system of claim 1, wherein the interferometer comprises a polarizing beam splitter that directs the reference beam along the reference path and the measurement beam along the measurement path and wherein the measurement path contacts the phase shifter between the polarizing beam splitter and the measurement object.

9. The interferometry system of claim 1, wherein the interferometer comprises a polarizing beam splitter that receives the reference beam from the reference path and the measurement beam from the measurement path and wherein the measurement path contacts the phase shifter between the measurement object and the polarizing beam splitter.

10. The interferometry system of claim 1, wherein the phase shifter is an electro-optical modulator.

11. The interferometry system of claim 1, wherein the phase shifter comprises an optical delay line and a translator for adjusting the length of the delay line, wherein the analyzer controls the translator.

12. The interferometry system of claim 1, wherein the phase shifter comprises a pair of prisms and a translator for varying the relative positions of the prisms, wherein the analyzer controls the translator.

13. The interferometry system of claim 1, wherein the phase shifter comprises a gas cell defining an optical path and a gas handling system for varying the gas pressure in the cell, wherein the analyzer controls the gas handling system.

14. The interferometry system of claim 1, wherein during operation the interferometer directs a second reference beam along a second reference path and a second measurement beam along a second measurement path contacting the measurement object and combines the second reference beam and the second measurement beam to produce a second pair of overlapping exit beams, the second pair of overlapping exit beams indicative of changes in the relative optical path length to the measurement object, wherein during operation the detection system mixes polarizations of the second pair of overlapping exit beams to produce a second mixed beam and measures a time-varying intensity of the second mixed beams, and wherein during operation the analyzer measures a phase corresponding to the time-varying intensity of the second mixed beam and determines the spectral representation based on the measured phases of each of the mixed beams for each of multiple values of the phase shift.

15. The interferometry system of claim 14, wherein during operation the analyzer provides an initial value for the phase shift, measures the phase corresponding to the time-varying intensity of each of the mixed beams for each of multiple positions of the measurement object and the initial value of the phase shift, and then repeats the providing and measuring steps for additional values of the phase shift.

16. The interferometry system of claim 14, wherein the phase-shifter produces the phase-shift in one of the first-mentioned reference beam and the first-mentioned measurement beam and not in the other of the first-mentioned reference beam and the first-mentioned measurement beam.

17. An interferometry system comprising:
a source which during operation provides reference and measurement beams having different frequencies, the source comprising a frequency shifter which during operation shifts the frequencies of the reference and measurement beams by equal amounts;
an interferometer which during operation directs the reference beam along a reference path and the measurement beam along a measurement path contacting a measurement object and combines the reference and measurement beams to produce overlapping exit beams, the overlapping exit beams indicative of changes in a relative optical path length to the measurement object;
a detection system which during operation mixes polarizations of the overlapping exit beams to produce a mixed beam and measures a time-varying intensity of the mixed beam; and
an analyzer coupled to the frequency shifter and the detection system, and which during operation causes the frequency shifter to shift the frequencies of the reference and measurement beams and produce a corresponding phase shift between the overlapping exit beams, measures a phase corresponding to the time-varying intensity of the mixed beam, and determines a spectral representation of cyclic errors in the interferometry system based on the measured phase of the mixed beam for each of multiple values of the phase shift.

18. The interferometry system of claim 17, wherein during operation the analyzer determines the spectral representation based on the measured phase of the mixed beam for each of multiple values of the phase shift for each of multiple positions of the measurement object.

19. The interferometry system of claim 17, wherein during operation the source provides a second reference beam and a second measurement beam having frequencies that are not shifted by the frequency shifter, wherein during operation the interferometer directs the second reference beam along a second reference path and the second measurement beam along a second measurement path contacting the measurement object and combines the second reference beam and the second measurement beam to produce a second pair of overlapping exit beams, the second pair of overlapping exit beams indicative of changes in the relative optical path length to the measurement object, wherein during operation the detection system mixes polarizations of the second pair of overlapping exit beams to produce a second mixed beam and measures a time-varying intensity of the second mixed beams, and wherein during operation the analyzer measures a phase corresponding to the time-varying intensity of the second mixed beam.

20. The interferometry system of claim 19, wherein during operation the analyzer causes the frequency shifter to produce an initial value for the phase shift, measures the phase corresponding to the time-varying intensity of each of the mixed beams for each of multiple positions of the measurement object and the initial value of the phase shift, and then repeats the causing and measuring steps for additional values of the phase shift, and wherein the analyzer determines the spectral representation based on the measured phases.

21. The interferometry system of claim 17, wherein the frequency shifter is an acousto-optical modulator.

22. An interferometry system comprising:
a dispersion measuring interferometer which during operation produces first and second pairs of overlapping exit beams, the first pair of exit beams having a first wavelength and the second pair of exit beams having a second wavelength different from the first wavelength, the first and second pairs of exit beams each indicative of changes in a relative optical path length to a measurement object;
a detection system which during operation mixes polarizations of the first pair of overlapping exit beams to produce a first mixed beam, mixes polarizations of the second pair of overlapping exit beams to produce a second mixed beam, and measures a time-varying intensity of each of the mixed beams; and
an analyzer coupled to the detection system and which during operation measures a phase corresponding to the time-varying intensity of each of the mixed beams at each of multiple positions of the measurement object, calculates a dispersion value for each of the multiple positions, the dispersion value for a particular position equal to a function of the measured phases at that particular position, and determines a spectral representation of cyclic error contributions to dispersion measurements by the interferometer based on the calculated dispersion values.

23. The interferometry system of claim 22, wherein the analyzer further comprises a memory and during operation stores the spectral representation in the memory.

24. The interferometry system of claim 22, wherein during operation the analyzer determines the spectral representation by expressing the calculated dispersion values as a function that comprises a Fourier series in at least one of the measured phases and inverting the Fourier series.

25. The interferometry system of claim 22, wherein the dispersion value is equal to a function of a weighted difference between the measured phases.

26. The interferometry system of claim 25, wherein the first and second wavelengths $\lambda_1$ and $\lambda_2$ satisfy the equation $\lambda_1/\lambda_2 = l_1/l_2$, where $l_1$ and $l_2$ are integers, and the weighted difference is equal to $l_1\phi_1 - l_2\phi_2$, where $\phi_1$ and $\phi_2$ are the measured phases.

27. The interferometry system of claim 26, wherein $l_1$ and $l_2$ are each less than 50.

28. The interferometry system of claim 22, wherein the first and second wavelengths differ by at least 1 nm.

29. The interferometry system of claim 22, wherein during operation the interferometer combines a first reference beam and a first measurement beam to produce the first pair of overlapping exit beams and wherein the interferometer comprises a variable phase shifter which during operation produces a phase shift in at least one of the first reference beam and the first measurement beam, and wherein the analyzer is coupled to the phase shifter and during operation controls the value of the phase shift produced by the phase shifter.

30. The interferometry system of claim 22 further comprising a source which during operation provides a first reference beam and a first measurement beam, the source comprising a frequency shifter for shifting the frequencies of the first reference and measurement beams by equal amounts, and wherein during operation the interferometer combines the first reference and measurement beams to produce the first pair of overlapping exit beams, and wherein the analyzer is coupled to the frequency shifter and during operation causes the frequency shifter to shift the frequencies of the first reference and measurement beams and produce a corresponding phase shift between the first pair of overlapping exit beams.

31. An interferometry system comprising:
a dispersion measuring interferometer which during operation produces first and second pairs of overlapping exit beams, the first pair of exit beams having a first wavelength and the second pair of exit beams having a second wavelength different from the first wavelength, the first and second pairs of exit beams each indicative of changes in a relative optical path length to a measurement object;
a detection system which during operation mixes polarizations of the first pair of overlapping exit beams to produce a first mixed beam, mixes polarizations of the second pair of overlapping exit beams to produce a second mixed beam, and measures a time-varying intensity of each of the mixed beams; and
an analyzer coupled to the detection system and which during operation measures a phase corresponding to the time-varying intensity of each of the mixed beams at each of multiple positions of the measurement object, calculates a dispersion value for each of the multiple positions, the dispersion value for a particular position equal to a function of the measured phases at that particular position, and filters the dispersion values to determine an averaged dispersion value having reduced cyclic error.

32. The interferometry system of claim 31, wherein the analyzer averages over the dispersion values by summing the dispersion values corresponding to equally-spaced measured phases from one of the mixed beams, the equally-spaced measured phases spanning an interval that is a multiple of $2\pi$.

33. The interferometry system of claim 32, wherein the first and second wavelengths $\lambda_1$ and $\lambda_2$ satisfy the equation $\lambda_1/\lambda_2 = l_1/l_2$, $l_1$ and $l_2$ being integers, wherein the dispersion values are equal to $l_1\phi_1 - l_2\phi_2$, and $\phi_1$ and $\phi_2$ being the measured phases, and wherein the analyzer averages over the dispersion values by summing the dispersion values corresponding to equally-spaced values of $\phi_1$ spanning a $2\pi l_2$ interval.

34. A method for characterizing cyclic errors in an interferometer, the method comprising:
directing a reference beam along a reference path and a measurement beam along a measurement path contacting a measurement object;
combining the reference beam and the measurement beam to produce overlapping exit beams that are indicative of changes in a relative optical path length to the measurement object;
introducing at least three phase-shifts to at least one of the reference and measurement beams for each of multiple positions of the measurement object;
mixing polarizations of the reference and measurement beams to produce mixed beam;
measuring a phase corresponding to a time-varying intensity of the mixed beam for each of the phase shifts for each of the multiple positions of the measurement object; and
determining a spectral representation of cyclic errors in the interferometer based on the measured phases.

35. The method of claim 34, wherein the introducing step comprises introducing at least five phase-shifts to at least one of the reference and measurement beams for each of multiple positions of the measurement object.

36. The method of claim 34, wherein the phase shifts are introduced to one of the reference beam and the measurement beam and not the other of the reference beam and the measurement beam.

37. The method of claim 34, wherein the phase shifts are introduced to the reference beam and the measurement beam.

38. The method of claim 34 further comprising:
combining a second reference beam and a second measurement beam to produce a second pair of overlapping exit beams that are indicative of changes in a corresponding relative optical path length to the measurement object;
mixing polarizations of the second reference and measurement beams to produce a second mixed beam;
measuring a phase corresponding to a time-varying intensity of the second mixed beam for each of the multiple positions of the measurement object; and
determining the spectral representation based on the measured phases for first and second mixed beams.

39. A method for characterizing cyclic errors in an interferometer comprising:
providing a value for dispersion in an optical path length to a measurement object measured by the interferometer for each of multiple positions of the measurement object; and determining a spectral representation of cyclic error contributions to dispersion measurement in the interferometer based on the dispersion values.

40. The method of claim 39, wherein the determining step comprises expressing the dispersion values as a function that comprises a Fourier series that depends on the position of the measurement object and inverting the Fourier series to determine the spectral representation.

41. An interferometry method comprising:
determining a spectral representation of cyclic errors in an interferometer using the method of claim 34;
measuring an optical path length using the interferometer; and
correcting the measured optical path length for cyclic errors using the spectral representation.

42. An interferometry method comprising:
determining a spectral representation of cyclic error contributions to dispersion measurements in an interferometer using the method of claim 39;
measuring an optical path length using the interferometer; and
correcting the measured optical path length using the spectral representation.

43. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the interferometry system of claims 1, 17, 22, or 31 for measuring the position of the stage.

44. A lithography system for use in fabricating integrated circuits on a wafer, the system comprising:
a stage for supporting the wafer; and
an illumination system including a radiation source, a mask, a positioning system, a lens assembly, and the interferometry system of claim 1, 17, 22, or 31, wherein during operation the source directs radiation through the mask to produce spatially patterned radiation, the positioning system adjusts the position of the mask relative to the radiation from the source, the lens assembly images the spatially patterned radiation onto the wafer, and the interferometry system measures the position of the mask relative to the radiation from the source.

45. A lithography system for fabricating integrated circuits comprising first and second components, the first and second components being movable relative to each other, and the interferometry system of claim 1, 17, 22, or 31, wherein the first component comprises the measurement object and the interferometry system measures the position of the first component relative to the second component.

46. A lithography system for fabricating integrated circuits comprising first and second components, the first and second components being movable relative to each other, and the interferometry system of claim 1 or 17, wherein the first component comprises the measurement object contacted by the measurement path and the second component is contacted by the reference path, and wherein the interferometry system measures the relative position of the first and second components.

47. A lithography system for fabricating integrated circuits comprising first and second components, the first and second components being movable relative to each other, and the interferometry system of claim 22 or 31, wherein the interferometer directs a pair of measurement beams to contact the first component and a pair of reference beams to contact the second component, and wherein the interferometry system measures the relative position of the first and second components.

48. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the interferometry system of claim 1, 17, 22, or 31 for measuring the position of the stage relative to the beam directing assembly.

49. A lithography method for use in fabricating integrated circuits on a wafer comprising: supporting the wafer on a moveable stage;
imaging spatially patterned radiation onto the wafer;
adjusting the position of the stage; and
measuring the position of the stage using the interferometry method of claim 41 or 42.

50. A lithography method for use in the fabrication of integrated circuits comprising:
directing input radiation through a mask to produce spatially patterned radiation;
positioning the mask relative to the input radiation;
measuring the position of the mask relative to the input radiation using the interferometry method of claim 41 or 42, wherein one of a stage supporting the mask and a illumination system providing the input radiation include the measurement object; and
imaging the spatially patterned radiation onto a wafer.

51. A lithography method for fabricating integrated circuits on a wafer comprising:
positioning a first component of a lithography system relative to a second component of a lithography system to expose the wafer to spatially patterned radiation; and
measuring the position of the first component relative to the second component using the method of claim 41 or 42 wherein the first component includes the measurement object.

52. A beam writing method for use in fabricating a lithography mask, the method comprising:
directing a write beam to a substrate to pattern the susbtrate;
positioning the substrate relative to the write beam; and
measuring the position of the substrate relative to the write beam using the interferometry method of claim 41 or 42.

* * * * *